(12) United States Patent
Liaw

(10) Patent No.: US 11,508,735 B2
(45) Date of Patent: Nov. 22, 2022

(54) CELL MANUFACTURING

(71) Applicant: Taiwan Semiconductor Manufacturing Company, Ltd., Hsinchu (TW)

(72) Inventor: Jhon Jhy Liaw, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/806,102

(22) Filed: Mar. 2, 2020

(65) Prior Publication Data

US 2021/0066310 A1 Mar. 4, 2021

Related U.S. Application Data

(60) Provisional application No. 62/892,709, filed on Aug. 28, 2019.

(51) Int. Cl.
| | |
|---|---|
| *H01L 27/11* | (2006.01) |
| *H01L 29/78* | (2006.01) |
| *H01L 27/02* | (2006.01) |
| *H01L 29/49* | (2006.01) |
| *H01L 29/423* | (2006.01) |
| *H01L 21/8238* | (2006.01) |
| *H01L 23/528* | (2006.01) |
| *H01L 23/522* | (2006.01) |

(52) U.S. Cl.
CPC .. *H01L 27/1104* (2013.01); *H01L 21/823821* (2013.01); *H01L 21/823828* (2013.01); *H01L 21/823857* (2013.01); *H01L 21/823871* (2013.01); *H01L 23/528* (2013.01); *H01L 23/5226* (2013.01); *H01L 27/0207* (2013.01); *H01L 29/42364* (2013.01); *H01L 29/4966* (2013.01); *H01L 29/7851* (2013.01)

(58) Field of Classification Search
CPC .................. H01L 27/11–1104; H01L 27/0922
See application file for complete search history.

(56) References Cited

U.S. PATENT DOCUMENTS

| | | | |
|---|---|---|---|
| 5,489,860 | A | 2/1996 | Kitagawa et al. |
| 6,950,354 | B1 | 9/2005 | Akiyoshi |
| 7,236,396 | B2 | 6/2007 | Houston et al. |
| 8,035,170 | B2 | 10/2011 | Inaba |

(Continued)

FOREIGN PATENT DOCUMENTS

| | | |
|---|---|---|
| TW | 200744099 A | 12/2007 |
| TW | 201312574 A | 3/2013 |

(Continued)

*Primary Examiner* — John A Bodnar
(74) *Attorney, Agent, or Firm* — Slater Matsil, LLP

(57) ABSTRACT

A semiconductor device includes a first Static Random Access Memory (SRAM) array including a first SRAM cell and a second SRAM array including a second SRAM cell. The first SRAM cell includes a first pull-down (PD) device including a single fin N-type FinFET. The single fin N-type FinFET includes a first gate dielectric having a first thickness. The second SRAM cell includes a second PD device including a multiple fin N-type FinFET. The multiple fin N-type FinFET includes a second gate dielectric having a second thickness. The first thickness is greater than the second thickness.

20 Claims, 50 Drawing Sheets

(56) References Cited

U.S. PATENT DOCUMENTS

| | | |
|---|---|---|
| 8,421,205 B2 | 4/2013 | Yang |
| 8,455,028 B2 | 6/2013 | Breunig et al. |
| 8,487,378 B2 | 7/2013 | Goto et al. |
| 8,605,523 B2 | 12/2013 | Tao et al. |
| 8,630,132 B2 | 1/2014 | Cheng et al. |
| 8,661,389 B2 | 2/2014 | Chern et al. |
| 8,693,235 B2 | 4/2014 | Liaw |
| 8,698,205 B2 | 4/2014 | Tzeng et al. |
| 8,729,634 B2 | 5/2014 | Shen et al. |
| 8,760,948 B2 | 6/2014 | Tao et al. |
| 8,826,212 B2 | 9/2014 | Yeh et al. |
| 8,826,213 B1 | 9/2014 | Ho et al. |
| 8,836,141 B2 | 9/2014 | Chi et al. |
| 8,887,106 B2 | 11/2014 | Ho et al. |
| 9,129,707 B2 | 9/2015 | Lin et al. |
| 9,576,644 B2 | 2/2017 | Liaw |
| 9,721,645 B1 | 8/2017 | Liaw |
| 9,935,001 B2 | 4/2018 | Liaw |
| 2002/0001251 A1 | 1/2002 | Fujino et al. |
| 2005/0219914 A1 | 10/2005 | Sarin et al. |
| 2006/0171194 A1 | 8/2006 | Lowrey et al. |
| 2007/0283084 A1 | 12/2007 | Chiu et al. |
| 2008/0091969 A1 | 4/2008 | Kurumada et al. |
| 2008/0253171 A1 | 10/2008 | Terada et al. |
| 2011/0068400 A1* | 3/2011 | Wang .................... G11C 11/412 257/347 |
| 2012/0294100 A1 | 11/2012 | Ling et al. |
| 2013/0181297 A1 | 7/2013 | Liaw |
| 2013/0235640 A1 | 9/2013 | Liaw |
| 2014/0032871 A1 | 1/2014 | Hsu et al. |
| 2014/0054716 A1 | 2/2014 | Chen et al. |
| 2014/0119131 A1 | 5/2014 | Verma et al. |
| 2014/0153321 A1 | 6/2014 | Liaw |
| 2014/0153345 A1 | 6/2014 | Kim et al. |
| 2014/0177352 A1 | 6/2014 | Lum |
| 2014/0215420 A1 | 7/2014 | Lin et al. |
| 2014/0233330 A1 | 8/2014 | Ko et al. |
| 2014/0241077 A1 | 8/2014 | Katoch et al. |
| 2014/0264924 A1 | 9/2014 | Yu et al. |
| 2014/0269114 A1 | 9/2014 | Yang et al. |
| 2014/0282289 A1 | 9/2014 | Hsu et al. |
| 2014/0282326 A1 | 9/2014 | Chen et al. |
| 2014/0325466 A1 | 10/2014 | Ke et al. |
| 2015/0243667 A1* | 8/2015 | Liaw ................... H01L 27/0886 716/110 |
| 2015/0262828 A1* | 9/2015 | Brand ................ H01L 29/7833 438/592 |
| 2017/0076782 A1* | 3/2017 | Liaw .................... G11C 11/412 |
| 2017/0263608 A1* | 9/2017 | Gan .................... H01L 27/0922 |

FOREIGN PATENT DOCUMENTS

| | | |
|---|---|---|
| TW | 201432677 A | 8/2014 |
| WO | 2009059906 A1 | 5/2009 |

\* cited by examiner

CELL MANUFACTURING

PRIORITY CLAIM AND CROSS-REFERENCE

This application claims the benefit of U.S. Provisional Application No. 62/892,709, filed on Aug. 28, 2019, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

Static random access memory (SRAM) is commonly used in integrated circuits. SRAM cells have the advantageous feature of holding data without a need for refreshing. With the increasing demanding requirement to the speed of integrated circuits, the read speed and write speed of SRAM cells also become more important. With the increasingly down-scaling of the already very small SRAM cells, however, such request is difficult to achieve. For example, the sheet resistance of metal lines, which form the word-lines and bit-lines of SRAM cells, becomes increasingly higher, and hence the RC delay of the word lines and bit-lines of SRAM cells is increased, preventing the improvement in the read speed and write speed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
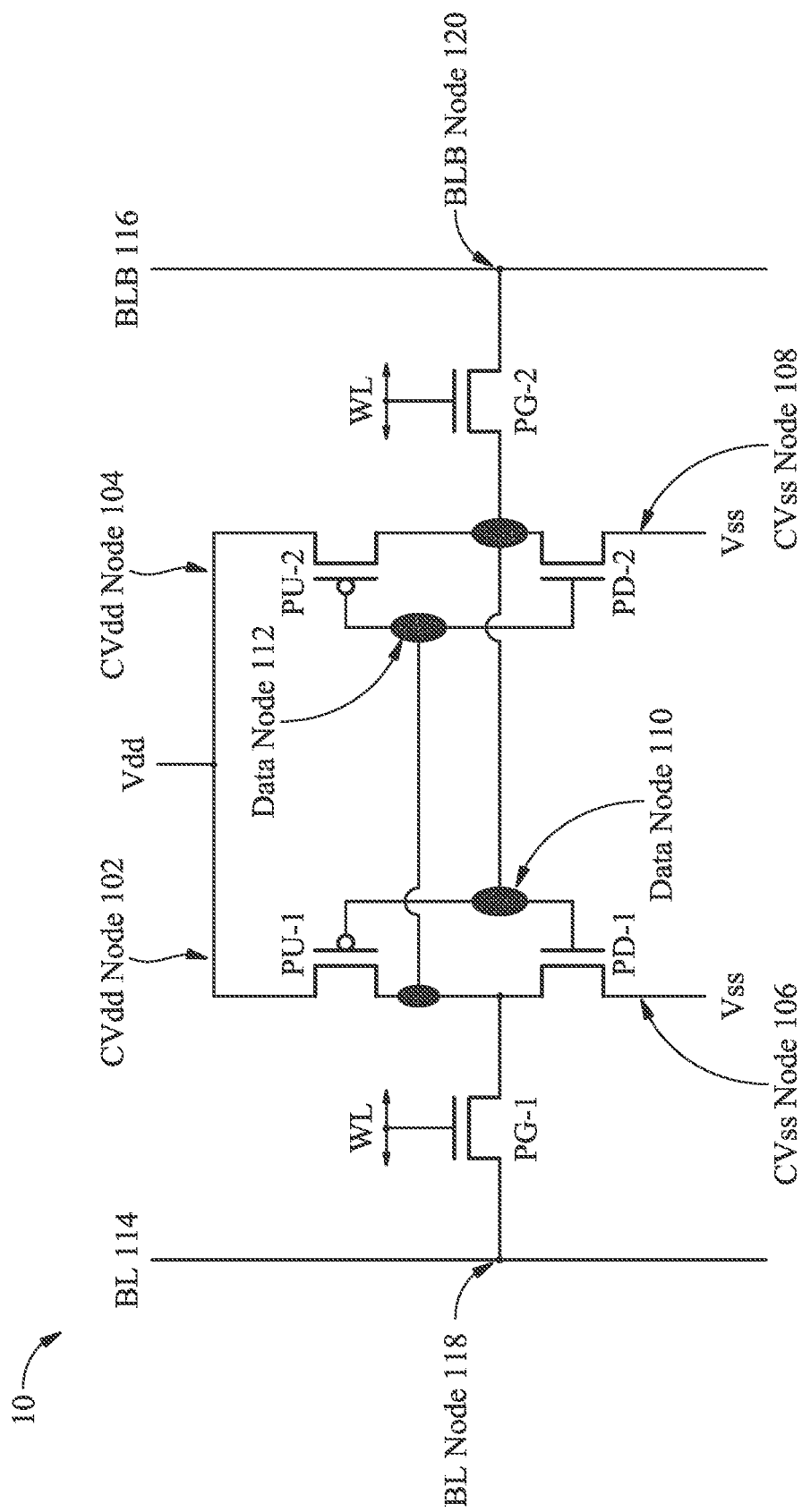
FIGS. 1A and 1B illustrate circuit diagrams of static random access memory (SRAM) cells in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Static random access memory (SRAM) cells are provided in accordance with various embodiments. Some variations of some embodiments are discussed. Throughout the various views and illustrative embodiments, like reference numbers are used to designate like elements formed using like processes. Furthermore, although various embodiments are described in a particular context of SRAM layouts, other embodiments may also be applied to other memory cell configurations, such as read only memory (ROM) cells, dynamic random access memory (DRAM) cells, magnetic random access memory (MRAM) cells, phase change random access memory (PRAM) cells, and resistive random access memory (RRAM) cells.

For maximum density to be achieved in an SRAM chip, the SRAM cells may be laid out in as small a size as possible. To have the smallest possible cell size, it may be laid out to the limitations of both process margin and device dimension. However, SRAM stability may be impacted by device scaling due to the cell mismatch being proportional to the square root of the area of the channel portion of the SRAM cell and the random fluctuation of dopant atoms per unit volume in the channel portion. Cell devices may shrink in capability as cell sizes continue to be reduced. The FinFET provides a reasonable channel width with minimized area cost and also allows channel length to continue to shrink.

Two types of SRAM arrays, high density (HD) and high current (HC), are provided in embodiments below. HD SRAM cells may provide smaller cell sizes, storage of large amounts of data, and reduced cell standby leakage due to smaller transistor widths producing less leakage current. HC SRAM cells may provide high speed cell operation (for example, a Level 1/Level 2 (L1/L2) cache with GHz operation). In some embodiments, multi-fin FinFETs may be used in HC SRAM cells to enable faster operation because FinFETs with larger channel width or multiple fins may have the capability to achieve higher on current ($I_{on}$) and single fin FinFETs may be used in HD SRAM cells to provide greater storage of data by taking up less space than multiple fin FinFETs and therefore allowing for increased density, enabling more storage of data. In some embodiments, a thicker gate dielectric in HD SRAM cells may enable lower gate leakage to achieve minimal cell standby leakage current (Isoff), and a thinner gate dielectric in HC SRAM cells to enable higher on current ($I_{on}$) for faster operation. For example, the thicker gate dielectric in the HD SRAM cells may produce a higher threshold voltage ($V_t$), which may reduce sub-threshold leakage current (Isoff). As another example, the thinner gate dielectric in the HC SRAM cells may produce a lower threshold voltage ($V_t$), which may lead to a higher $I_{on}$ for increased speed. In some embodiments, the HD SRAM cells may be formed with thicker gate electrode layers than the HC SRAM cells, which may produce a higher $V_t$ for the HD SRAM cells than for the HC SRAM cells. The HD SRAM cells may comprise work function metal (WFM) layers with greater thicknesses than WFM layers of the HC SRAM cells. The WFM layers of the HC SRAM cells being thinner may produce lower $V_t$ for the HC SRAM cells relative to the higher $V_t$ of the HD SRAM cells with thicker WFM layers. This may result in higher speed in the HC SRAM cells relative to the HD SRAM cells and in lower leakage current in the HD SRAM cells relative to the HC SRAM cells.

FIG. 1A illustrates a circuit diagram of SRAM cell 10 in accordance with some embodiments. SRAM cell 10 includes pull-up (PU) transistors PU-1 and PU-2, which are P-type Metal-Oxide-Semiconductor (PMOS) transistors, and pull-down (PD) transistors PD-1 and PD-2 and pass-gate transistors PG-1 and PG-2, which are N-type Metal-Oxide-Semiconductor (NMOS) transistors. The gates of pass-gate transistors PG-1 and PG-2 are controlled by a word line (WL) that determines whether SRAM cell 10 is selected or not. A latch formed of pull-up transistors PU-1 and PU-2 and pull-down transistors PD-1 and PD-2 stores a bit, wherein the complementary values of the bit are stored in storage data (SD) node no and SD node 112. The stored bit can be written into, or read from, SRAM cell 10 through complementary bit lines including bit line (BL) 114 and bit line bar (BLB) 116. SRAM cell 10 is powered through a positive power supply node Vdd that has a positive power supply voltage (also denoted as CVdd). SRAM cell 10 is also connected to power supply voltage Vss (also denoted as CVss), which may be an electrical ground. Transistors PU-1 and PD-1 form a first inverter. Transistors PU-2 and PD-2 form a second inverter. The input of the first inverter is connected to transistor PG-2 and the output of the second inverter. The output of the first inverter is connected to transistor PG-1 and the input of the second inverter.

The sources of pull-up transistors PU-1 and PU-2 are connected to CVdd node 102 and CVdd node 104, respectively, which are further connected to power supply voltage (and line) Vdd. The sources of pull-down transistors PD-1 and PD-2 are connected to CVss node 106 and CVss node 108, respectively, which are further connected to power supply voltage/line Vss. The gates of transistors PU-1 and PD-1 are connected to the drains of transistors PU-2 and PD-2, which form a connection node that is referred to as SD node no. The gates of transistors PU-2 and PD-2 are connected to the drains of transistors PU-1 and PD-1, which connection node is referred to as SD node 112. A source/drain region of pass-gate transistor PG-1 is connected to bit line BL 114 at a BL node 118. A source/drain region of pass-gate transistor PG-2 is connected to bit line BLB 116 at a BLB node 120.

Figure 1B:
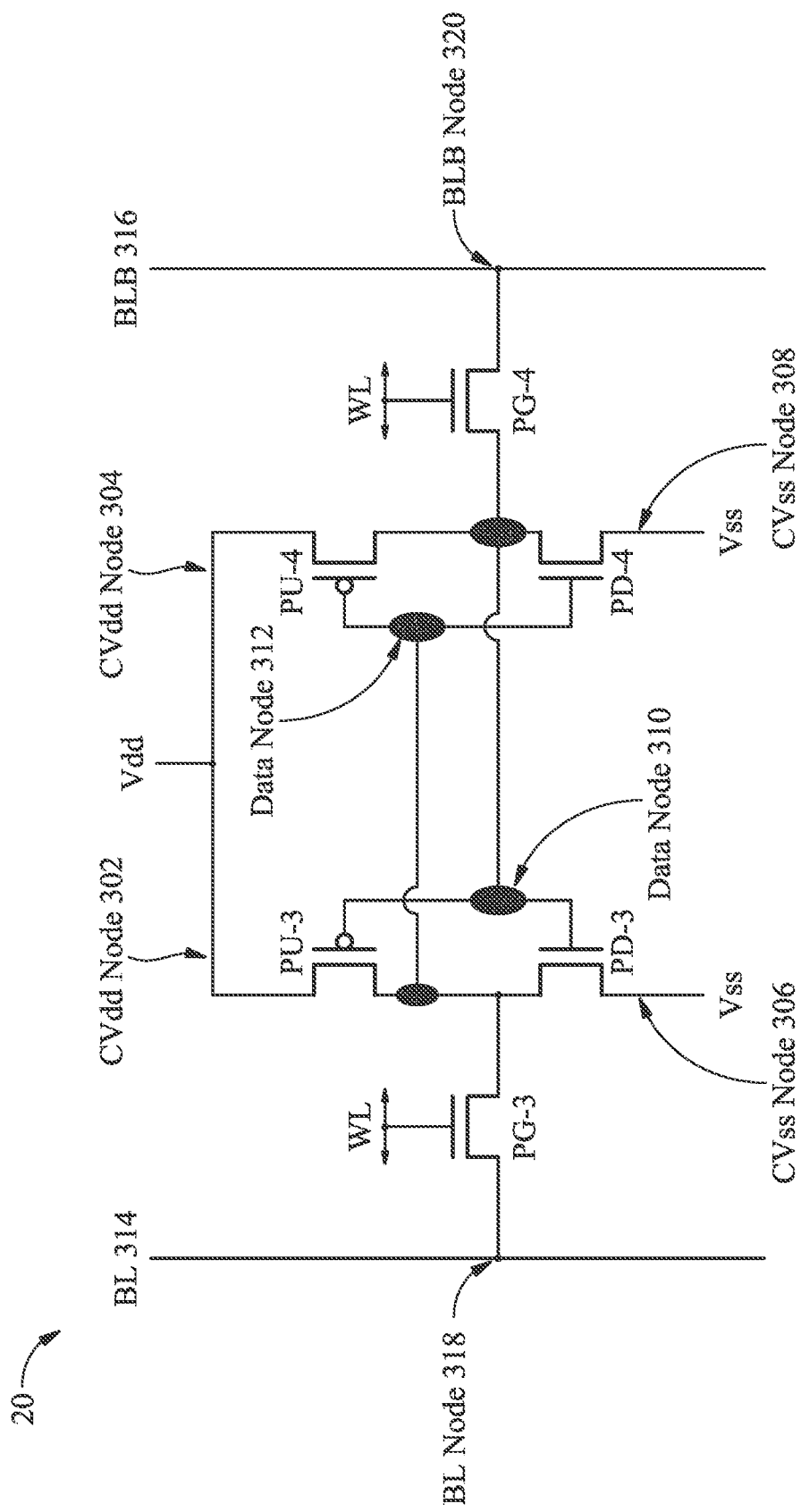

FIG. 1B illustrates a circuit diagram of SRAM cell 20 in accordance with some embodiments. SRAM cell 20 includes pull-up (PU) transistors PU-3 and PU-4, which are P-type Metal-Oxide-Semiconductor (PMOS) transistors, and pull-down (PD) transistors PD-3 and PD-4 and pass-gate transistors PG-3 and PG-4, which are N-type Metal-Oxide-Semiconductor (NMOS) transistors. The gates of pass-gate transistors PG-3 and PG-4 are controlled by a word line (WL) that determines whether SRAM cell 20 is selected or not. A latch formed of pull-up transistors PU-3 and PU-4 and pull-down transistors PD-3 and PD-4 stores a bit, wherein the complementary values of the bit are stored in storage date (SD) node 310 and SD node 312. The stored bit can be written into, or read from, SRAM cell 20 through complementary bit lines including bit line (BL)314 and bit line bar (BLB)316. SRAM cell 20 is powered through a positive power supply node Vdd that has a positive power supply voltage (also denoted as CVdd). SRAM cell 20 is also connected to power supply voltage Vss (also denoted as CVss), which may be an electrical ground. Transistors PU-3 and PD-3 form a third inverter. Transistors PU-4 and PD-4 form a fourth inverter. The input of the third inverter is connected to transistor PG-4 and the output of the fourth inverter. The output of the third inverter is connected to transistor PG-3 and the input of the fourth inverter.

The sources of pull-up transistors PU-3 and PU-4 are connected to CVdd node 302 and CVdd node 304, respectively, which are further connected to power supply voltage (and line) Vdd. The sources of pull-down transistors PD-3 and PD-4 are connected to CVss node 306 and CVss node 308, respectively, which are further connected to power supply voltage/line Vss. The gates of transistors PU-3 and PD-3 are connected to the drains of transistors PU-4 and PD-4, which form a connection node that is referred to as SD node 310. The gates of transistors PU-4 and PD-4 are connected to the drains of transistors PU-3 and PD-3, which connection node is referred to as SD node 312. A source/drain region of pass-gate transistor PG-3 is connected to bit line BL 314 at a BL node 318. A source/drain region of pass-gate transistor PG-4 is connected to bit line BLB 316 at a BLB node 320.

Figure 2:
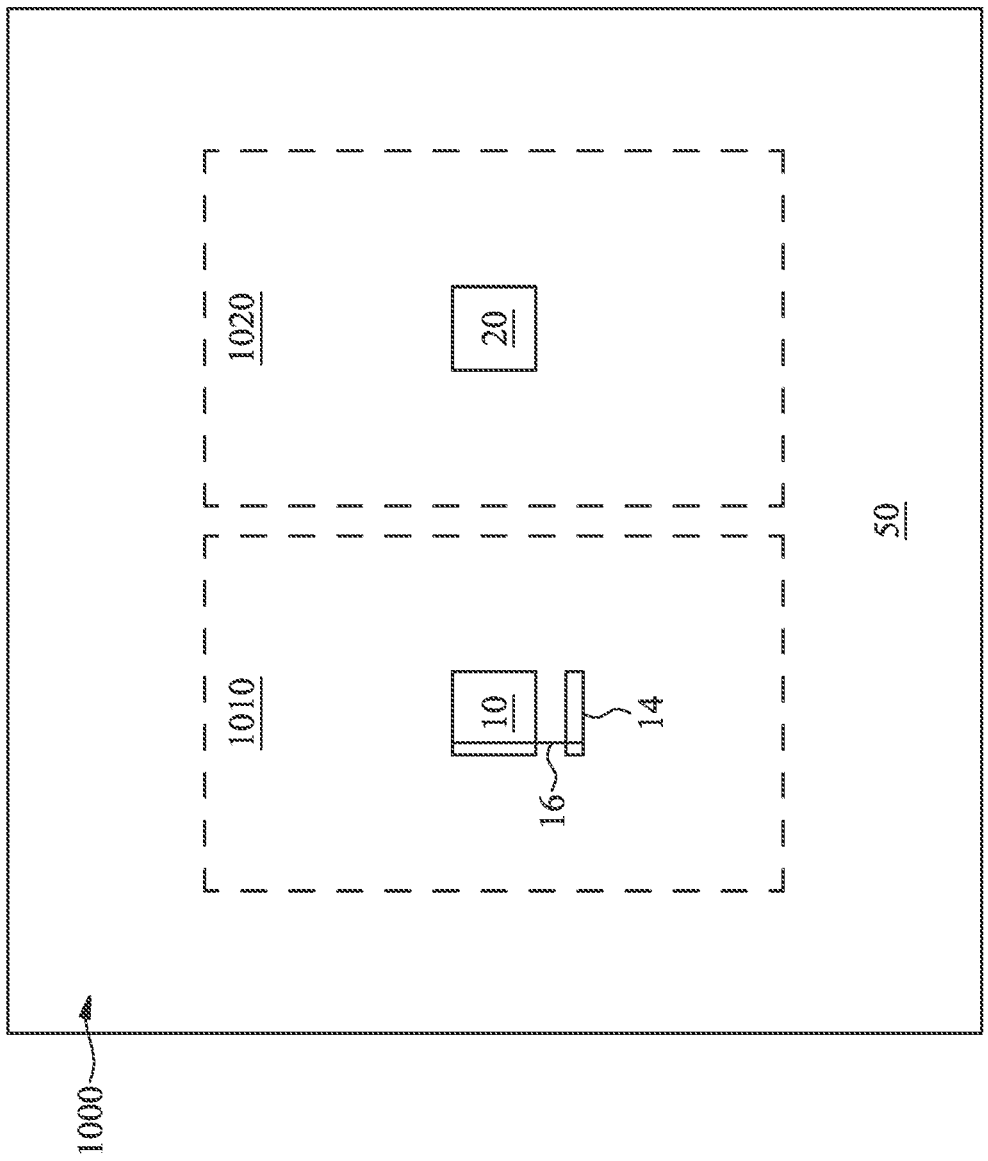
FIG. 2 illustrates a semiconductor wafer comprising a plurality of SRAM cell arrays in accordance with some embodiments.

FIG. 2 illustrates a semiconductor chip 1000 comprising a substrate 50, a high density (HD) SRAM area 1010, and a high current (HC) SRAM area 1020. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer or a single die (e.g., processed in a wafer and then removed from other devices of the wafer using a singulation process).

The HD SRAM area 1010 comprises an array of HD SRAM cells 10, and the HC SRAM area 1020 comprises an array of HC SRAM cells 20. In some embodiments, the HD SRAM area 1010 comprises multiple arrays comprising multiple HD SRAM cells 10, and the HC SRAM area 1020 comprises multiple arrays comprising multiple HC SRAM cells 20. The sizes and positions of HD SRAM area 1010, HC SRAM area 1020, HD SRAM cell 10, and HC SRAM cell 20 are not necessarily to scale and are intended to show the presence of HD SRAM area 1010 and HC SRAM area 1020 on the semiconductor chip 1000. In some embodiments, HD SRAM cells 10 have features with a smaller pitch than HC SRAM cells 20. For example, as described in greater detail with respect to FIGS. 4A and 5A below, a ratio of a first X-pitch X1 of an HD SRAM cell 10 to a second X-pitch X2 of an HC SRAM cell 20 may be in a range of about 1:1.5 to about 1:1.1. In some embodiments, HC SRAM cells 20 operate at a faster speed than HC SRAM cells 10. For example, an operating speed of HC SRAM cells may be at least 1 GHz.

In some embodiments, HD SRAM arrays of HD SRAM cells 10 are coupled by conductive lines 16 to write-assist circuits 14 to enhance cell write cycle capability. Each write-assist circuit 14 may be configured to set a voltage level of the corresponding bit line of the HD SRAM array to be less than a ground reference level. In some embodiments, the conductive lines 16 are bit lines of the HD SRAM arrays, each write-assist circuit 14 is a supply voltage line of each HD SRAM array, and each write assist circuit 14 is configured to set a voltage level of the corresponding supply voltage line of the HD SRAM array to be less than a supply voltage level. The HC SRAM cells 20 are not coupled to write-assist circuits, which are not present in the HC SRAM area 1020.

Figure 3:
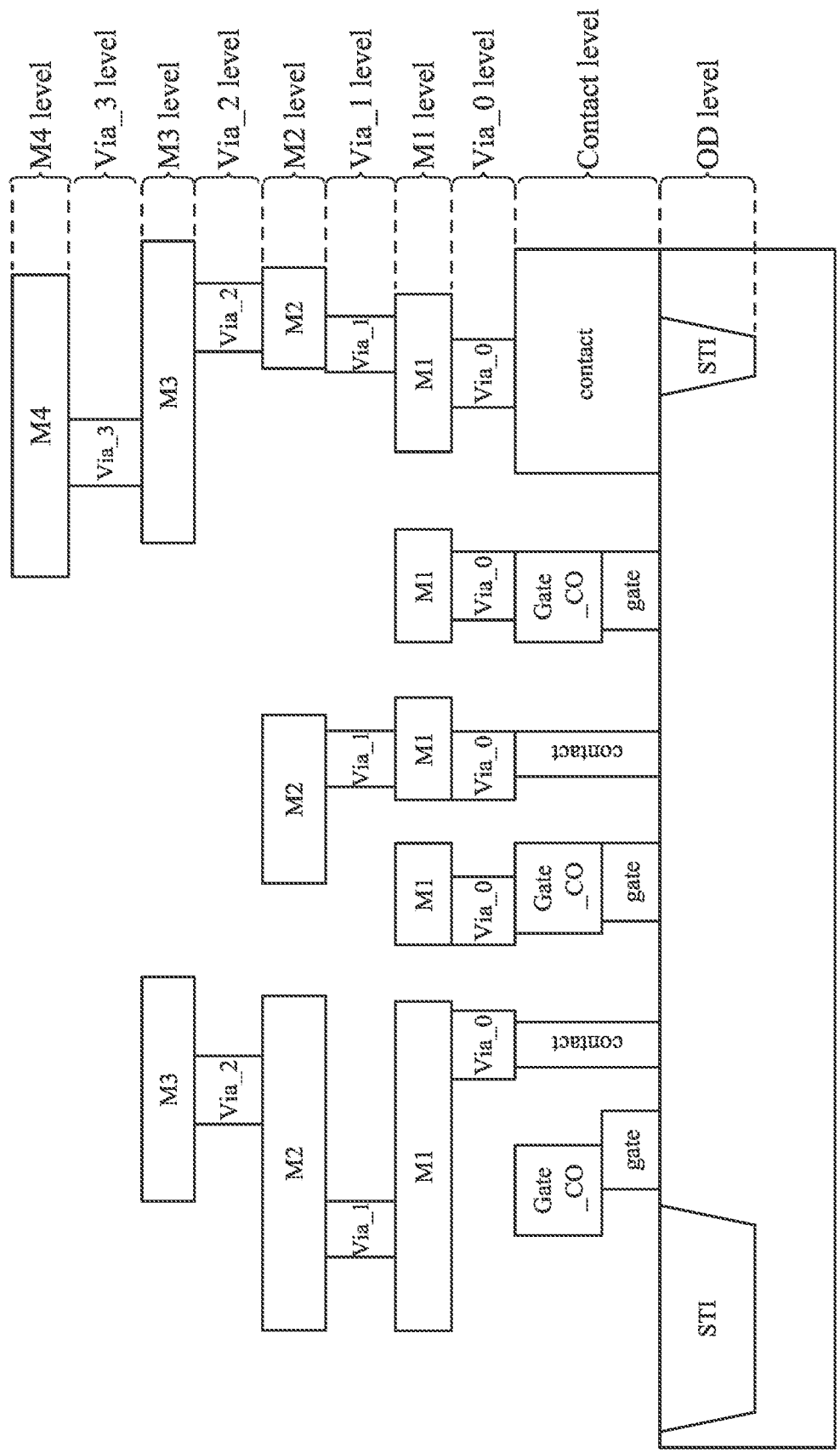
FIG. 3 illustrates a cross-sectional view of the layers involved in an SRAM cell array in accordance with some embodiments.

FIG. 3 illustrates a schematic cross-sectional view of a plurality of layers involved in SRAM cells 10 and 20, which layers are formed on the semiconductor chip or wafer 1000. It is noted that FIG. 3 is schematically illustrated to show various levels of interconnect structure and transistors, and may not reflect the actual cross-sectional view of SRAM cells 10 and 20. The interconnect structure includes a contact level, an OD (oxide definition or active area) level, via levels Via_0 level, Via_1 level, Via_2 level, and Via_3 level, and metal-layer levels M1 level, M2 level, M3 level, and M4 level. Each of the illustrated levels includes one or more dielectric layers and the conductive features formed therein. The conductive features that are at the same level may have top surfaces substantially level to each other, bottom surfaces substantially level to each other, and may be formed simultaneously. The contact level may include gate contacts (also referred to as contact plugs) for connecting gate electrodes of transistors (such as the illustrated exemplary transistors PU-1 and PU-2) to an overlying level such as the Via_0 level, and source/drain contacts (marked as "contact") for connecting the source/drain regions of transistors to the overlying level.

FIGS. 4A through 4E illustrate block diagrams of a layout of features of a HD memory cell (e.g., SRAM cell 10) comprising single fin FinFETs according to some embodiments. Features are illustrated in different levels of SRAM cell 10 (e.g., OD level, contact level, via_0 level, M1 level, via-1 level, M2 level, see FIG. 3), which are consecutively described for clarity.

Figure 4A:
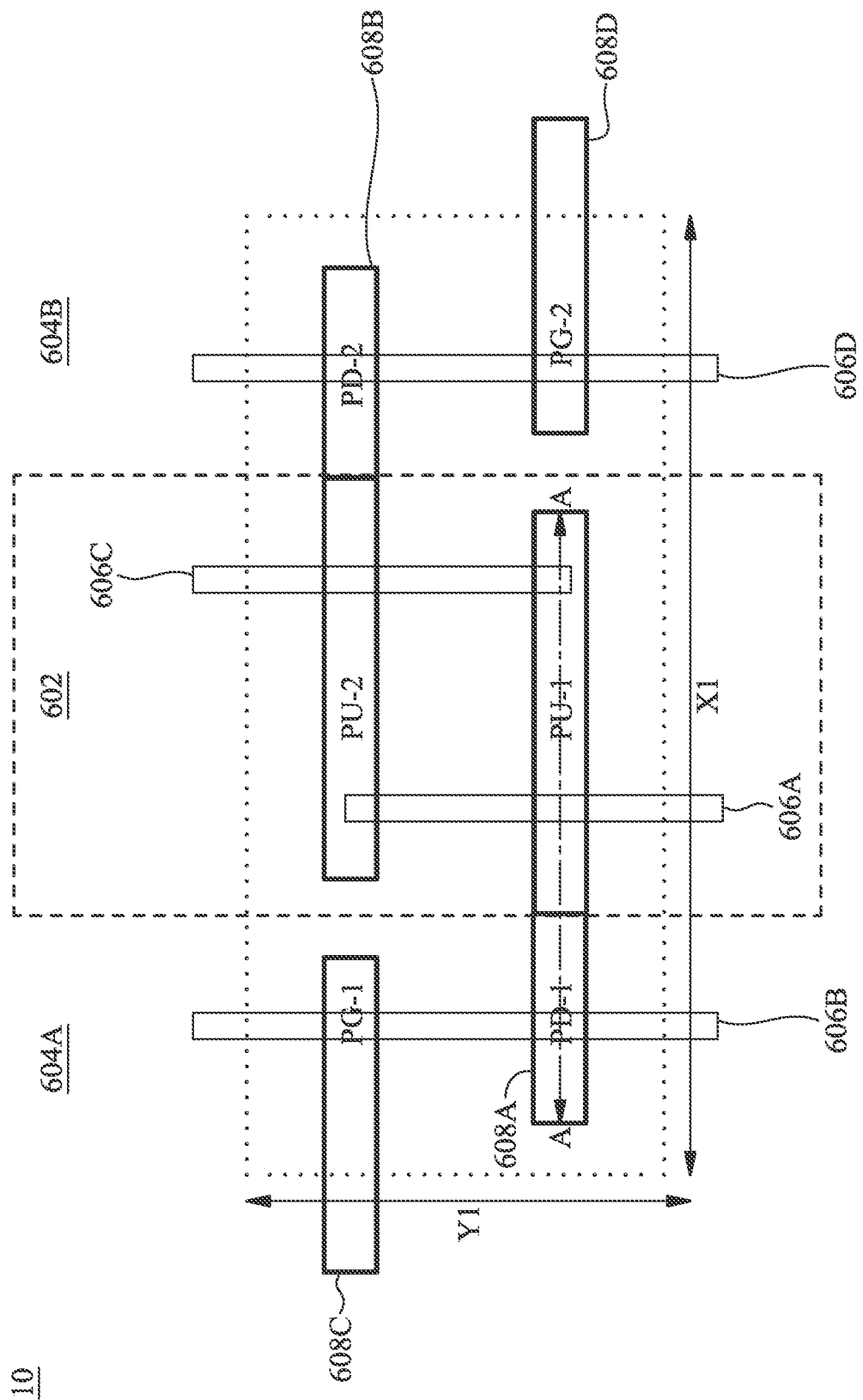
FIGS. 4A through 4E illustrate block diagrams of SRAM cell layouts in accordance with some embodiments.

Referring first to FIG. 4A, features in the OD level (FIG. 3) and overlying gate electrodes of various transistors in SRAM cell 10 are illustrated. In some embodiments, SRAM cell 10 is a high density (HD) SRAM cell. SRAM cell 10 has a first X-pitch X1 (e.g., a lengthwise dimension in a word-line direction) and a first Y-pitch Y1 (e.g., a widthwise dimension in a bit-line direction). The first X-pitch X1 may be in a range of about 140 nm to about 400 nm, and the first Y-pitch Y1 may be in a range of about 60 nm to about 180 nm. An n-well region 602 is at the middle of SRAM cell 10, and two p-well regions 604A and 604B are on opposite sides of n-well region 602. Gate electrode 608A forms pull-up transistor PU-1 with an underlying active region 606A in n-well region 602. In some embodiments, active region 606A is a single fin such as a fin 52 (see below, FIG. 27A) disposed under gate electrode 608A (e.g., gate electrode 608A may be disposed over and extend along sidewalls of active region 606A). Pull-up transistor PU-1 may be a P-type single fin FinFET. Gate electrode 608A further forms pull-down transistor PD-1 with underlying active region 606B in p-well region 604A (e.g., on a first side of n-well region 602). In some embodiments, active region 606B is a single fin such as fin 52 (see below, FIG. 27A) disposed under gate electrode 608A (e.g., gate electrode 608A may be disposed over and extend along sidewalls of active region 606B). Pull-down transistor PD-1 may be an N-type FinFET. Gate electrode 608C forms pass-gate transistor PG-1 with active region 606B. In some embodiments, gate electrode 608C is disposed over and extends along sidewalls of active region 606B.

As further illustrated by FIG. 4A, gate electrode 608B forms pull-up transistor PU-2 with an underlying active region 606C in n-well region 602. In some embodiments, active region 606C is a single fin such as fin 52 (see below, FIG. 27A) disposed under gate electrode 608B (e.g., gate electrode 608B may be disposed over and extend along sidewalls of active region 606C). Gate electrode 608B further forms pull-down transistor PD-2 with an underlying active region 606D in p-well region 604B (e.g., on a second side of n-well region 602 opposing p-well region 604A). In some embodiments, active region 606D is a single fin such as fin 52 (see below, FIG. 27A) disposed under gate electrode 608B (e.g., gate electrode 608B may be disposed over and extend along sidewalls of active region 606D). Gate electrode 608D forms pass-gate transistor PG-2 with underlying active region 606D. In some embodiments, gate electrode 608D is disposed over and extends along sidewalls of active region 606D.

In accordance with some embodiments of the present disclosure, pass-gate transistors PG-1 and PG-2, pull-up transistors PU-1 and PU-2, and pull-down transistors PD-1 and PD-2 are Fin Field-Effect Transistors (FinFETs) as described above where active regions 606A through 606D are single fins. Active regions 606 provide source/drains of various transistors on opposing sides of a respective gate electrode. In some embodiments, pass-gate transistors PG-1 and PG-2 and pull-down transistors PD-1 and PD-2 are formed with the first WFM layer 94A (see below, FIG. 27A) and pull-up transistors PU-1 and PU-2 are formed with the second WFM layer 94A' (see below, FIG. 27A).

Figure 4B:
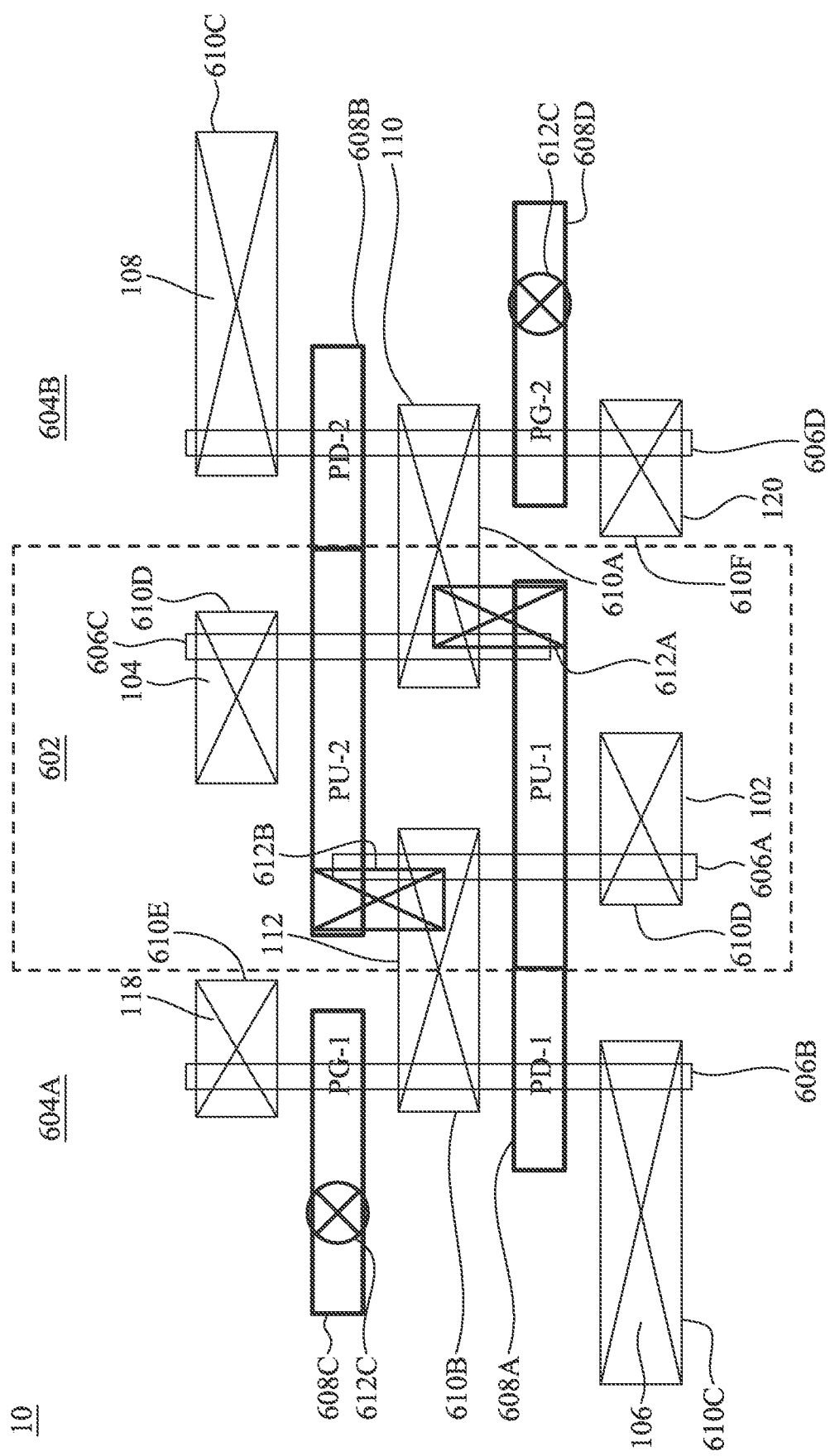

FIG. 4B illustrates features of SRAM cell 10 in the contact level (see FIG. 3) and lower. As shown in FIG. 4B, SD node 110 (see also FIG. 1A) includes source/drain contact plug 610A and gate contact plug 612A, which are the features at the contact level of SRAM cell 10 (see FIG. 3). Source/drain contact plug 610A may be elongated and have a longitudinal direction in the X direction, which is parallel to the extending directions of gate electrodes 608A and 608B. Gate contact plug 612A comprises a portion over, and is electrically connected to, gate electrode 608A. In accordance with some embodiments of the present disclosure, gate contact plug 612A has a longitudinal direction in the Y direction, with is perpendicular to the X direction. In the manufacturing of the SRAM cell 10 on physical semiconductor wafers, contact plugs 610A and 612A may be formed as a single continuous butted contact plug.

SD node 112 includes source/drain contact plug 610B and gate contact plug 612B. Gate contact plug 612B has a portion overlapping source/drain contact plug 610B. Since SD node 110 may be symmetric to SD node 112, the details of gate contact plug 612B and source/drain contact plug 610B may be similar to gate contact plug 612A and source/drain contact plug 610A, respectively, and are not repeated herein for simplicity.

FIG. 4B also illustrates gate contacts 612C connected to gate electrodes 608C and 608D, which may be used to electrically couple gate electrodes 608C and 608D to one or more WLs as described in greater detail below.

Furthermore, elongated contact plugs 610C are used to connect to the source regions of pull-down transistors PD-1 and PD-2 to CVss lines (e.g., electrical ground lines). Elongated contact plugs 610C are parts of the CVss nodes 106 and 108 (see also FIG. 1A). Elongated contact plugs 610C have lengthwise directions parallel to the X direction, and may be formed to overlap the corners of SRAM cell 10. Furthermore, elongated contact plugs 610C may further extend into neighboring SRAM cells in a different column that abut SRAM cell 10. Elongated contact plugs 610C may further be shared between two neighboring SRAM cells in different rows that abut each other. Additionally, contact plugs 610D are used to connect to the source regions of pull-up transistors PU-1 and PU-2 to CVdd lines (e.g., supply voltage lines). Contact plugs 610D are parts of the CVdd nodes 102 and 104 (see also FIG. 1A).

As further illustrated by FIG. 4B, contact plugs 610E and 610F are used to connect to the source/drain regions of pass-gate transistors PG-1 and PG-2 to a BL and a BLB, respectively. Contact plugs 610E and 610F are parts of the BL node 118 and BLB node 120, respectively (see also FIG. 1A). Contact plugs 610E and 610F may further be shared between two neighboring SRAM cells in different rows that abut each other.

Figure 4C:
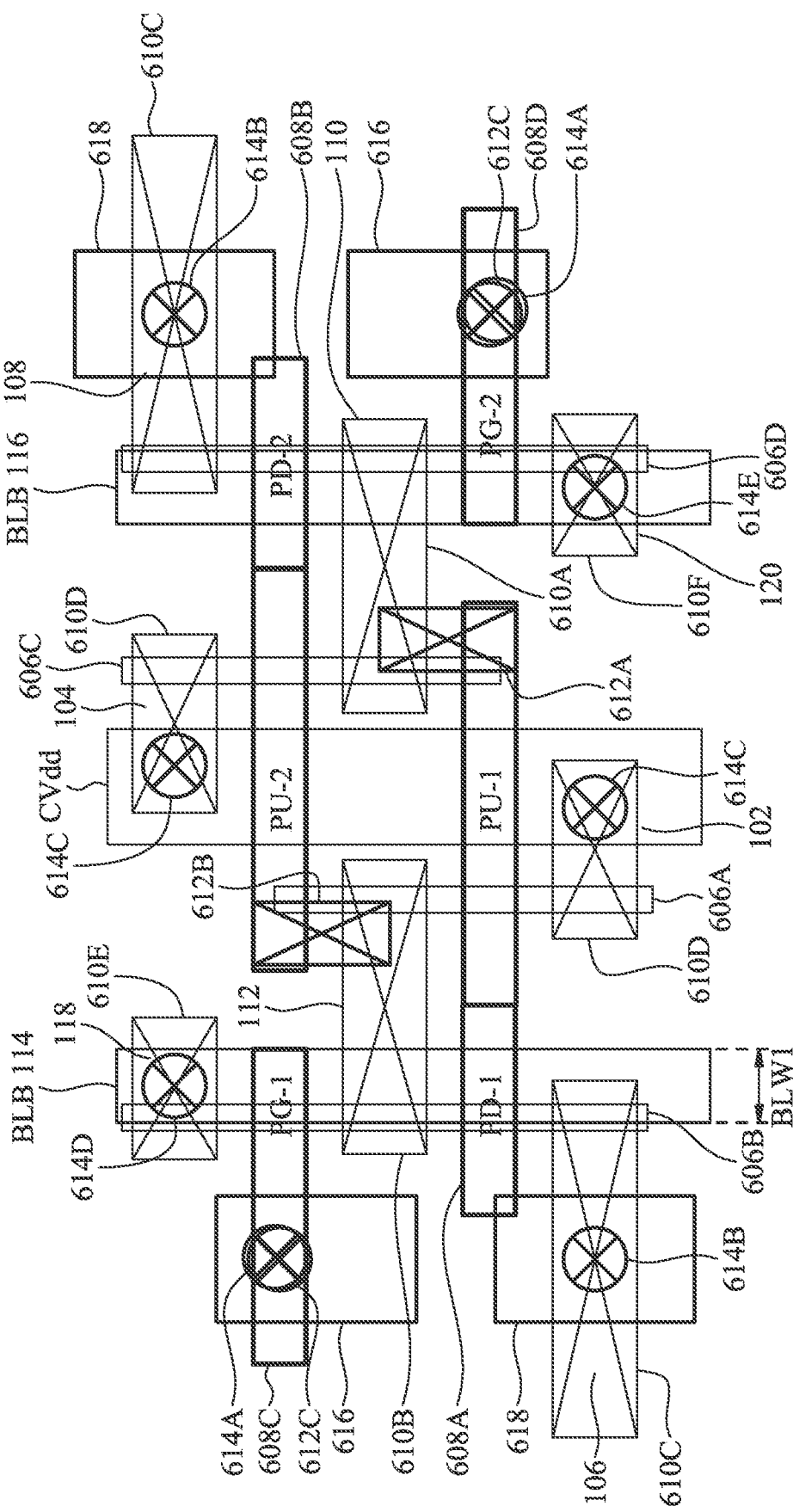

FIG. 4C illustrates features of SRAM cell 10 in the M1 and via_0 levels (see FIG. 3) and lower. In FIG. 4C, vias 614 (labeled 614A through 614E) are disposed in the via_0 level (see FIG. 3) while conductive lines 616, conductive lines 618, BL 114, CVdd line, and BLB line 116 are disposed in the M1 level (see FIG. 3). For example, various conductive lines in the M1 level are disposed over various vias in the via_0 level.

As shown in FIG. 4C, vias 614A are connected to gate contacts 612C (e.g., gate contacts for pass-gate transistors PG-1 or PG-2). Vias 614A are further connected to conductive lines 616, which may be used to electrically couple gate electrodes of pass gate transistors PG-1 and PG-2 to one or more WLs as described in greater detail with respect to FIG. 4D below. Vias 614A and conductive lines 616 may further extend into and shared with neighboring SRAM cells in a different column that abut SRAM cell 10 (see FIG. 4E).

Furthermore, vias 614B are connected to elongated contact plugs 610C (e.g., source contacts of pull-down transistors PD-1 and PD-2). Vias 614B are further connected to conductive lines 618, which may be used to electrically couple sources of pull-down transistors PD-1 and PD-2 to CVss lines as described in greater detail with respect to FIGS. 4D and 4E below. Furthermore, vias 614B and conductive lines 618 may further extend into neighboring SRAM cells in a different column that abut SRAM cell 10. Vias 614B and conductive lines 618 may further be shared between two neighboring SRAM cells in different rows that abut each other.

Additionally, vias 614C are connected to contact plugs 610D (e.g., source contacts of pull-up transistors PU-1 and PU-2). Vias 614C are further connected to a CVdd line, which electrically connects sources of pull-up transistors PU-1 and PU-2 to CVdd. Thus, vias 614C are parts of the CVdd nodes 102 and 104 (see also FIG. 1A). Vias 614C may further be shared between two neighboring SRAM cells in different rows that abut each other.

As further illustrated by FIG. 4C, vias 614D and 614E are connected to contact plugs 610E and 610F (e.g., source/drain contacts of pass-gate transistors PG-1 and PG-2), respectively. Vias 614D and 614E are further connected to a BL 114 and a BLB 116, respectively. Thus, vias 614D and 614E are parts of the BL node 118 and BLB node 120, respectively (see also FIG. 1A). Vias 614D and 614E may be shared between two neighboring SRAM cells in different rows that abut each other.

Figure 4D:
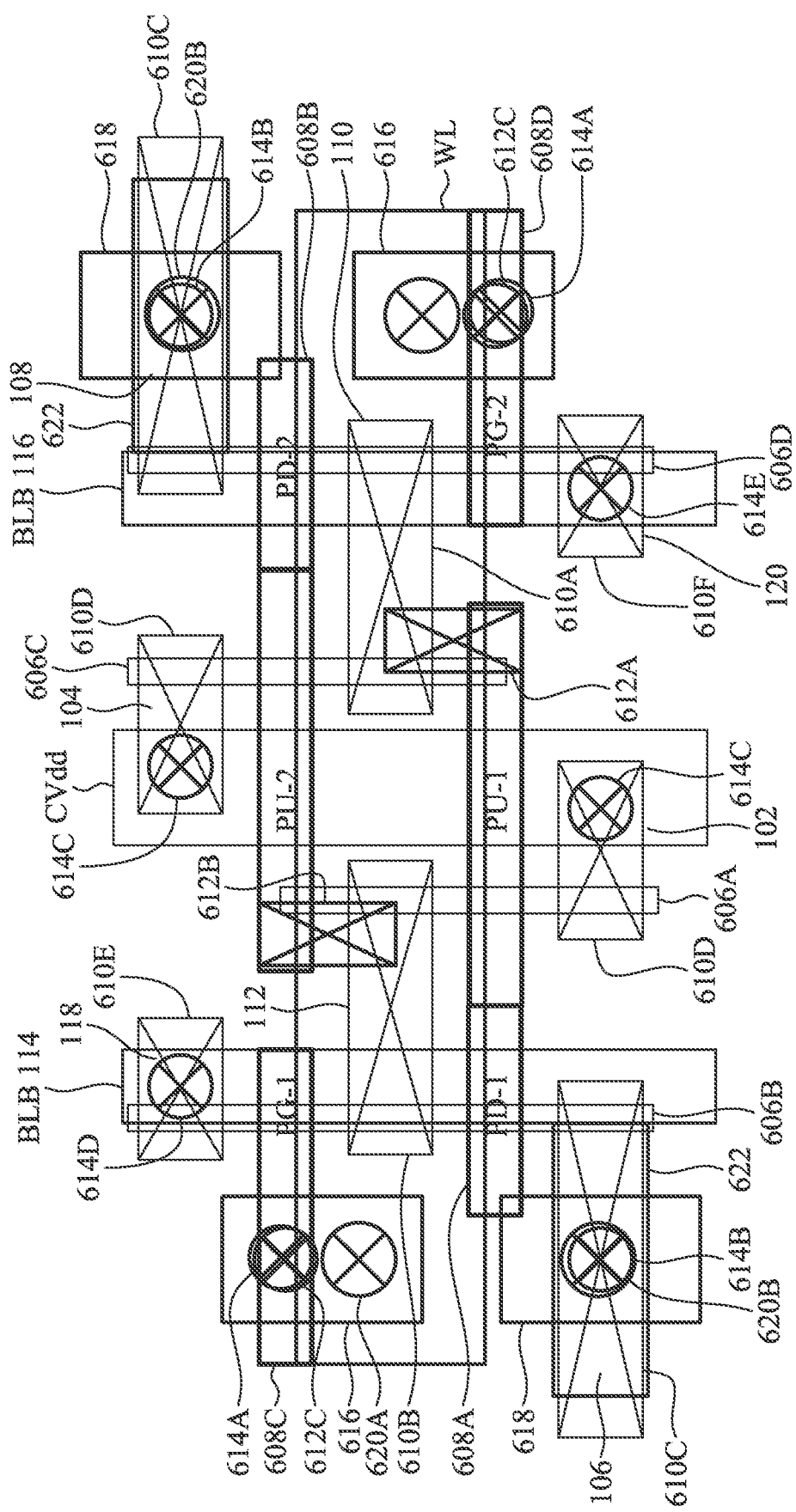

FIG. 4D illustrates features of SRAM cell 10 in the M2 and via_1 levels (see FIG. 3) and lower. In FIG. 4D, vias 620 (labeled 620A and 620B) are disposed in the via_1 level (see FIG. 3) while a wordline (WL) is disposed in the M2 level (see FIG. 3). For example, various conductive lines in the M2 level are disposed over various vias in the via_1 level.

As shown in FIG. 4D, vias 620A in the via_1 level are connected to conductive lines 616 in the M1 level, which electrically connect gate contacts 612C (e.g., gate contacts for pass-gate transistors PG-1 or PG-2) to the WL in the M2 level. Thus, SRAM cell 10 includes WL nodes electrically connected to gates of pass-gate transistors. Vias 620B in the via_1 level are connected to conductive lines 618 in the M1 level and to conductive lines 622 in the M2 level, which may be used to electrically couple sources of pull-down transistors PD-1 and PD-2 to CVss lines as described in greater detail with respect to FIG. 4E below.

Figure 4E:
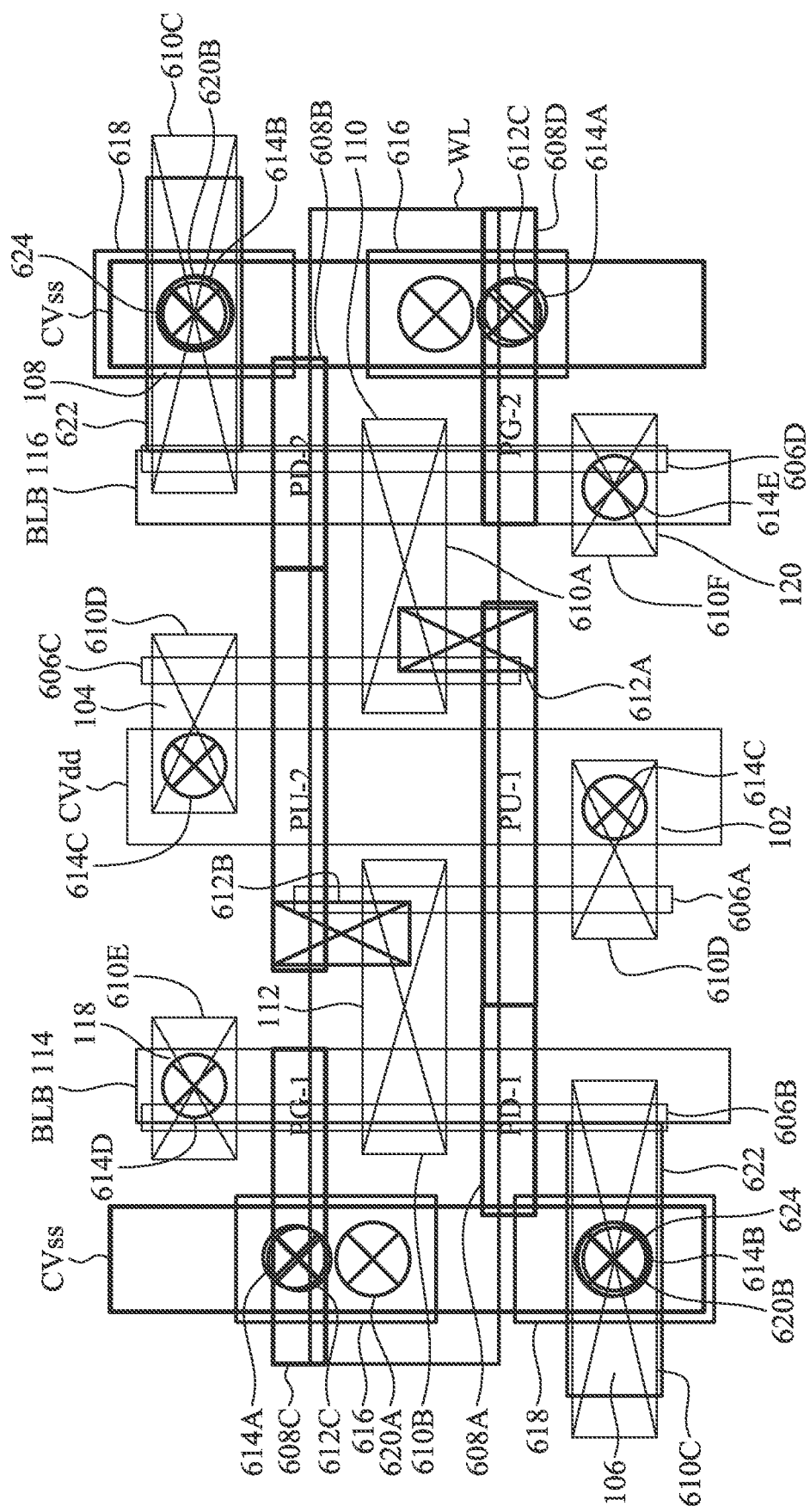

FIG. 4E illustrates features of SRAM cell 10 in the M3 and via_2 levels (see FIG. 3) and lower. In FIG. 4E, vias 624 are disposed in the via_2 level (see FIG. 3) while CVss lines are disposed in the M3 level (see FIG. 3). For example, various conductive lines in the M2 level are disposed over various vias in the via_2 level. As shown in FIG. 4E, vias 624 are connected to conductive lines 622, which electrically connect to vias 620B. Thus, SRAM cell 10 includes CVss nodes 106 and 108 (see also FIG. 1A), which include vias 624.

FIGS. 5A through 5E illustrate block diagrams of a layout of features of a HC memory cell (e.g., SRAM cell 20) comprising multiple fin FinFETs according to some embodiments. Features are illustrated in different levels of SRAM cell 20 (e.g., OD level, contact level, via_0 level, M1 level, via-1 level, M2 level, see FIG. 3), which are consecutively described for clarity.

Figure 5A:
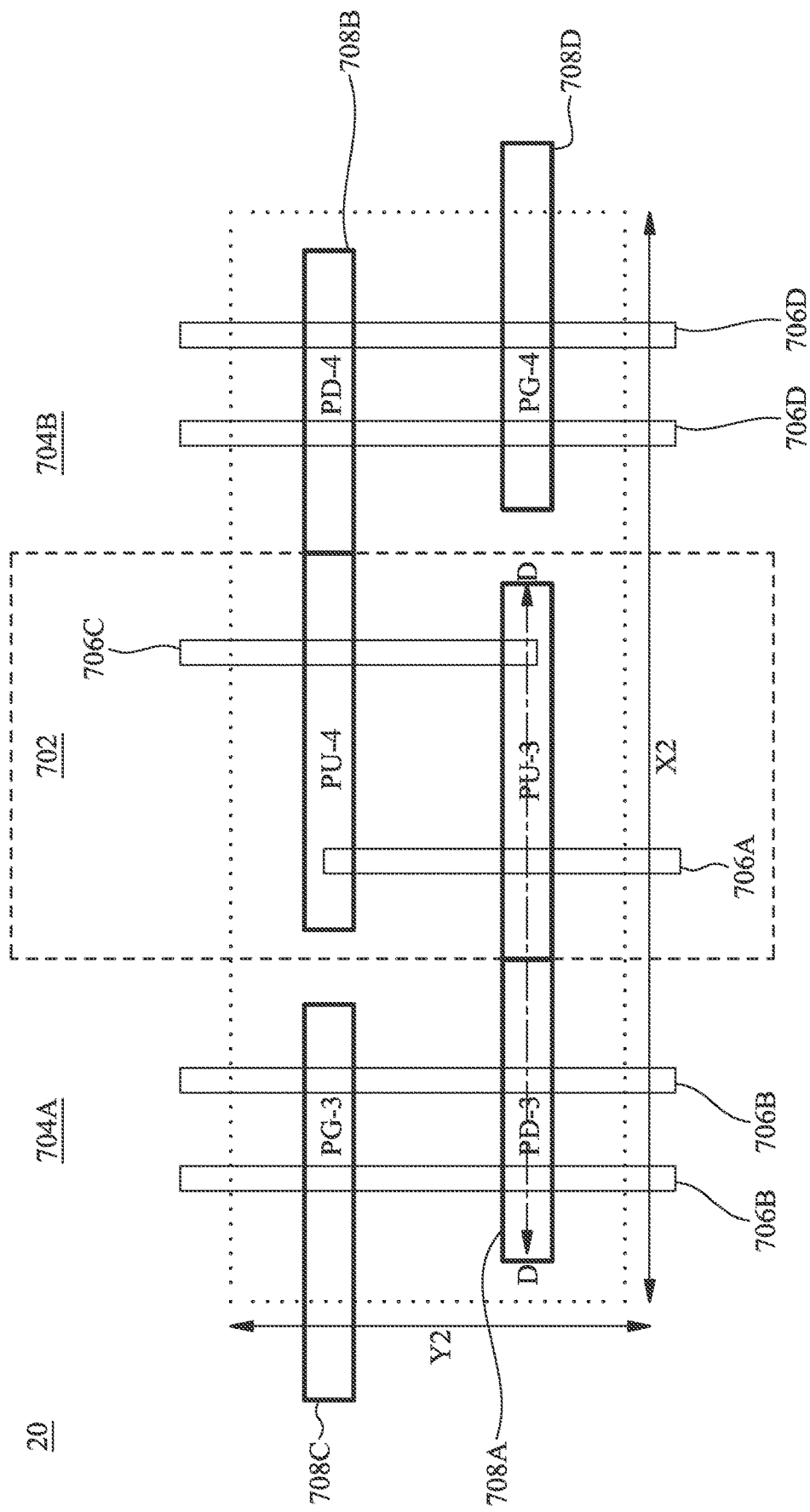
FIGS. 5A through 5E illustrate block diagrams of SRAM cell layouts in accordance with some embodiments.

Referring first to FIG. 5A, features in the OD level (FIG. 3) and overlying gate electrodes of various transistors in SRAM cell 20 are illustrated. In some embodiments, SRAM cell 20 is a high current (HC) SRAM cell. SRAM cell 20 has a second X-pitch X2 (word-line direction) and a second Y-pitch Y2 (bit-line direction). The second X-pitch X2 may be in a range of about 154 nm to about 600 nm, and the second Y-pitch Y2 may be in a range of about 60 nm to about 180 nm. In some embodiments, a ratio of the second X-pitch X2 to the first X-pitch X1 is in a range of about 1.1 to about 1.5. In some embodiments, the first Y-pitch Y1 and the second Y-pitch Y2 may be substantially the same.

An n-well region 702 is at the middle of SRAM cell 20, and two p-well regions 704A and 704B are on opposite sides of n-well region 702. Gate electrode 708A forms pull-up transistor PU-3 with an underlying active region 706A in n-well region 702. In some embodiments, active region 706A is a single fin such as fin 52 (see below, FIG. 28) disposed under gate electrode 708A (e.g., gate electrode 708A may be disposed over and extend along sidewalls of active region 706A). Gate electrode 708A further forms pull-down transistor PD-3 with underlying active region 706B in p-well region 704A (e.g., on a first side of n-well region 702). In some embodiments, active region 706B comprises two or more fins such as fins 52' (see below, FIG. 28) disposed under gate electrode 708A (e.g., gate electrode 708A may be disposed over and extend along sidewalls of active region 706B). Gate electrode 708C forms pass-gate transistor PG-3 with active region 706B. In some embodiments, gate electrode 708C is disposed over and extends along sidewalls of active region 706B.

As further illustrated by FIG. 5A, gate electrode 708B forms pull-up transistor PU-4 with an underlying active region 706C in n-well region 702. In some embodiments, active region 706C is a single fin such as fin 52 (see below, FIG. 28) disposed under gate electrode 708B (e.g., gate electrode 708B may be disposed over and extend along sidewalls of active region 706C). Gate electrode 708B further forms pull-down transistor PD-4 with an underlying active region 706D in p-well region 704B (e.g., on a second side of n-well region 702 opposing p-well region 704A). In some embodiments, active region 706D comprises two or more fins such as fins 52' (see below, FIG. 28) disposed under gate electrode 708B (e.g., gate electrode 708B may be disposed over and extend along sidewalls of active region 706D). Gate electrode 708D forms pass-gate transistor PG-4 with underlying active region 706D. In some embodiments, gate electrode 708D is disposed over and extends along sidewalls of active region 706D.

In accordance with some embodiments of the present disclosure, pass-gate transistors PG-3 and PG-4, pull-up transistors PU-3 and PU-4, and pull-down transistors PD-3 and PD-4 are Fin Field-Effect Transistors (FinFETs) as described above where active regions 706A and 706C are single fins and active regions 706B and 706D comprise multiple fins. Active regions 706A, 706C, 706B, and 706D provide source/drains of various transistors on opposing sides of a respective gate electrode. In some embodiments, pull-up transistors PU-3 and PU-4 are formed with the third WFM layer 95A (see below, FIG. 28), and pass-gate transistors PG-3 and PG-4 and pull-down transistors PD-3 and PD-4 are formed with the fourth WFM layer 95A' (see below, FIG. 28).

Figure 5B:
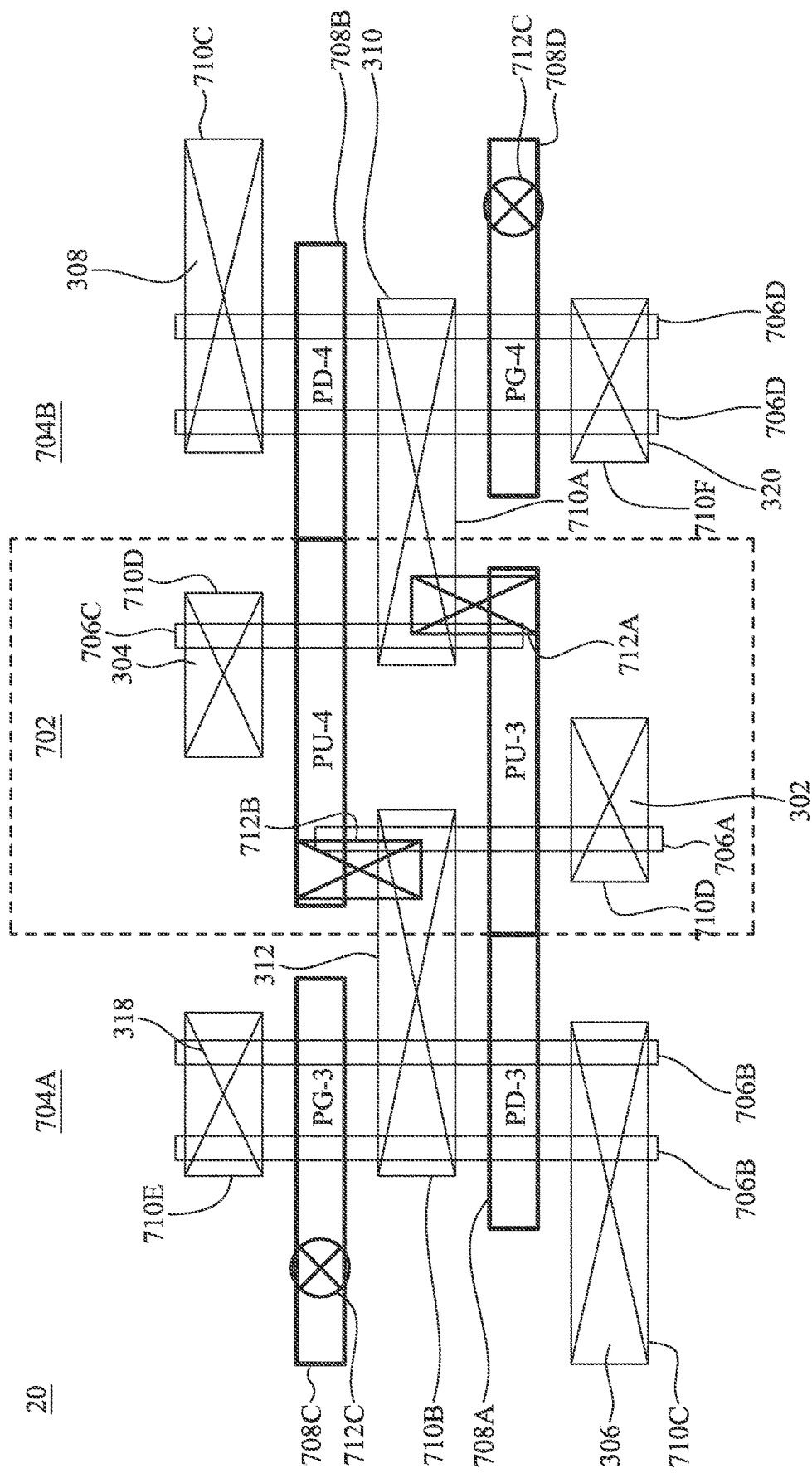

FIG. 5B illustrates features of SRAM cell 20 in the contact level (see FIG. 3) and lower. As shown in FIG. 5B, SD node 310 (see also FIG. 1B) includes source/drain contact plug 710A and gate contact plug 712A, which are the features at the contact level of SRAM cell 20 (see FIG. 3). Source/drain contact plug 710A may be elongated and have a longitudinal direction in the X direction, which is parallel to the extending directions of gate electrodes 708A and 708B. Gate contact plug 712A comprises a portion over, and is electrically connected to, gate electrode 708A. In accordance with some embodiments of the present disclosure, gate contact plug 712A has a longitudinal direction in the Y direction, with is perpendicular to the X direction. In the manufacturing of the SRAM cell 20 on physical semiconductor wafers, contact plugs 710A and 712A may be formed as a single continuous butted contact plug.

SD node 312 includes source/drain contact plug 710B and gate contact plug 712B. Gate contact plug 712B has a portion overlapping source/drain contact plug 710B. Since SD node 310 may be symmetric to SD node 312, the details of gate contact plug 712B and source/drain contact plug 710B may be similar to gate contact plug 712A and source/drain contact plug 710A, respectively, and are not repeated herein for simplicity.

FIG. 5B also illustrates gate contacts 712C connected to gate electrodes 708C and 708D, which may be used to electrically couple gate electrodes 708C and 708D to one or more WLs as described in greater detail below.

Furthermore, elongated contact plugs 710C are used to connect to the source regions of pull-down transistors PD-3 and PD-4 to CVss lines (e.g., electrical ground lines). Elongated contact plugs 710C are parts of the CVss nodes 306 and 308 (see also FIG. 1B).

Elongated contact plugs 710C have lengthwise directions parallel to the X direction, and may be formed to overlap the corners of SRAM cell 20. Furthermore, elongated contact plugs 710C may further extend into neighboring SRAM cells in a different column that abut SRAM cell 20. Elongated contact plugs 710C may further be shared between two neighboring SRAM cells in different rows that abut each other. Additionally, contact plugs 710D are used to connect to the source regions of pull-up transistors PU-3 and PU-4 to CVdd lines (e.g., supply voltage lines). Contact plugs 710D are parts of the CVdd nodes 302 and 304 (see also FIG. 1B).

As further illustrated by FIG. 5B, contact plugs 710E and 710F are used to connect to the source/drain regions of pass-gate transistors PG-3 and PG-4 to a BL and a BLB, respectively. Contact plugs 710E and 710F are parts of the BL node 318 and BLB node 320, respectively (see also FIG. 1B). Contact plugs 710E and 710F may further be shared between two neighboring SRAM cells in different rows that abut each other.

Figure 5C:
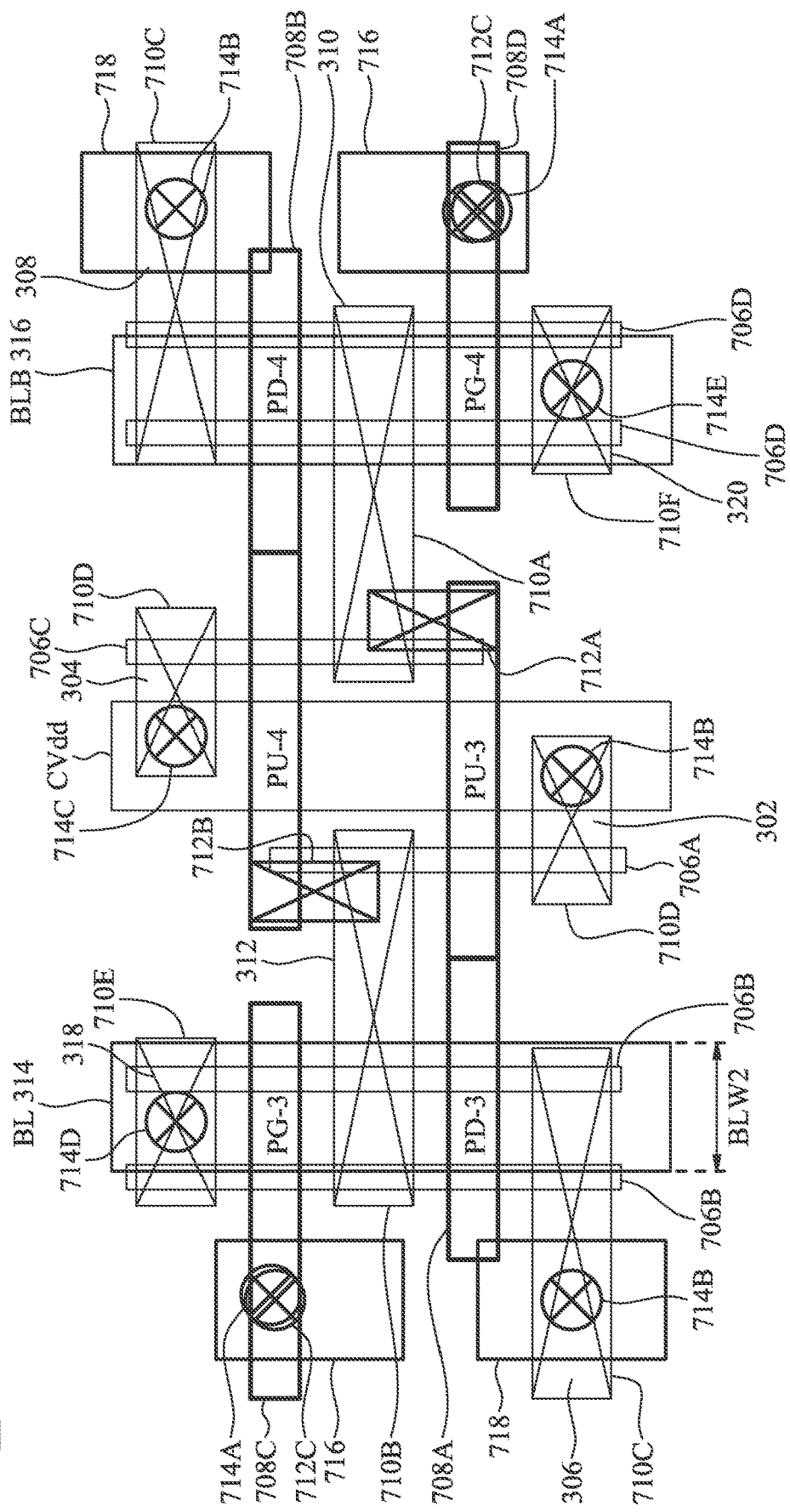

FIG. 5C illustrates features of SRAM cell 20 in the M1 and via_0 levels (see FIG. 3) and lower. In FIG. 5C, vias 714 (labeled 714A through 714E) are disposed in the via_0 level (see FIG. 3) while conductive lines 716, conductive lines 718, BL 314, CVdd line, and BLB line 316 are disposed in the M1 level (see FIG. 3). For example, various conductive lines in the M1 level are disposed over various vias in the via_0 level.

As shown in FIG. 5C, vias 714A are connected to gate contacts 712C (e.g., gate contacts for pass-gate transistors PG-3 or PG-4). Vias 714A are further connected to conductive lines 716, which may be used to electrically couple gate electrodes of pass gate transistors PG-3 and PG-4 to one or more WLs as described in greater detail with respect to FIG. 5D below. Furthermore, vias 714B are connected to elongated contact plugs 710C (e.g., source contacts of pull-down transistors PD-3 and PD-4). Vias 714B are further connected to conductive lines 718, which may be used to electrically couple sources of pull-down transistors PD-3 and PD-4 to CVss lines as described in greater detail with respect to FIGS. 5D and 5E below. Furthermore, vias 714B and conductive lines 718 may further extend into neighboring SRAM cells in a different column that abut SRAM cell 20. Vias 714B and conductive lines 718 may further be shared between two neighboring SRAM cells in different rows that abut each other.

Additionally, vias 714C are connected to contact plugs 710D (e.g., source contacts of pull-up transistors PU-3 and PU-4). Vias 714C are further connected to a CVdd line, which electrically connects sources of pull-up transistors PU-3 and PU-4 to CVdd. Thus, vias 714C are parts of the CVdd nodes 302 and 304 (see also FIG. 1B). Vias 714C may further be shared between two neighboring SRAM cells in different rows that abut each other.

As further illustrated by FIG. 5C, vias 714D and 714E are connected to contact plugs 710E and 710F (e.g., source/drain contacts of pass-gate transistors PG-3 and PG-4), respectively. Vias 714D and 714E are further connected to a BL 314 and a BLB 316, respectively. In some embodiments, the ratio of BLW2:BLW1 is greater than 1.1. Thus, vias 714D and 714E are parts of the BL node 318 and BLB node 320, respectively (see also FIG. 1B). Vias 714D and 714E may be shared between two neighboring SRAM cells in different rows that abut each other.

Figure 5D:
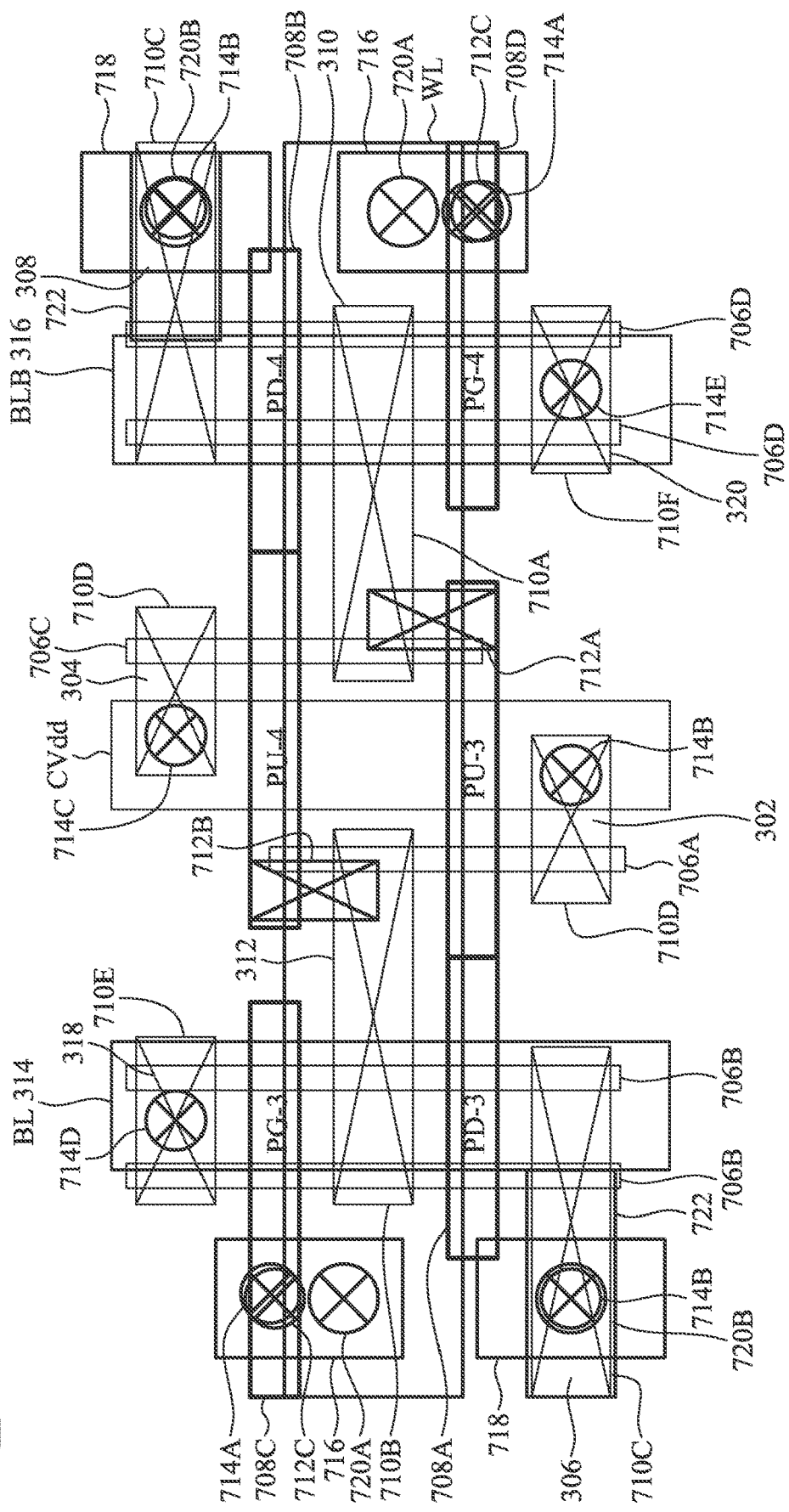

FIG. 5D illustrates features of SRAM cell 20 in the M2 and via_1 levels (see FIG. 3) and lower. In FIG. 5D, vias 720 (labeled 720A and 720B) are disposed in the via_1 level (see FIG. 3) while a wordline (WL) is disposed in the M2 level (see FIG. 3). For example, various conductive lines in the M2 level are disposed over various vias in the via_1 level.

As shown in FIG. 5D, vias 720A in the via_1 level are connected to conductive lines 716 in the M1 level, which electrically connect gate contacts 712C (e.g., gate contacts for pass-gate transistors PG-3 or PG-4) to the WL. Thus, SRAM cell 20 includes WL nodes electrically connected to gates of pass-gate transistors. Vias 720B in the via_1 level are connected to conductive lines 718 in the M1 level and to conductive lines 722 in the M2 level, which may be used to electrically couple sources of pull-down transistors PD-3 and PD-4 to CVss lines as described in greater detail with respect to FIG. 5E below.

Figure 5E:
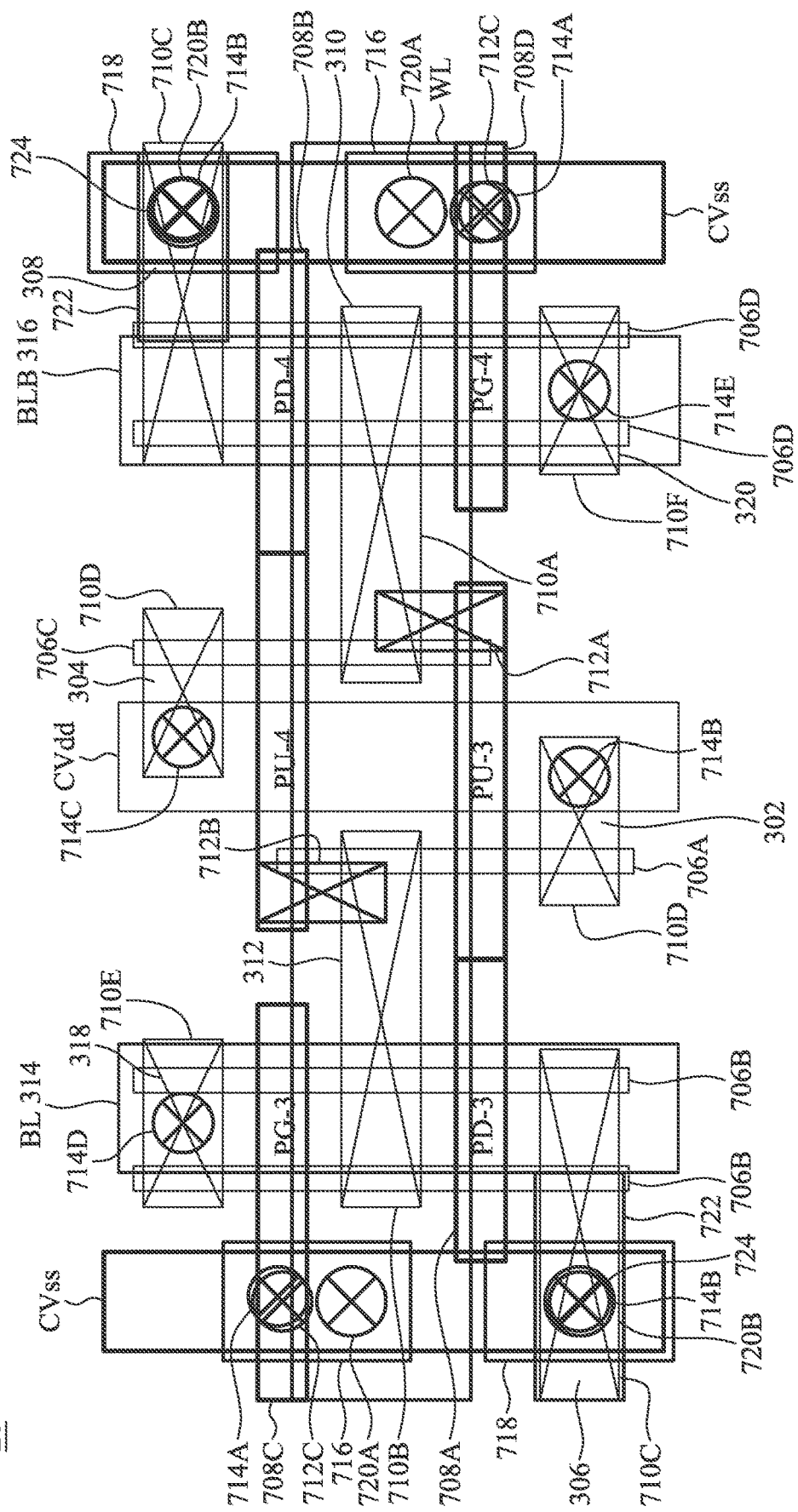

FIG. 5E illustrates features of SRAM cell 20 in the M3 and via_2 levels (see FIG. 3) and lower. In FIG. 5E, vias 724 are disposed in the via_2 level (see FIG. 3) while CVss lines are disposed in the M3 level (see FIG. 3). For example, various conductive lines in the M2 level are disposed over various vias in the via_2 level. As shown in FIG. 5E, vias 724 are connected to conductive lines 722, which electrically connect to vias 720B. Thus, SRAM cell 20 includes CVss nodes 306 and 308 (see also FIG. 1B), which include vias 724.

FIGS. 6 through 28 illustrate the intermediate stages of manufacturing from the perspective of transistors in an HD SRAM cell 10, which is generally analogous to the manufacturing of transistors in HC SRAM cell 20. Differences in the manufacturing of HD SRAM cells 10 and HC SRAM cells 20 are described when applicable. The manufacturing of HD SRAM cells 10 and HC SRAM cells 20 may occur concurrently when the same steps apply. When different processing steps are applied to HD SRAM cells 10 and HC SRAM cells 20, the unprocessed SRAM cells (e.g., either HD SRAM cells 10 or HC SRAM cells 20) may be masked while the other SRAM cells are being processed. Subsequently, the mask is removed and concurrent processing of HD SRAM cells 10 and HC SRAM cells 20 may resume.

Figure 6:
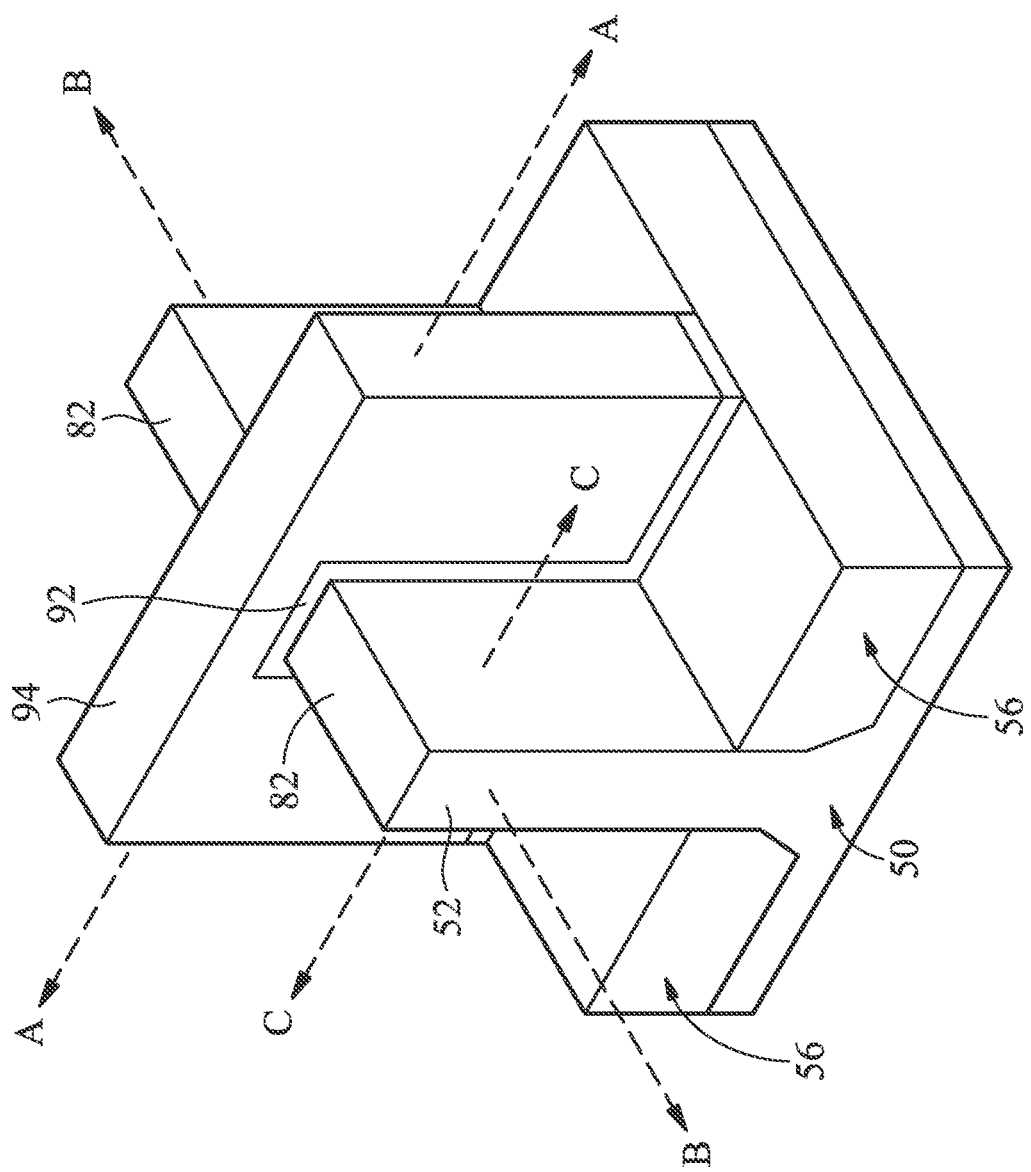
FIG. 6 illustrates an example of a FinFET in a three-dimensional view, in accordance with some embodiments.

FIG. 6 illustrates an example of a FinFET in HD SRAM region 1010 in a three-dimensional view, in accordance with some embodiments. FIGS. 7 through 15C and 16A-27B are cross-sectional views of intermediate stages in the manufacturing of FinFETs in HD SRAM region 1010, in accordance with some embodiments. FIGS. 15D and 28 are cross-sectional views of intermediate stages in the manufacturing of FinFETs in HC SRAM region 1020, in accordance with some embodiments. FIGS. 7 through 12 illustrate reference cross-section A-A illustrated in FIG. 6, corresponding to the area covered by PD-1 and PU-1 transistors in the HD SRAM cell 10 of FIGS. 4A-4E. FIGS. 13A, 14A, 15A, 16A, 17A, 18A, 19A, 20A, 21A, 22A, 23A, 24A, 25A, 26A, and 27A are illustrated along reference cross-section A-A illustrated in FIG. 6, and FIGS. 13B, 14B, 15B, 16B, 17B, 18B, 19B, 20B, 21B, 22B, 23B, 24B, 25B, 26B, and 27B are illustrated along a similar cross-section B-B illustrated in FIG. 6, except for multiple fins/FinFETs. FIG. 15C is illustrated along reference cross-section C-C illustrated in FIG. 6, except for multiple fins/FinFETs corresponding to the area in HD SRAM region 1010 covered by PD-3 and PU-3 transistors in the HD SRAM cell 10 of FIGS. 4A-4E. FIG. 15D is illustrated along reference cross-section C-C illustrated in FIG. 6, except for multiple fins/FinFETs corresponding to the area in HC SRAM region 1020 covered by PD-3 and PU-3 transistors in the HC SRAM cells 20 of FIGS. 5A-5E. FIG. 28 is illustrated along reference cross-section D-D illustrated in FIG. 5A (which is the same as reference cross-section A-A illustrated in FIG. 6 except for multiple fins/FinFETs) corresponding to the area covered by PD-3 and PU-3 transistors in the HC SRAM cell 20 of FIGS. 5A-5E.

As illustrated in FIG. 6, the FinFET comprises a fin 52 on a substrate 50 (e.g., a semiconductor substrate). The FinFET is illustrated in HD SRAM region 1010. Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 6 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 7:
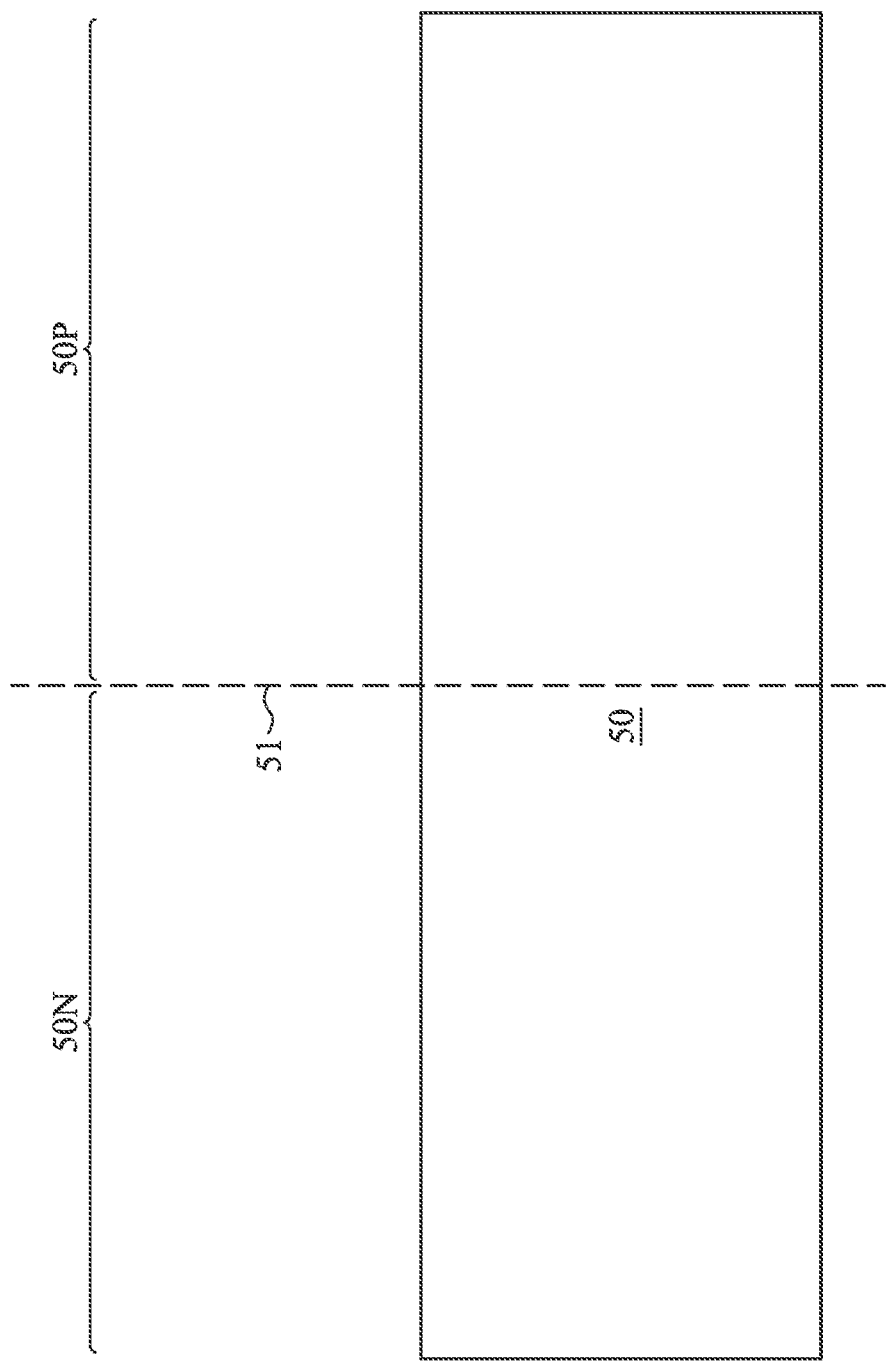
FIGS. 7 through 12, 13A, 13B, 14A, 14B, 15A-15D, 16A, 16B, 17A, 17B, 18A, 18B, 19A,19B, 20A, 20B, 21A, 21B, 22A, 22B, 23A, 23B, 24A, 24B, 25A, 25B, 26A, 26B, 27A, 27B, and 28 are cross-sectional views of intermediate stages in the manufacturing of FinFETs, in accordance with some embodiments.

In FIG. 7, a substrate 50 is provided. The substrate 50 may be a wafer, such as the wafer 1000 illustrated in FIG. 2. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. P-wells such as p-wells 604 and 704 can be formed in the region 50N, as described below with reference to FIG. 11. The region 50P can be for forming p-type devices, such as PMOS transistors, e.g., p-type FinFETs. N-wells such as n-wells 602 and 702 can be formed in the region 50P, as described below with reference to FIG. 11. The region 50N may be directly adjacent to the region 50P across a boundary illustrated by divider 51.

Figure 8:
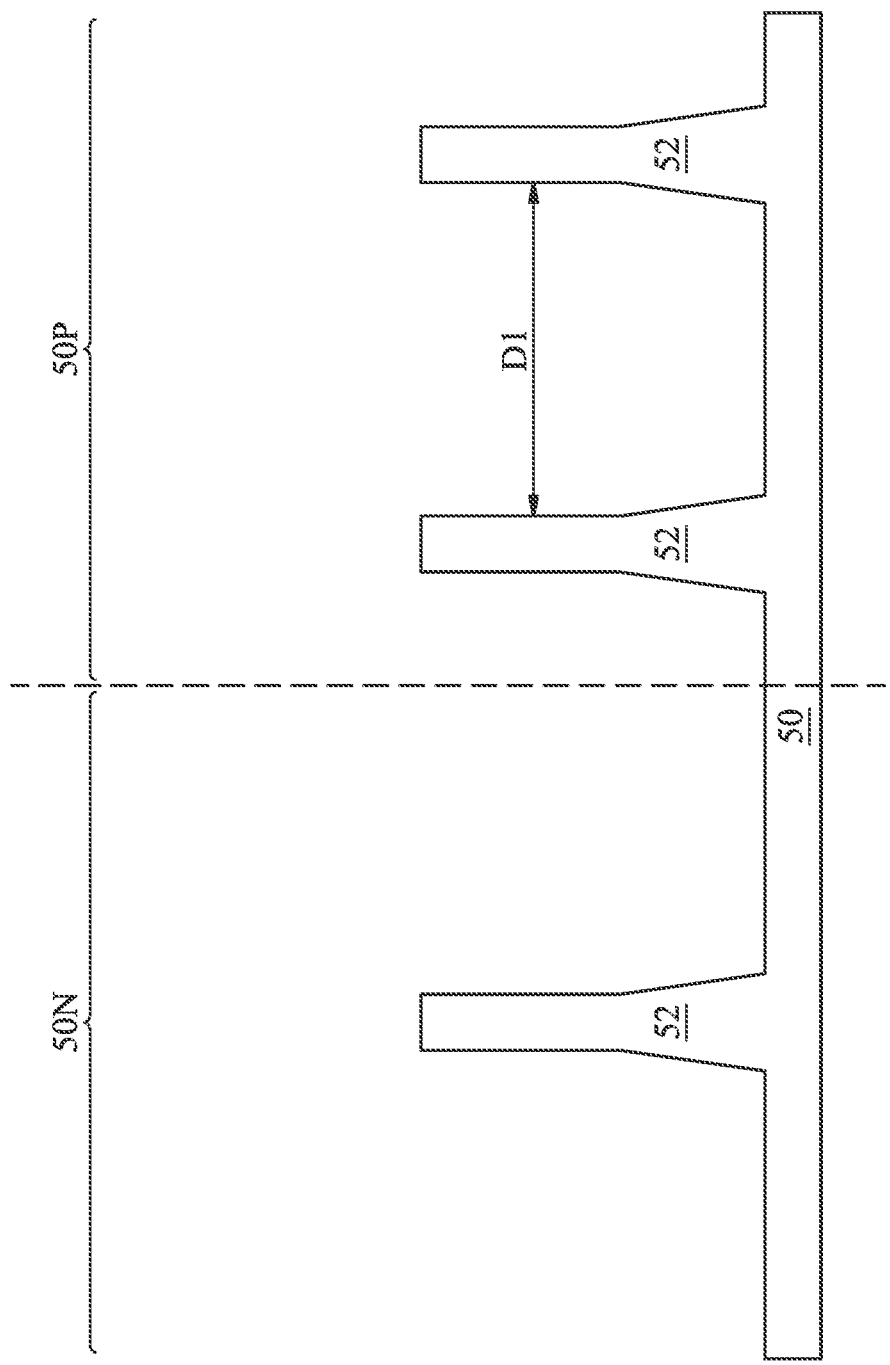

In FIG. 8, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52. In some embodiments, two fins 52 may be formed in region 50P, corresponding to active regions 606A and 606C as described above with respect to FIG. 4A and active regions 706A and 706C described above with respect to FIG. 5A. Active regions 606A and 606C and active regions 706A and 706C form pails of separate single fin FinFETs. The fins 52 may be separated by a distance D1 in a range of about 30 nm to about 70 nm.

Figure 9:
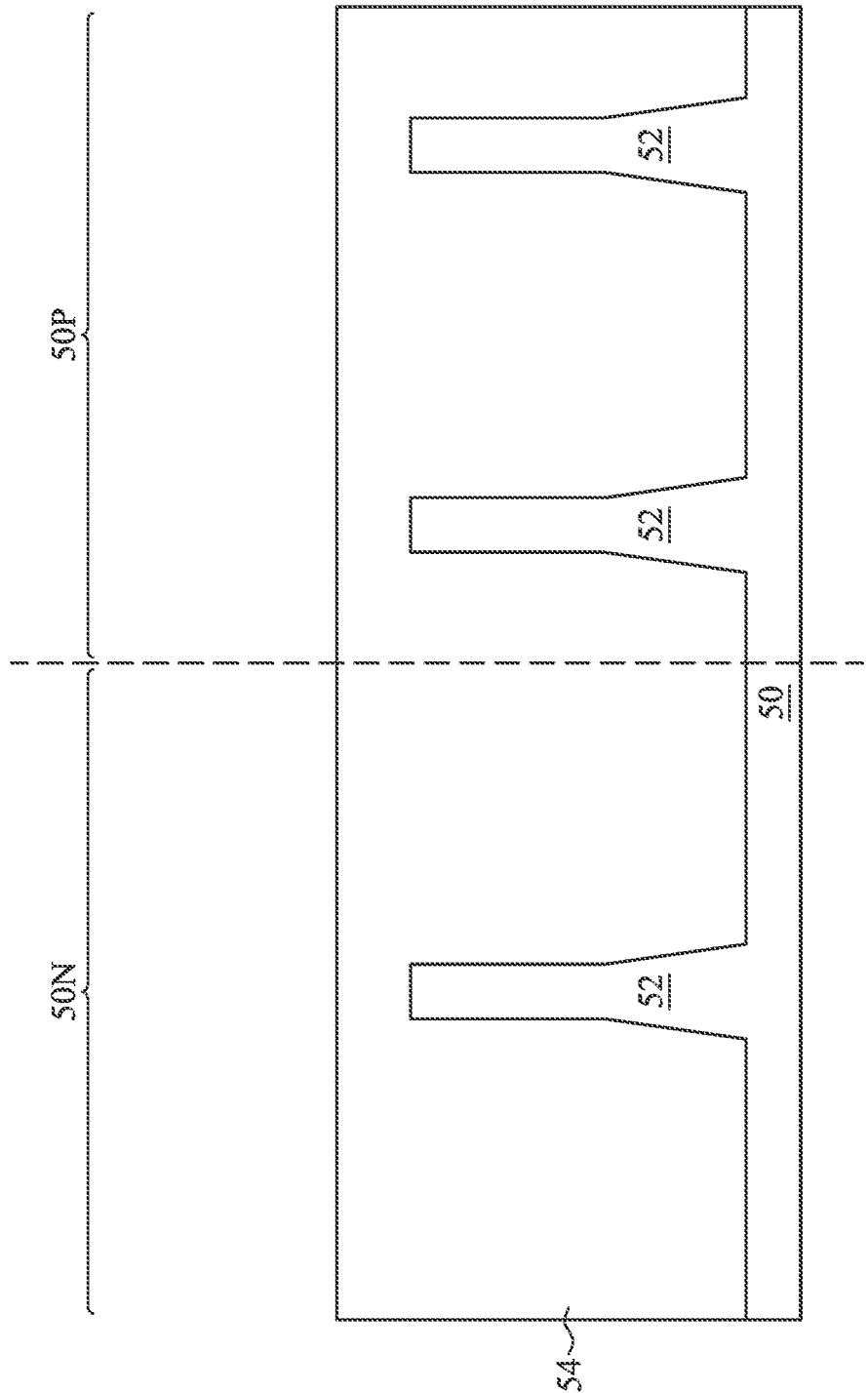

In FIG. 9, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 10:
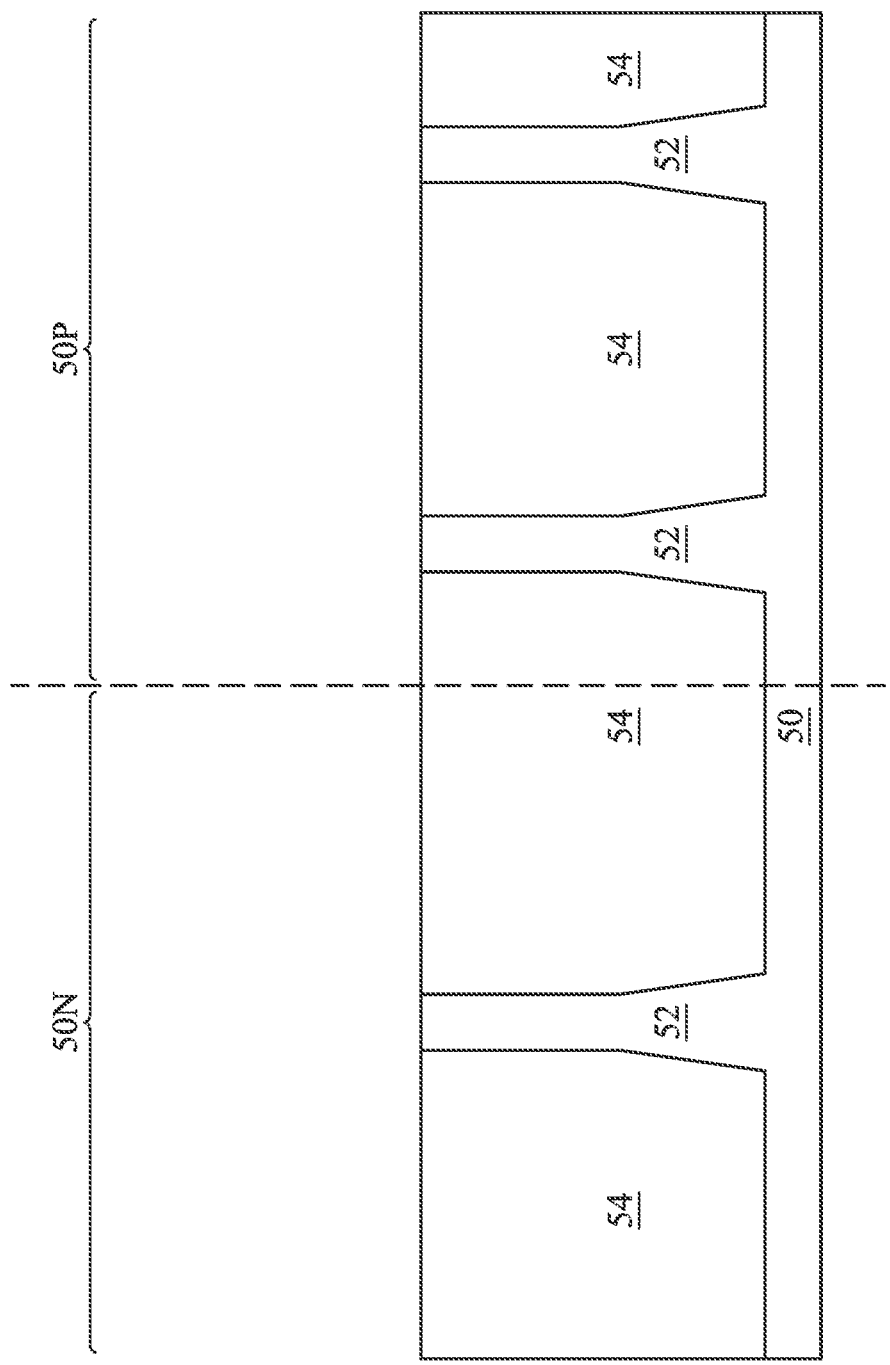

In FIG. 10, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 11:
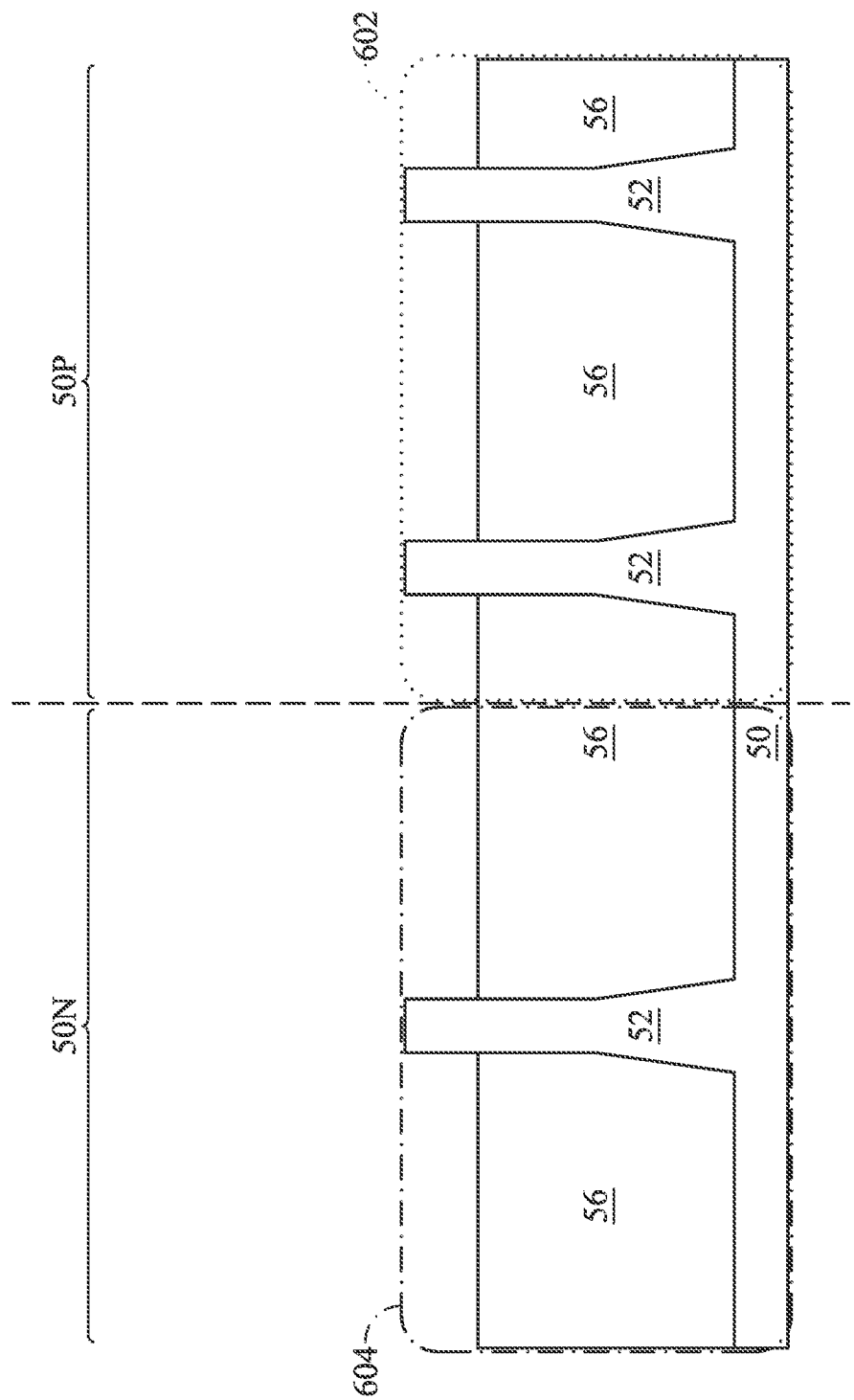

In FIG. 11, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 7 through 11 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 10 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 11, appropriate wells may be formed in the fins 52 and/or the substrate 50. In some embodiments, a P well 604 may be formed in the region 50N, and an N well 602 may be formed in the region 50P. In some embodiments, a P well 604 or an N well 602 are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 12:
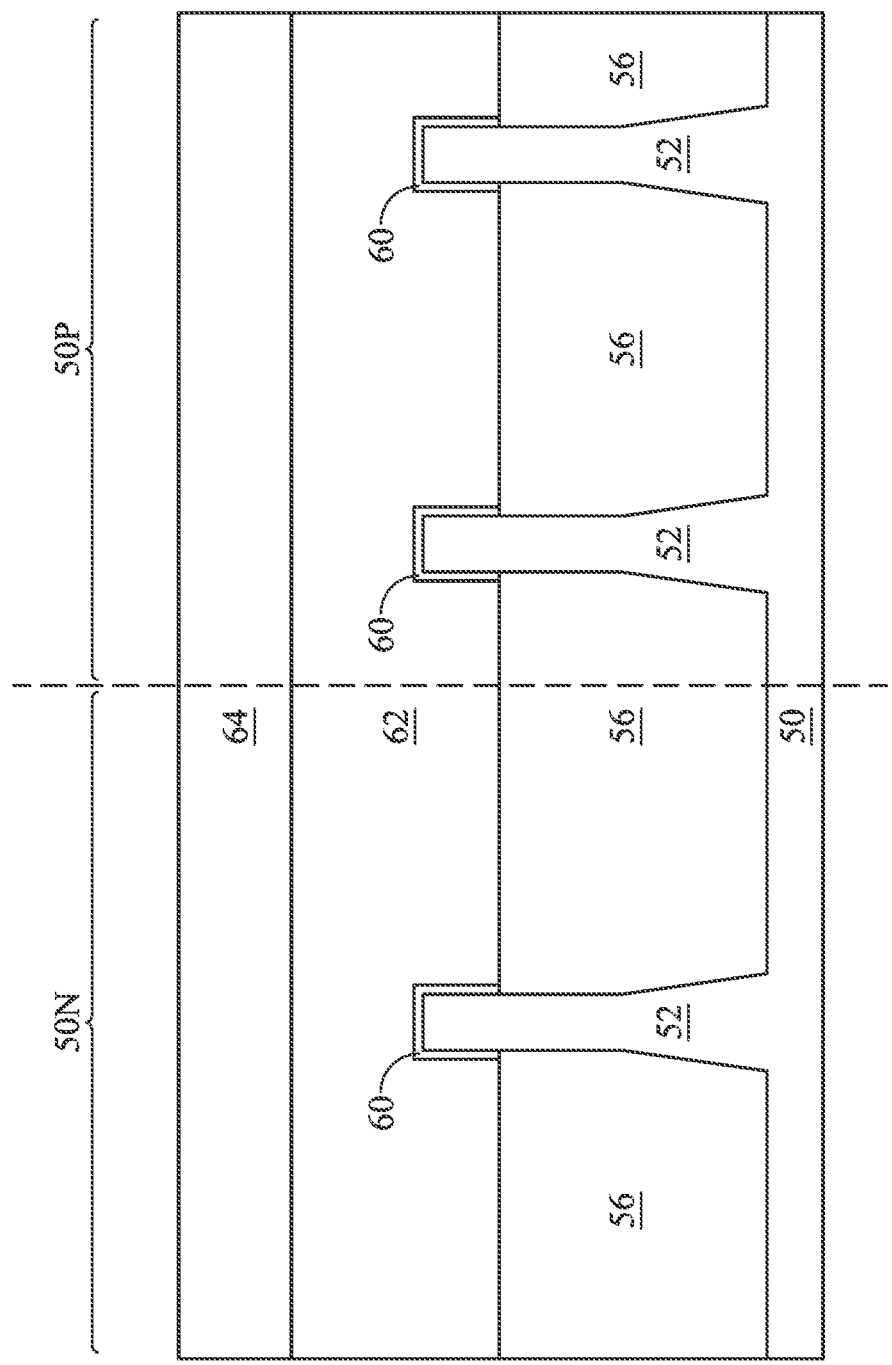

In FIG. 12, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 13A through 28 illustrate various additional steps in the manufacturing of embodiment devices. FIGS. 13A through 18B illustrate features in either of the region 50N and the region 50P. For example, the structures illustrated in FIGS. 13A through 18B may be applicable to both the region 50N and the region 50P. Differences (if any) in the structures of the region 50N and the region 50P are described in the text accompanying each figure.

Figure 13B:
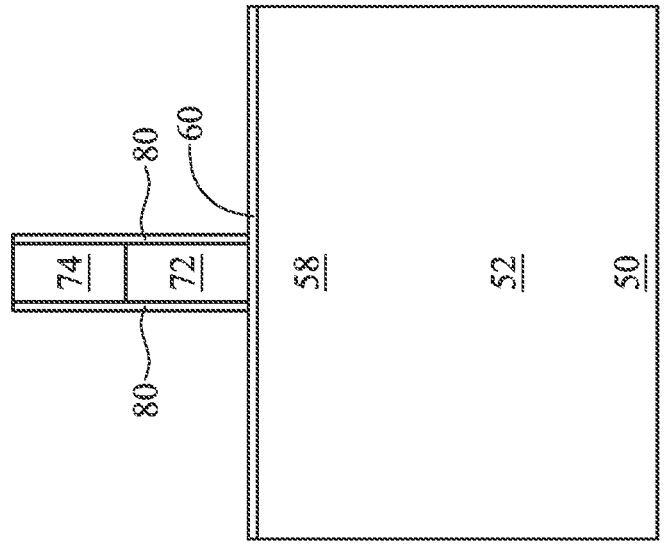
Figure 13A:
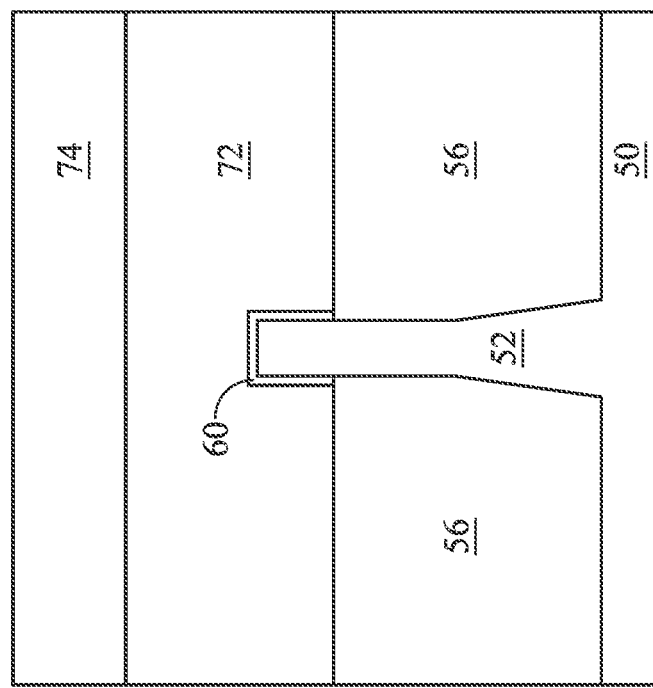

In FIGS. 13A and 13B, the mask layer 64 (see FIG. 12) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 13A and 13B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 11, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 14B:
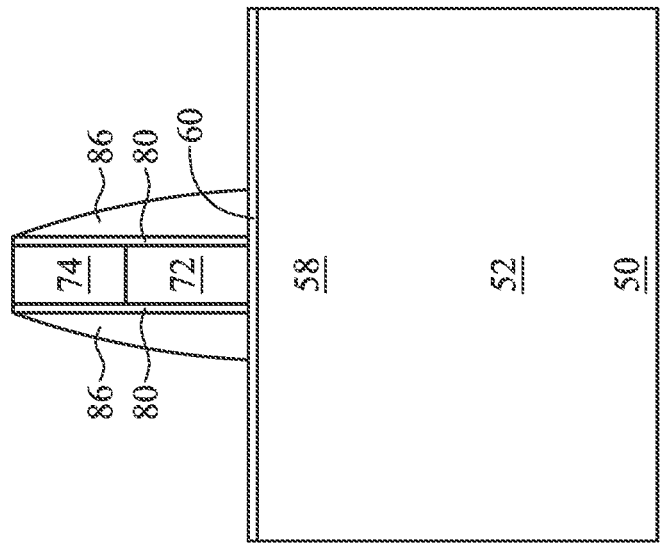
Figure 14A:
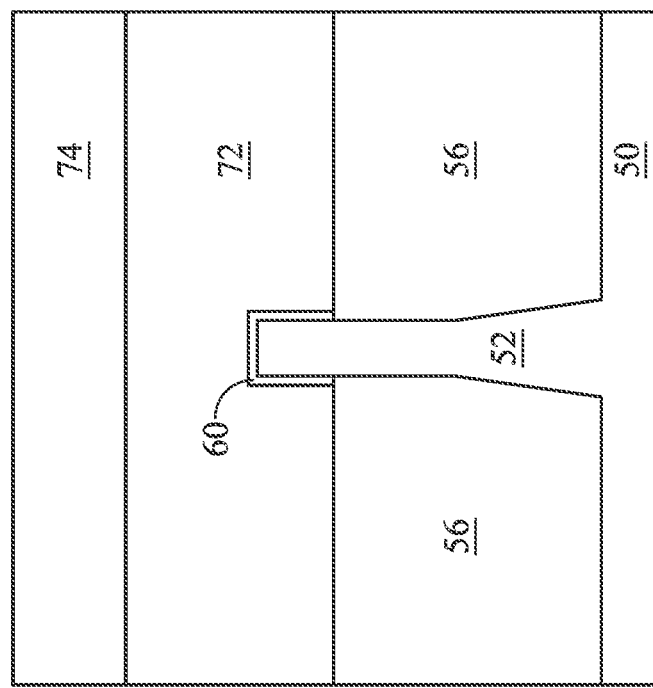

In FIGS. 14A and 14B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 15B:
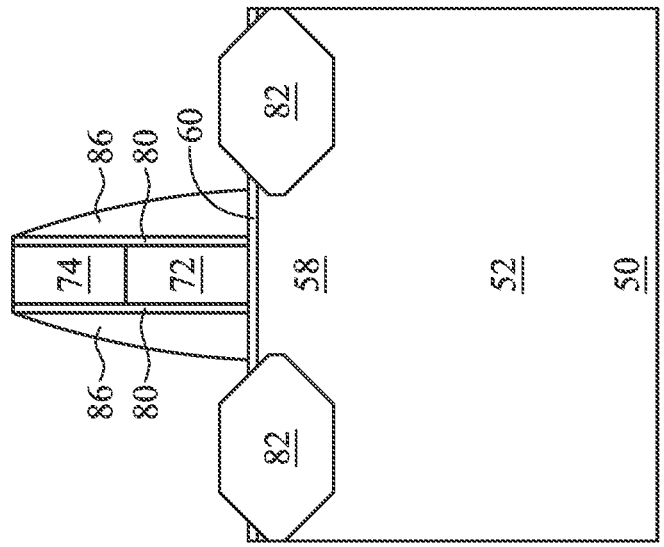
Figure 15A:
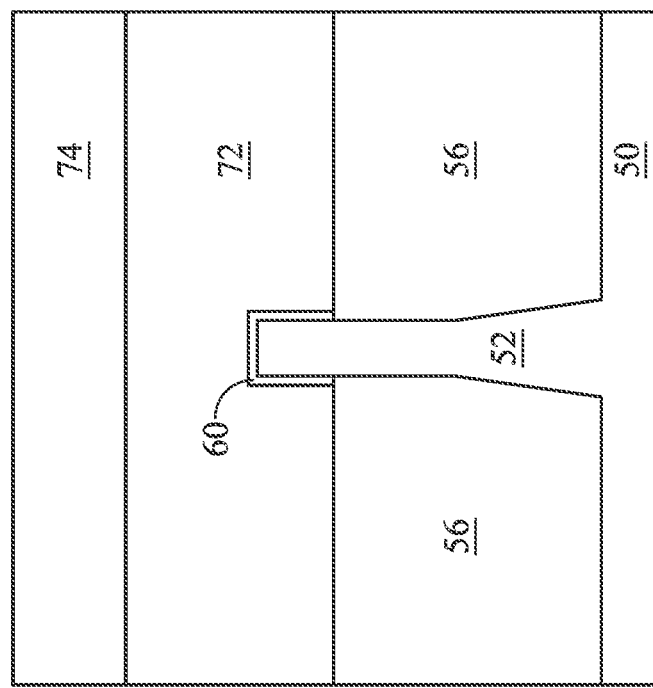
Figure 15D:
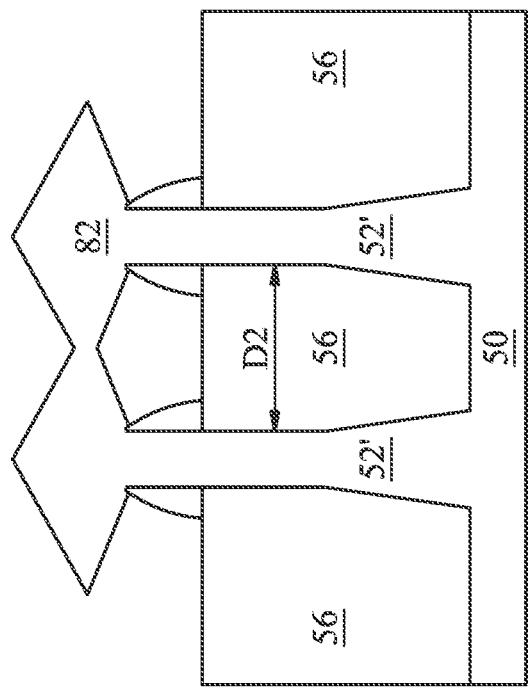
Figure 15C:
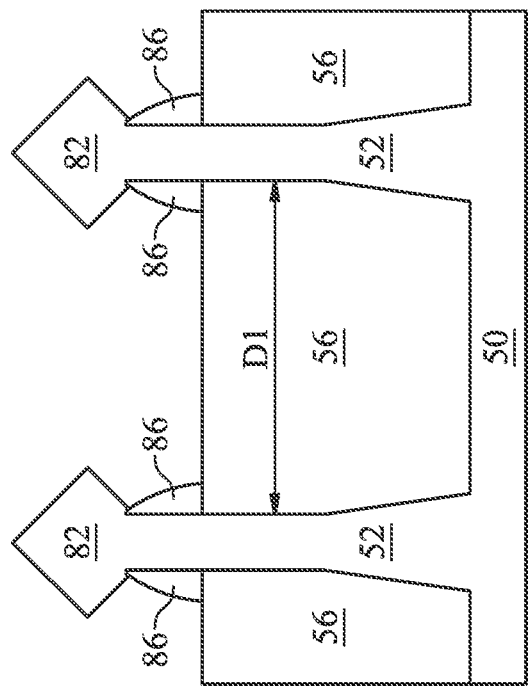

In FIGS. 15A and 15B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, in HD SRAM region 1010 adjacent source/drain regions 82 of adjacent single fin FinFETs comprising fins 52 (e.g., finFETs of HD SRAM cells 10) remain separated after the epitaxy process is completed as illustrated by FIG. 15C. In HC SRAM region 1020, the laterally expanding facets cause adjacent source/drain regions 82 of a multi-fin FinFET comprising fins 52' (e.g., finFETs in HC SRAM cells 20) to merge as illustrated by FIG. 15D. The fins 52' may be separated by a distance D2 in a range of about 10 nm to about 30 nm. In the embodiments illustrated in FIGS. 15C and 15D, gate spacers 86 are formed covering a portion of the sidewalls of the fins 52' or 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 16B:
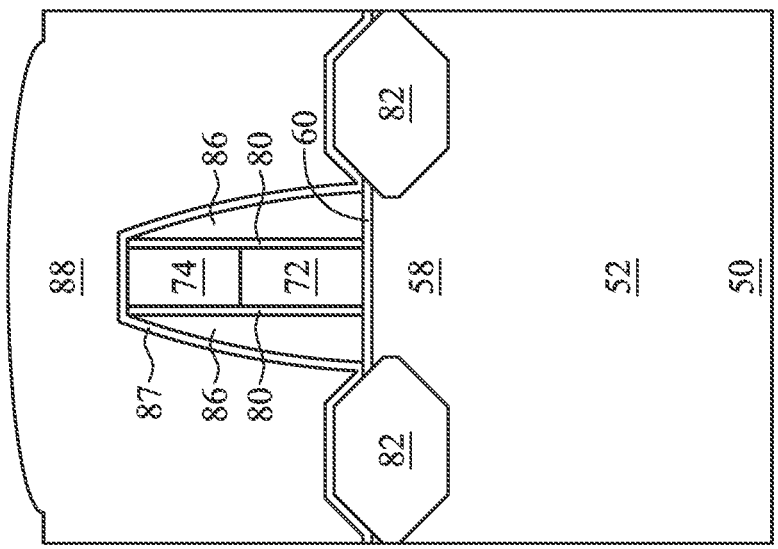
Figure 16A:
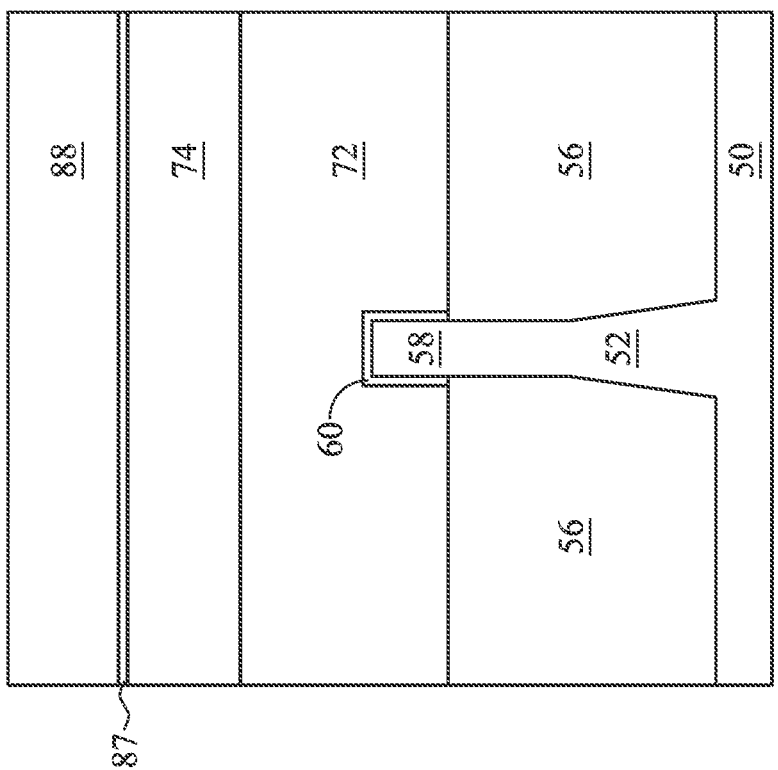

In FIGS. 16A and 16B, a first interlayer dielectric (ILD) 88 is deposited over the structure illustrated in FIGS. 15A and 15B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 17B:
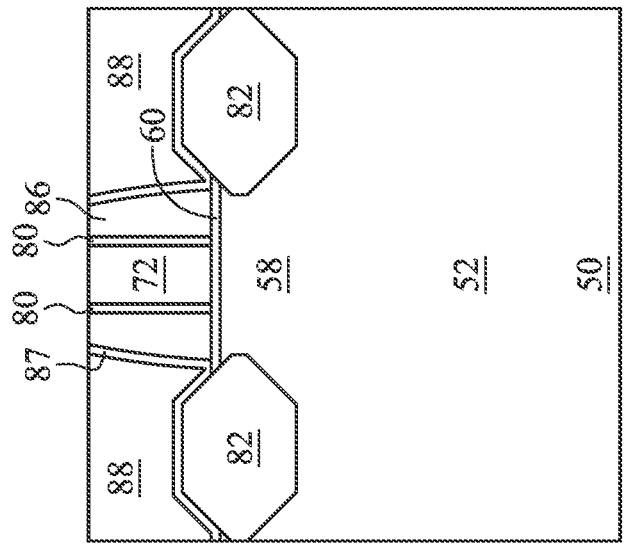
Figure 17A:
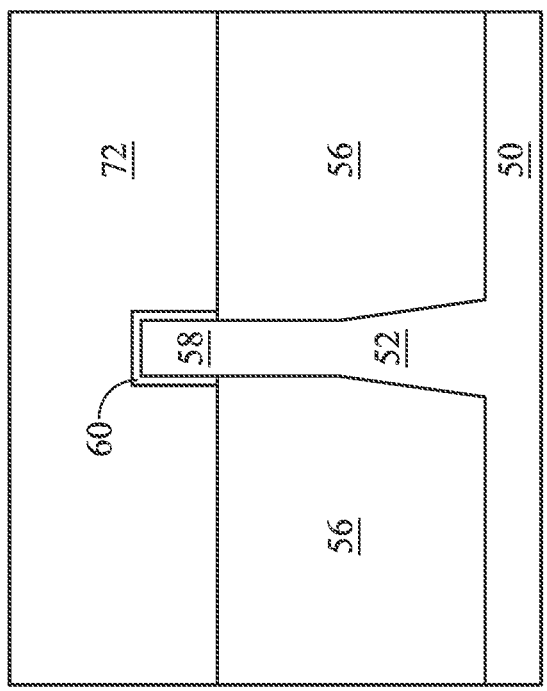

In FIGS. 17A and 17B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 18B:
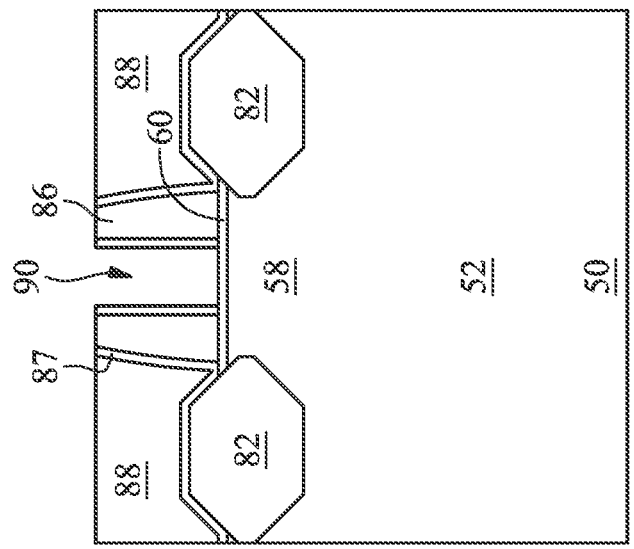
Figure 18A:
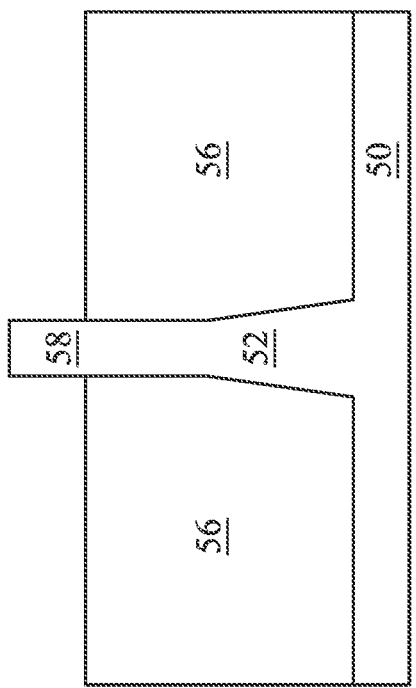

In FIGS. 18A and 18B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 19A:
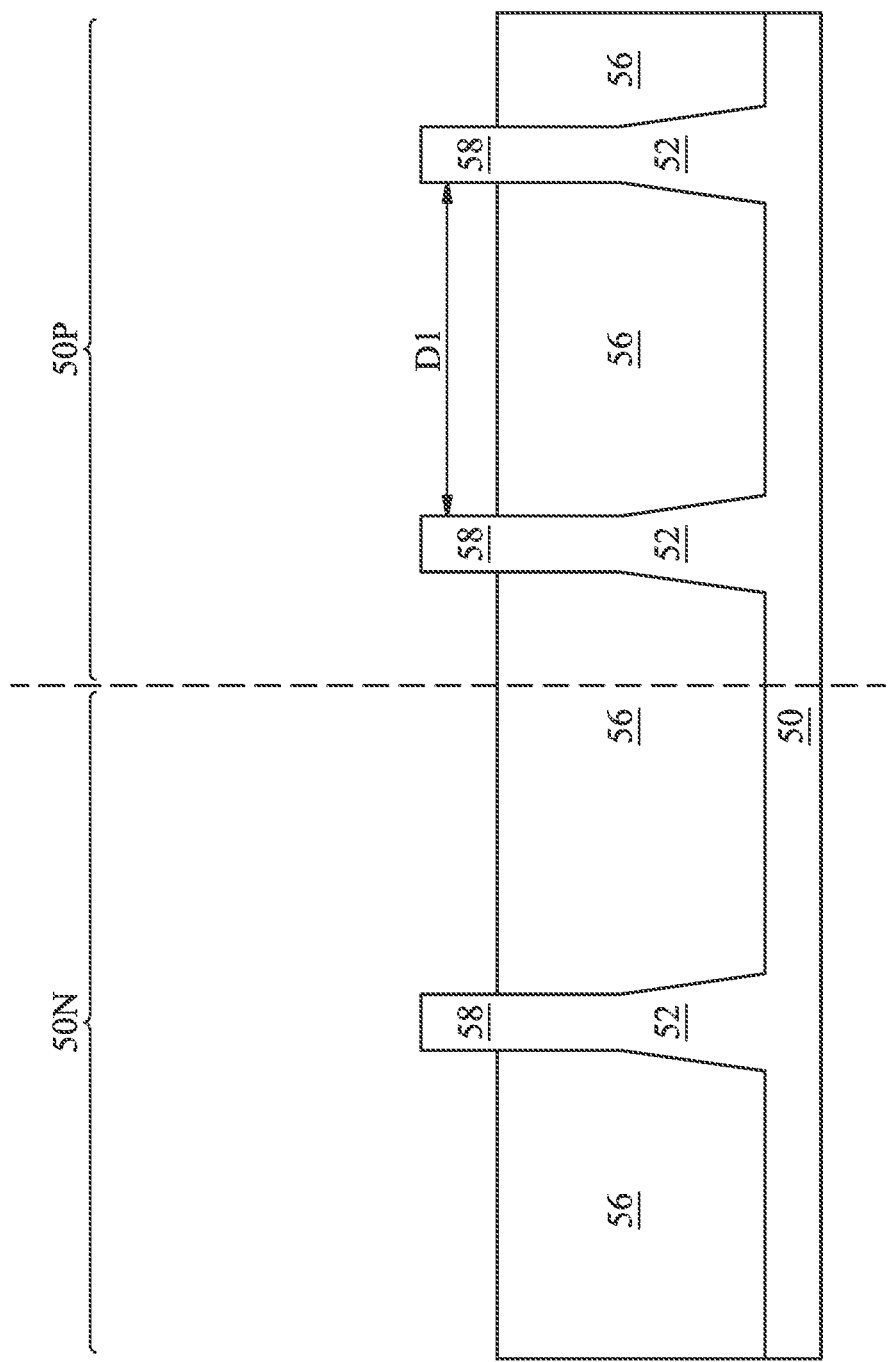
Figure 19B:
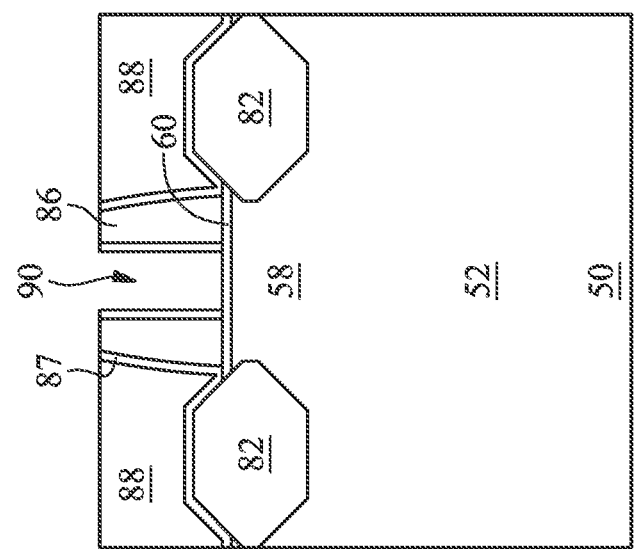

FIGS. 19A, 20A, 21A, 22A, 23A, 24A, 25A, 26A, and 27A are illustrated across regions 50N and 50P, corresponding to cross-section A-A in FIG. 4A. FIG. 19A illustrates the same process step as FIG. 18A except for multiple fins/FinFETs across regions 50N and 50P.

Figure 20A:
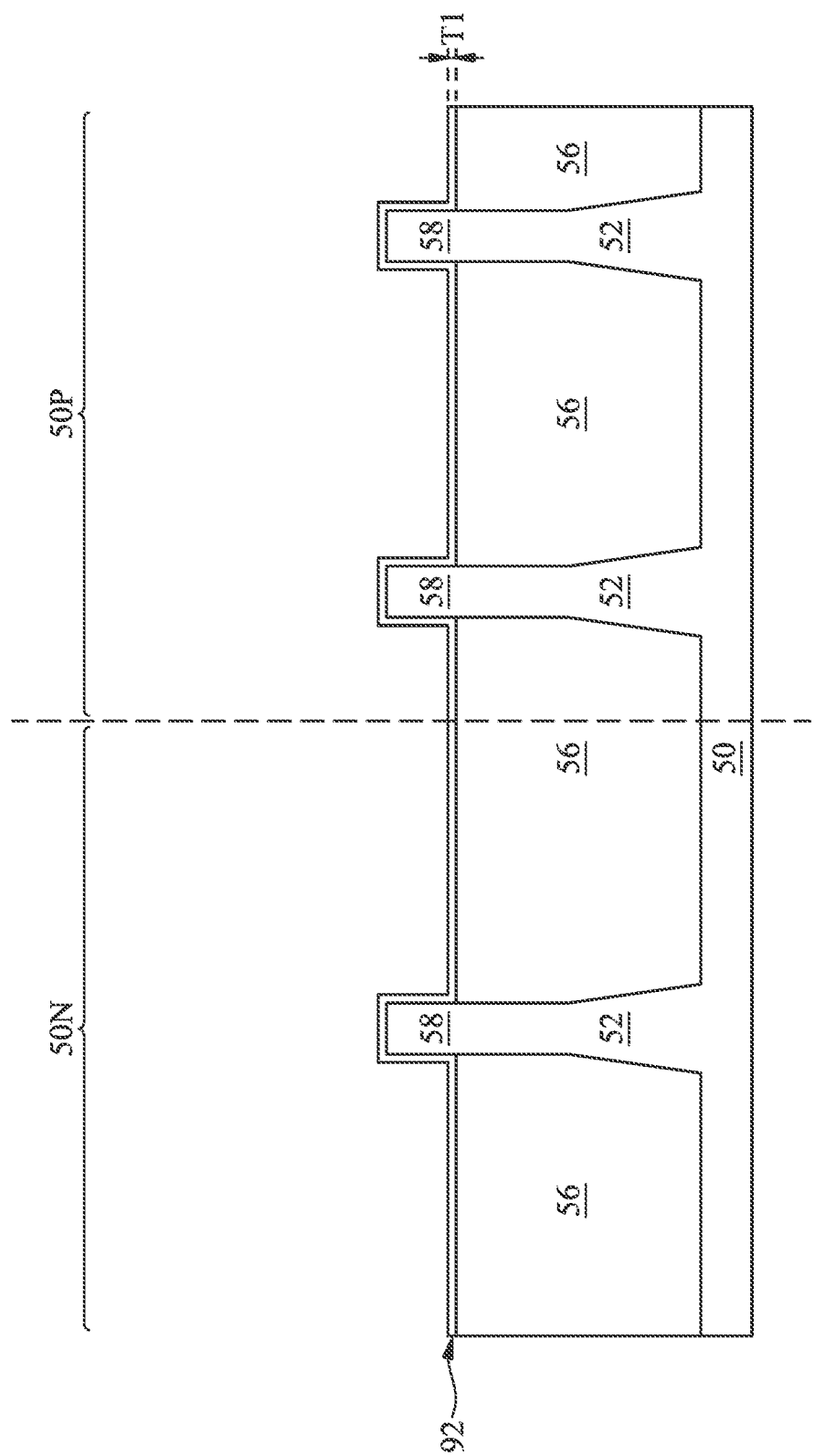
Figure 20B:
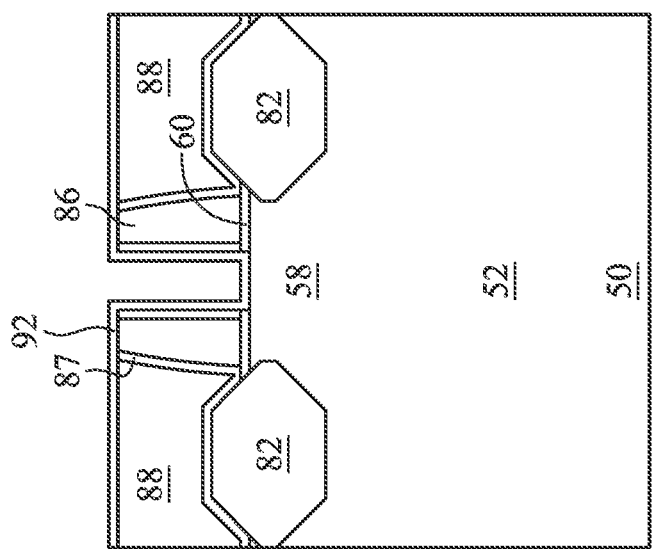

In FIGS. 20A and 20B, gate dielectric layers 92 are formed. One or more gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric comprises multiple layers selected from the group consisting of $SiO_2$, SiOC, SiON, SiOCN, carbon-containing oxide, nitrogen-containing oxide, carbon and nitrogen-containing oxide, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), La doped dielectric, oxide containing multiple metals, or a combination thereof. The formation methods of gate dielectric layers 92 may include molecular-beam deposition (MBD), ALD, PVD, and the like. In embodiments where portions of the dummy gate dielectric 60 remains in the recesses 90, the gate dielectric layers 92 include a material of the dummy gate dielectric 60 (e.g., $SiO_2$).

The gate dielectric layers may be formed to different thicknesses for HD SRAM cell arrays in HD SRAM area 1010 and for HC SRAM cell arrays in HC SRAM area 1020. In some embodiments, the gate dielectric layers 92 formed over fins of the FinFETs in HD SRAM area 1010 have a total thickness T1 of about 0.6 nm to about 3 nm, and the gate dielectric layers 92' (see below, FIG. 28) formed over fins of the FinFETs in HC SRAM area 1020 have a total thickness T4 of about 0.5 nm to about 2.6 nm.

In some embodiments, in order to form the gate dielectric layers 92 and 92' to different thicknesses T1 and T4, HC SRAM area 1020 may be masked while the gate dielectric layers 92 are formed over HD SRAM area 1010, and HD SRAM area 1010 may be masked while the gate dielectric layers 92' are formed over HC SRAM area 1020. Various masking steps may be used to mask and expose appropriate regions when using distinct processes.

In other embodiments, in order to form the gate dielectric layers 92 and 92' to different thicknesses T1 and T4, a first gate dielectric layer is formed over HD SRAM area 1010 and HC SRAM area 1020. The portions of the first gate dielectric layer over HC SRAM area 1020 are then removed using appropriate lithography and etching processes. A second gate dielectric layer is then formed over HD SRAM area 1010 and HC SRAM area 1020. The second gate dielectric layer formed over the remaining portions of the first gate dielectric layer over the HD SRAM area 1010 forms the gate dielectric layer 92 with thickness T1, and the second gate dielectric layer over the HC SRAM area 1020 forms the gate dielectric layer 92' with thickness T4. Various masking steps may be used to mask and expose appropriate regions when using distinct processes.

Thicker gate dielectric layers 92 in HD SRAM cells 10 may enable lower gate leakage to achieve minimal cell standby leakage current (Isoff), and thinner gate dielectric layers 92' in HC SRAM 20 cells may enable higher on current ($I_{on}$) for faster operation, such as speeds of about 1 to about 5 GHz. Thicker gate dielectric layers 92 in the HD SRAM cells 10 may produce a higher threshold voltage ($V_t$), which may reduce sub-threshold leakage current (Isoff). Thinner gate dielectric layers 92' in the HC SRAM cells 20 may produce a lower threshold voltage ($V_t$), which may lead to a higher $I_{on}$ for maximal speed. The difference between thickness T1 and thickness T2 may be in a range of about 1 Å to about 6 Å. The ratio of the total thickness T1 of the gate dielectric layers 92 of SRAM cell 10 to the total thickness T2 of the gate dielectric layers 92' of SRAM cell 20 may be in a range of about 1.05:1 to about 1.2:1.

Figure 21A:
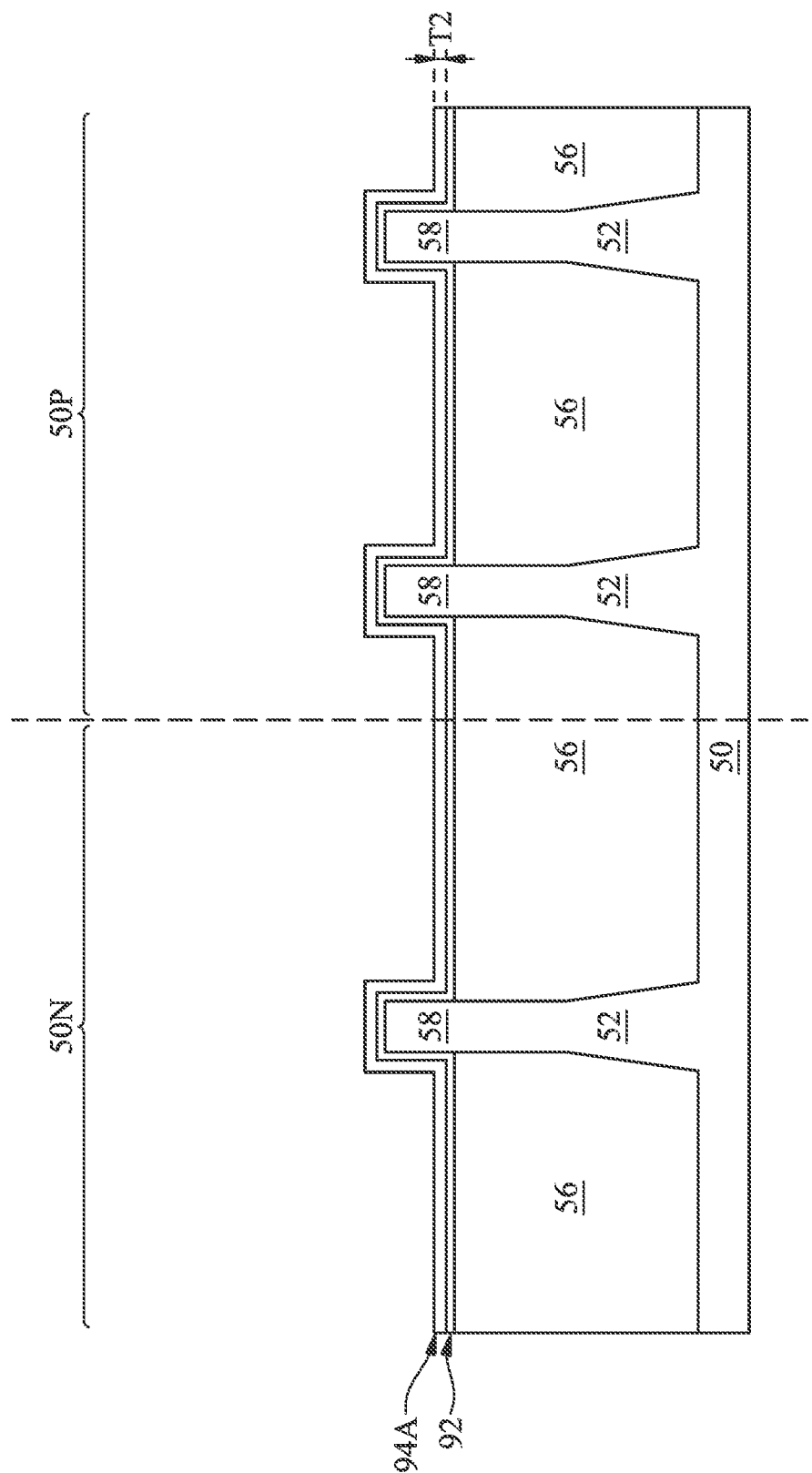
Figure 21B:
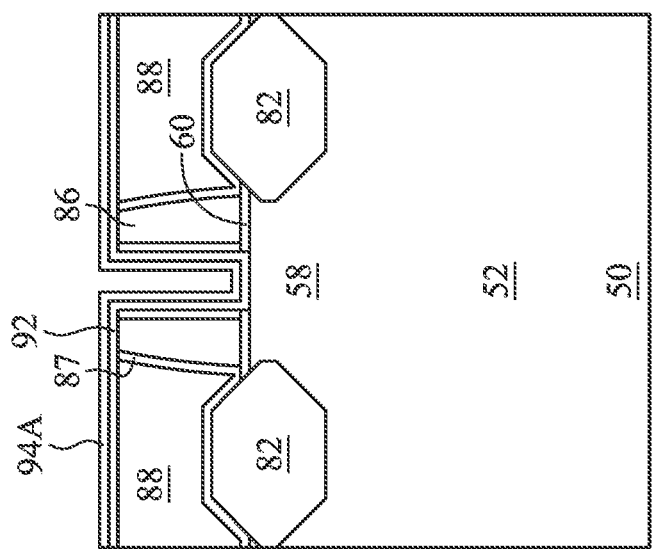

Next, as illustrated in FIGS. 21A and 21B, a first work function metal (WFM) layer 94A is formed over the fins 52. The work function of the gate electrode may be adjusted to the band-edge of silicon or other underlying semiconductor material. For an NMOS device, the work function may be adjusted to close to the conduction band of silicon, and for a PMOS device, the work function may be adjusted to close to the valence band of silicon, to increase the performance of the transistors. In some embodiments, the structure of the metal gate electrodes comprises multiple metal material structures. The metal layers may be selected from the group consisting of TiN, TaN, TiAl, TiAlN, TaAl, TaAlN, TaAlC, Al, W, Cu, Co, Ni, Pt, and/or a combination thereof. In some embodiments, the first work function metal (WFM) layer 94A comprises a layer of TiAl disposed upon a layer of TiN, tungsten-nitride-carbon (WN—C), or the like. The first WFM layer 94A may be formed through deposition, such as a conformal deposition method such as ALD, CVD, PVD, or the like. The thickness T2 of the first WFM layer 94A may be in a range of about 1 nm to about 10 nm.

The WFM layers may be formed to different thicknesses for HD SRAM cell arrays in HD SRAM area 1010 and for HC SRAM cell arrays in HC SRAM area 1020. A second work function metal (WFM) layer 94A' is over the fins 52' in the region 50N of the HC SRAM area 1020 (illustrated below in FIG. 28). The second WFM layer 94A' may be formed by a substantially similar process as the first WFM layer 94A. In order to form the first WFM layer 94A and the second WFM layer 94A' to different thicknesses, HC SRAM area 1020 may be masked while the first WFM layer 94A is formed over HD SRAM area 1010, and HD SRAM area 1010 may be masked while the second WFM layer 94A' is formed over HC SRAM area 1020. Various masking steps may be used to mask and expose appropriate regions when using distinct processes.

The metal layers may be selected from the group consisting of TiN, TaN, TiAl, TiAlN, TaAl, TaAlN, TaAlC, Al, W, Cu, Co, Ni, Pt, and/or a combination thereof. In some embodiments, the second WFM layer 94A' comprises a single layer of TiAl. In other embodiments, the second WFM layer 94A' comprises multiple layers, such as a layer of TiAl disposed upon a layer of TiN, tungsten-nitride-carbon (WN—C), or the like. In some embodiments, the first WFM layer 94A has a thicker TiN layer and/or a thicker tungsten-nitride-carbon (WN—C) layer than the second WFM layer 94A'. In some embodiments, the TiN layer and/or the WN—C layer is a diffusion barrier layer, which reduces diffusion of an n-type metal (e.g., aluminum) into the underlying layer(s). Because the second WFM layer 94A' has a thinner diffusion barrier layer than the first WFM layer 94A, increased diffusion of the n-type metal (e.g., aluminum from the layer of TiAl) into the underlying TiN layer or the underlying barrier metal layer 94B can be achieved, which may allow HC SRAM cells 20 to have a lower $V_t$ and perform at higher speeds.

The thickness T5 of the second WFM layer 94A' may be in a range of about 1 nm to about 10 nm. The thickness T5 of the second WFM layer 94A' of SRAM cell 20 may be less than the thickness T2 of the first WFM layer 94A of SRAM cell 10. The difference between thickness T5 and thickness T2 may be in a range of about 0.5 nm to about 10 nm. The ratio of the thickness T5 to the thickness T2 may be in a range of about 1:1.1 to about 1:4. The second WFM layer 94A' having a thinner thickness T5 than the thickness T2 of the first WFM layer 94A may produce a lower $V_t$ for the multiple fin FinFETs 706B (see FIG. 4A above) of the HC SRAM region 1020 relative to the $V_t$ of the single fin FinFETs 606B (see FIG. 5A above) of the HD SRAM region 1010. This may result in higher speed in the HC SRAM cells 20 relative to the HD SRAM cells 10 and in lower leakage current in the HD SRAM cells 10 relative to the HC SRAM cells 20.

Figure 22A:
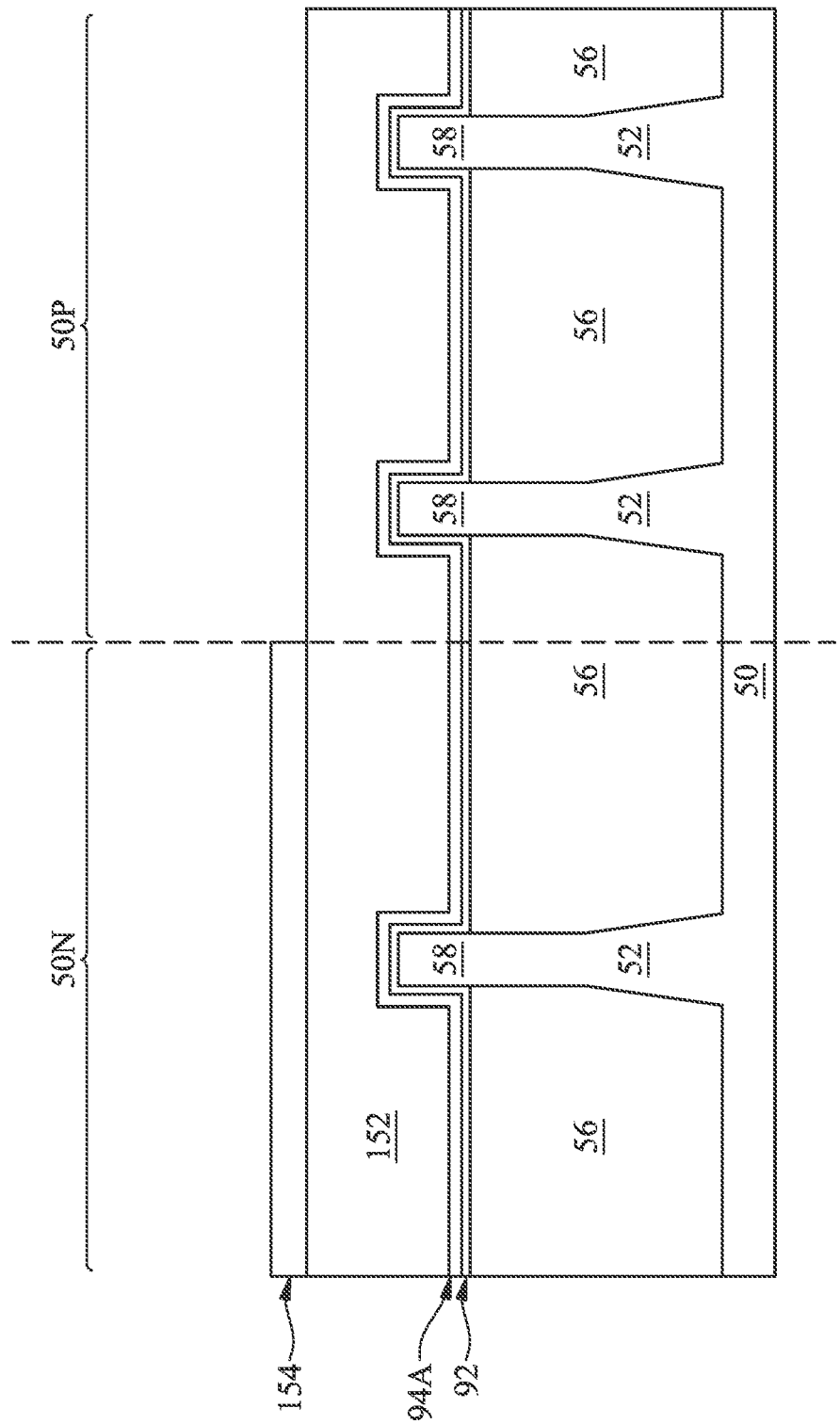
Figure 22B:
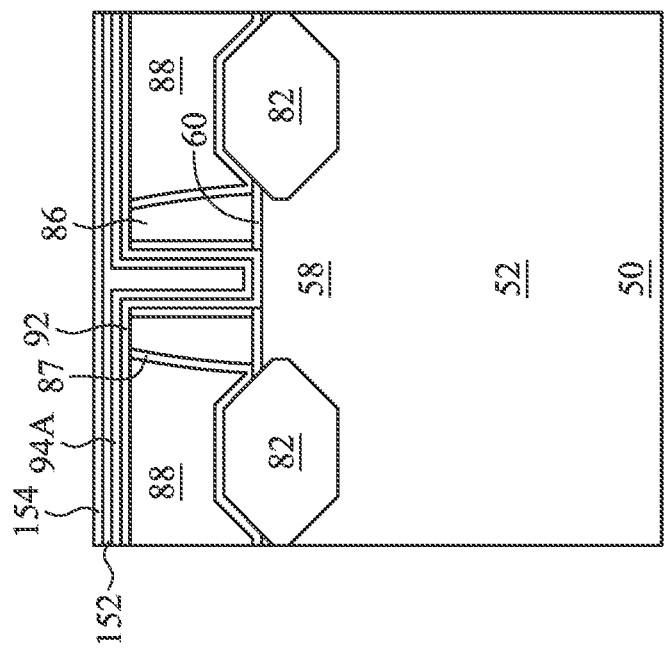

FIGS. 22A and 22B illustrate the formation of a first sacrificial layer 152 and a first patterned mask 154 to subsequently pattern the first WFM layer 94A in accordance with some embodiments. The first sacrificial layer 152 may be formed of a bottom antireflective coating (BARC) over the first WFM layer 94A. Generally, during photolithography patterning, light may be reflected off the surface of the underlying material and back into the photoresist material during the exposure process, wherein the reflected light may alter the intended pattern of the photoresist. A BARC layer formed of a material having the appropriate refractive index n to limit or prevent reflection of the exposing light back into the photoresist material. In some embodiments, the first sacrificial layer 152 may be formed of, for example, a dielectric, an organic material, or the like, and may be formed by, for example, spin coating, PECVD, CVD, or the like. Additionally, the first patterned mask 154 may be formed over the first sacrificial layer 152. In some embodiments, the first patterned mask 154 may be a photoresist exposed and developed to form the pattern as illustrated in FIG. 22A. Additional masks, such as a silicon oxide, silicon nitride, combinations thereof, or the like may be used in addition to, or instead of, the photoresist mask to provide additional protections during etching. In some embodiments, the first patterned mask 154 covers the region 50N and exposes a top surface of the first sacrificial layer 152 over the region 50P. In other embodiments, the first patterned mask 154 covers the region 50P and exposes a top surface of the first sacrificial layer 152 over the region 50N.

Figure 23A:
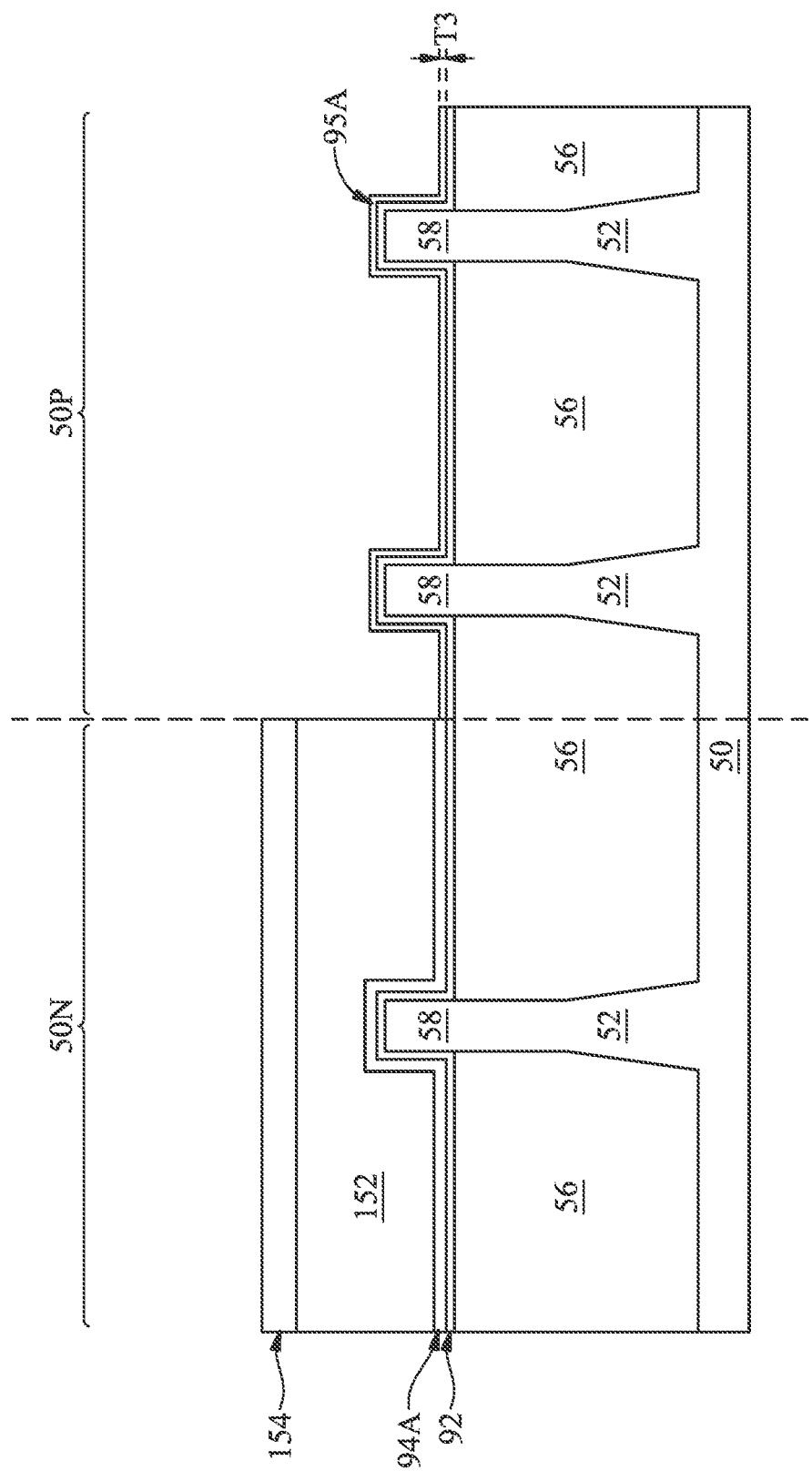
Figure 23B:
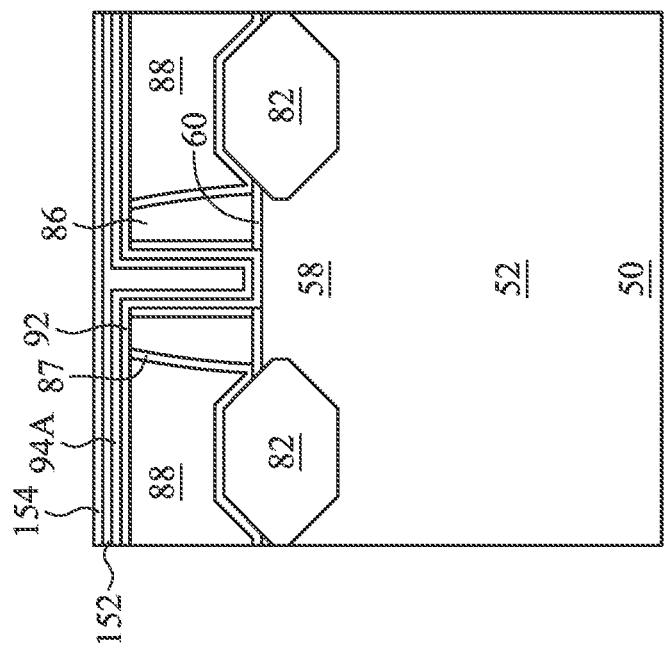

Next, as shown in FIGS. 23A and 23B, the first patterned mask 154 is used as an etching mask to pattern the first sacrificial layer 152 and the first work function metal (WFM) layer 94A (e.g., to remove the first WFM layer 94A from the region 50P). In embodiments in which the first sacrificial layer 154 is formed of bottom antireflective coating (BARC), the first sacrificial layer 154 may be etched using a dry etch process, or other suitable etching processes, may be used. In the case dry etching is used, the process gas may include $N_2$, $O_2$, $CH_4$, $CF_4$, $CHF_3$, $NF_3$, $SF_6$, $Br_2$, $HBr$, $Cl_2$, or combinations thereof. Diluting gases such as $N_2$, $O_2$, or Ar may optionally be used. Thereafter, a wet etch process, or other suitable etching processes, may be used to pattern the underlying first WFM layer 94A. For example, in embodiments in which the first WFM layer 94A comprises TiN, a wet etching process using $NH_4OH+H_2O_2+H_2O$ (ammonia-peroxide mixture (APM)), and/or the like, may be used. Other processes and materials may be used.

Still referring to FIG. 23A, a third WFM layer 95A is formed in the region 50P over the fins 52. In some embodiments, the third WFM layer 95A is formed by removing a top portion of the first WFM layer 94A by a suitable etching process, such as by a wet etching process. The remaining portion of the first WFM layer 94A in the region 50N becomes the third WFM layer 95A. In other embodiments, the first WFM layer 94A in the region 50P is removed and replaced with another WFM layer deposited over the fins 52 in the region 50P. The thickness T3 of the third WFM layer 95A may be in a range of about 1 nm to about 10 nm.

The WFM layers may be formed to different thicknesses for HD SRAM cell arrays in HD SRAM area 1010 and for HC SRAM cell arrays in HC SRAM area 1020. A fourth work function metal (WFM) layer 95A' is over the fins 52 in the region 50P of the HC SRAM area 1020 (illustrated below in FIG. 28). The fourth WFM layer 95A' may be formed by a substantially similar process as the third WFM layer 95A as described above with respect to FIGS. 21A through 24B. In order to form the third WFM layer 95A and the fourth WFM layers 95A' to different thicknesses, HC SRAM area 1020 may be masked while the third WFM layer 95A is formed over HD SRAM area 1010, and HD SRAM area 1010 may be masked while the fourth WFM layer 95A' is formed over HC SRAM area 1020. Various masking steps may be used to mask and expose appropriate regions when using distinct processes.

The metal layers may be selected from the group consisting of TiN, TaN, TiAl, TiAlN, TaAl, TaAlN, TaAlC, Al, W, Cu, Co, Ni, Pt, and/or a combination thereof. The thickness T6 of the fourth WFM layer 95A' may be in a range of about 1 nm to about 10 nm. The thickness T3 of the third WFM layer 95A of SRAM cell 10 may be less than the thickness T6 of the fourth WFM layer 95A' of SRAM cell 20. The thickness T3 of the third WFM layer 95A of SRAM cell 10 being less than the thickness T6 of the fourth WFM layer 95A' of SRAM cell 20 may allow more n-type dopant (e.g., aluminum) to diffuse into bottom portions of the third WFM layer 95A that may be close to the gate dielectric 92.

In PMOSFETs such as pick-up (PU) devices of the HD SRAM cell 10, the increased n-type dopant diffused into bottom portions of the third WFM layer 95A may result in higher $V_t$ in the PMOSFETS, leading to reduction in PU device leakage.

Figure 24A:
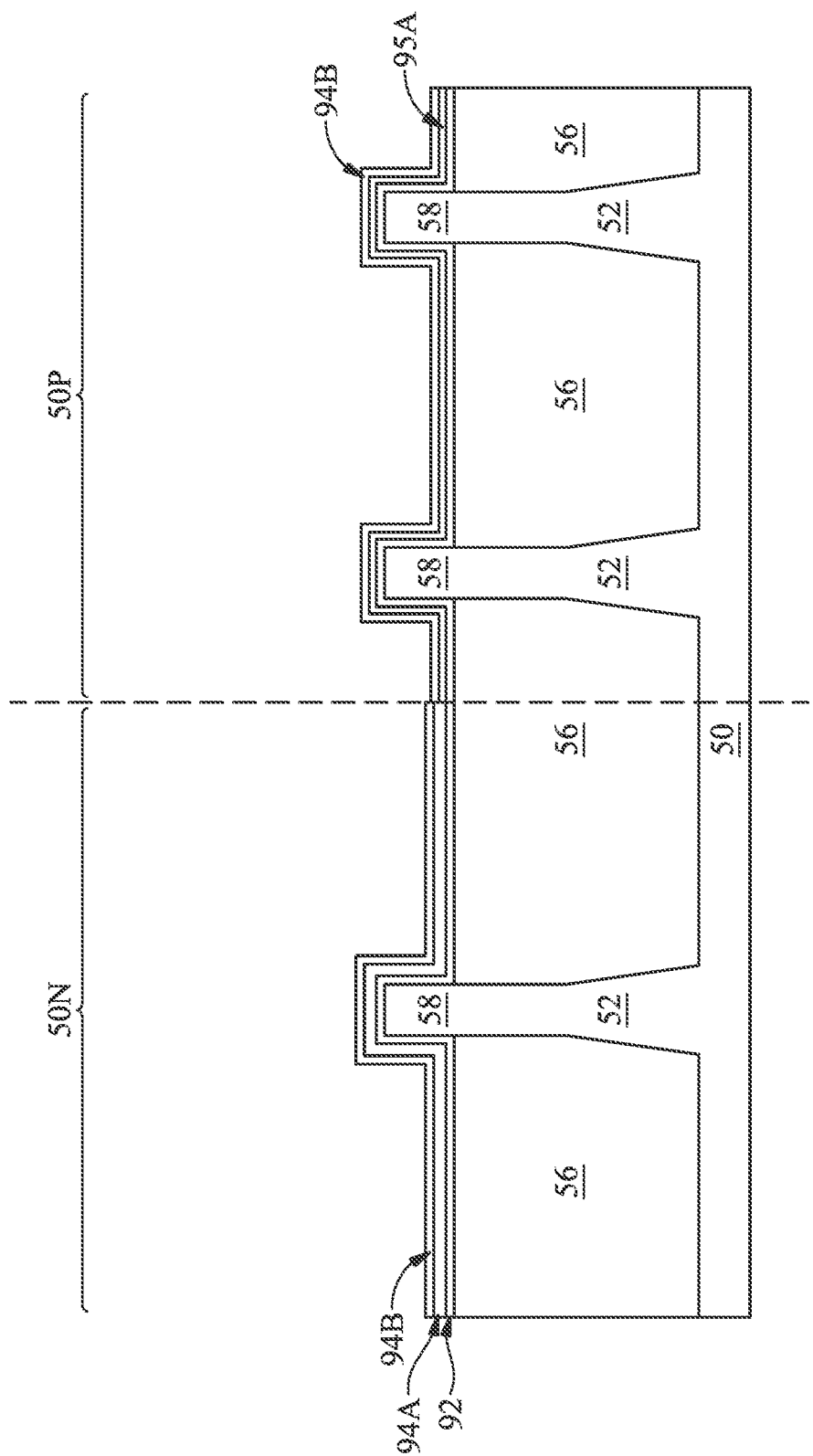
Figure 24B:
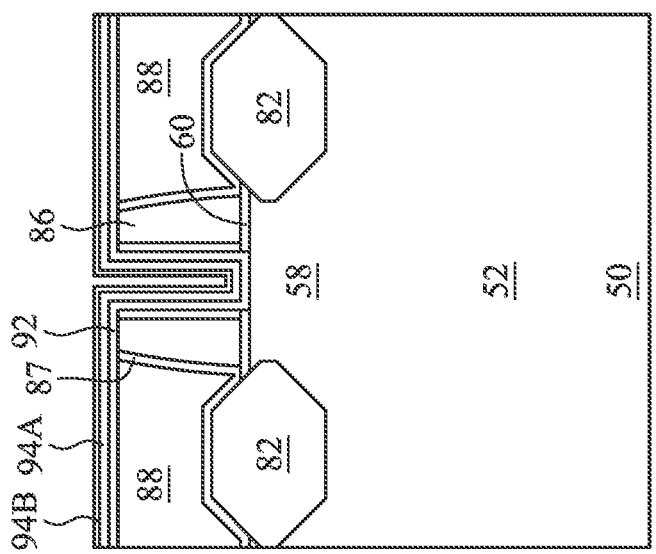

FIGS. 24A and 24B illustrate the removal of the first patterned mask 154 and the first sacrificial layer 152. In some embodiments in which the first patterned mask 154 is formed of a patterned photoresist, the first patterned mask 154 may be removed using an ashing process in an ambient of $N_2$, $H_2$, $O_2$ and a temperature of about 150° C. to about 350° C. In some embodiments in which the first sacrificial layer 152 is formed of bottom antireflective coating (BARC), the first sacrificial layer 152 may be removed using, for example, an ashing process in an ambient of $N_2$, $H_2$, $O_2$ and a temperature of about 150° C. to about 350° C.

Still referring to FIGS. 24A and 24B, a barrier metal layer 94B is formed over the first WFM layer 94A and the third WFM layer 95A. The barrier metal layer 94B comprises TiN, TaN, WCN, and/or a combination thereof. In some embodiments, the barrier metal layer 94B is formed through deposition, such PVD, ALD, or CVD. The barrier metal layer 94B may have a thickness in a range of about 0.5 nm to about 3 nm.

Figure 25A:
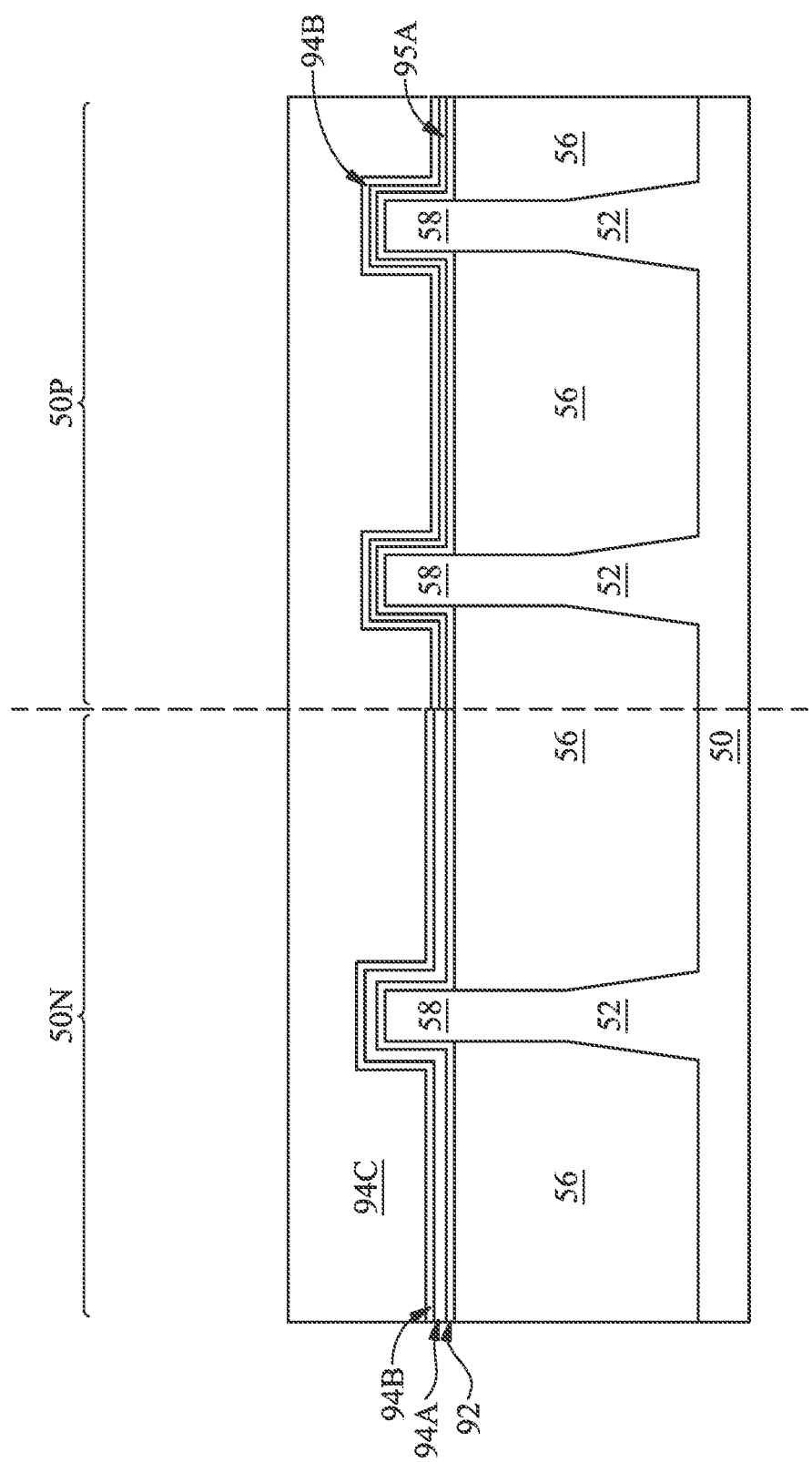
Figure 25B:
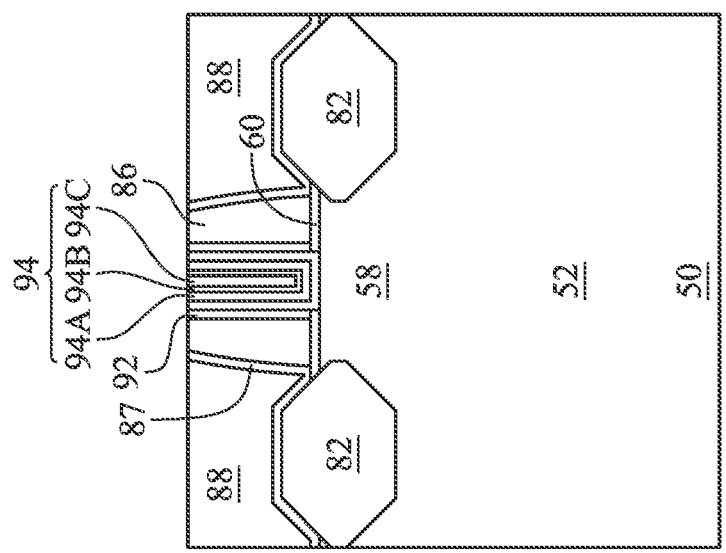

FIGS. 25A and 25B illustrates a fill material 94C formed over the barrier metal layer 94B, filling remaining portions of the recess 90. The first WFM layer 94A, the third WFM layer 95A, the barrier metal layer 94B, and the fill material 94C together may form a metal gate electrode 94 such as, e.g., metal gate electrode 608A as illustrated in FIG. 4A. In some embodiments, the fill material 94C comprises multiple material structures selected from the group consisting of polysilicon gates/SiON structure, metals/high-K dielectric structure, Al/refractory metals/high-K dielectric structure, silicide/high-K dielectric structure, and/or a combination thereof. In some embodiments, the structure of the fill material 94C comprises multiple metal material structures. The metal layers are selected from the group consisting of TiN, TaN, TiAl, TiAlN, TaAl, TaAlN, TaAlC, Al, W, Cu, Co, Ni, Pt, and/or a combination thereof.

After the filling of the recesses 90, excess portions of the gate dielectric layer 92, the first WFM layer 94A, the third WFM layer 95A, the barrier metal layer 94B, the fill material 94C, and the ILD 88 may be removed. The removal may be performed by a planarization process, such as a CMP. The remaining portions of material of the fill material 94C, the barrier metal layer 94B, the first WFM layer 94A, the third WFM layer 95A, and the gate dielectric layer 92 thus form replacement gates of the resulting FinFETs. A top layer over the metal gate electrode 94 may comprise a nitride layer or a high-K dielectric layer.

Figure 26A:
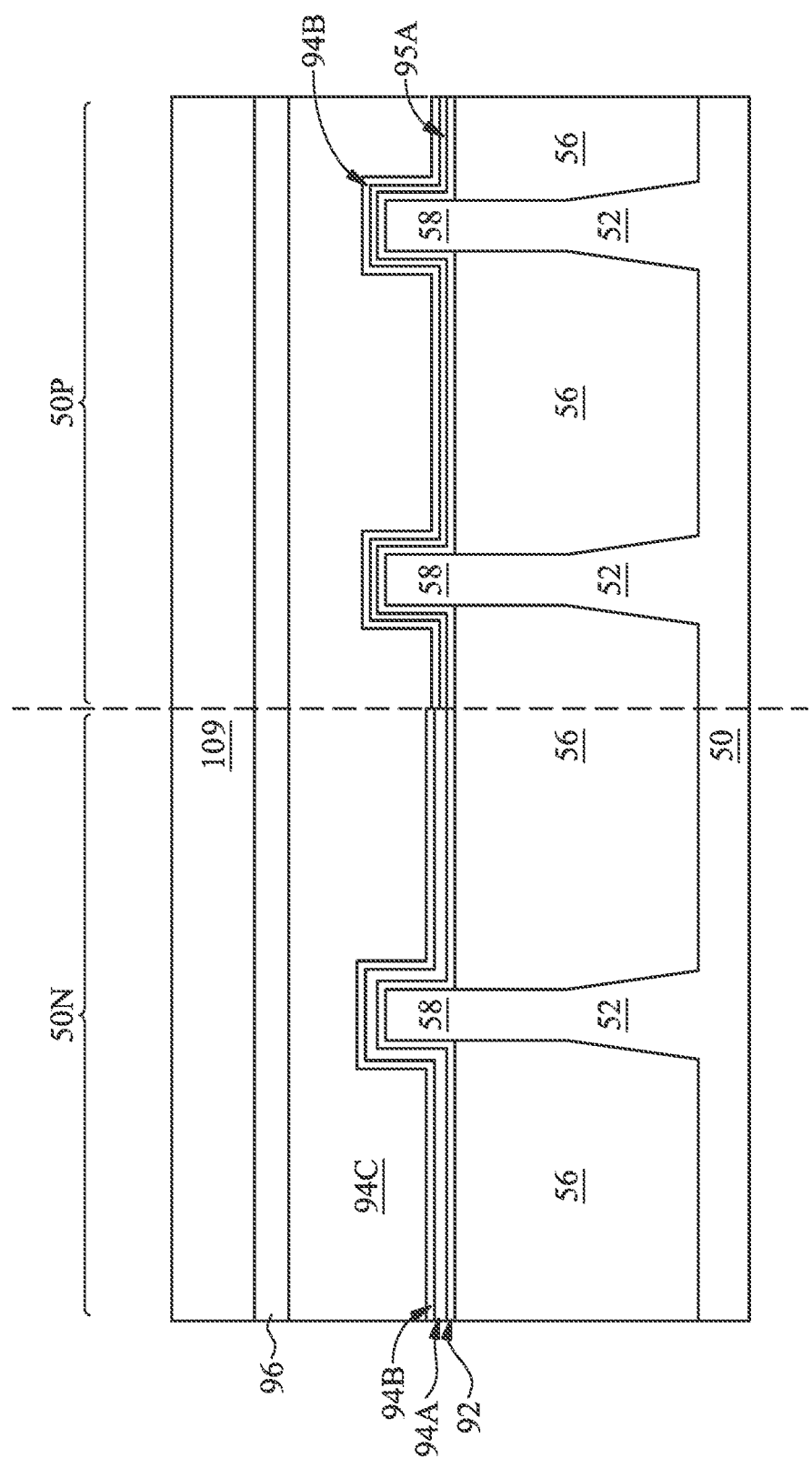
Figure 26B:
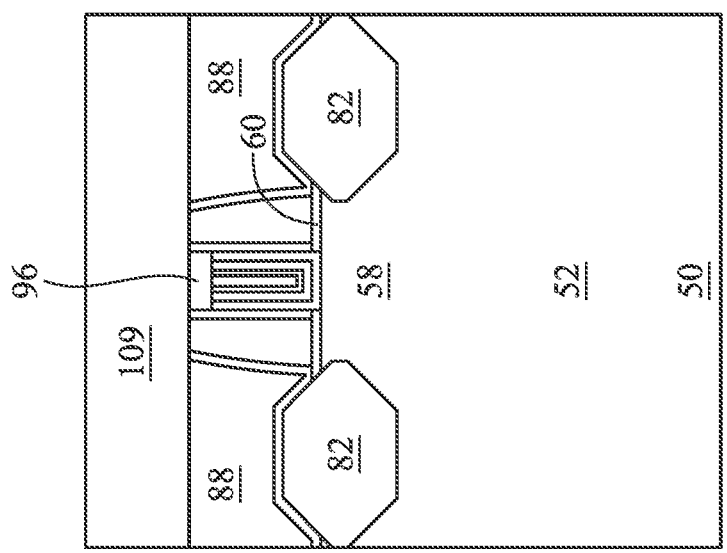

In FIGS. 26A and 26B, a second ILD 109 is deposited over the first ILD 88. In some embodiment, the second ILD 109 is a flowable film formed by a flowable CVD method. In some embodiments, the second ILD 109 is formed of a dielectric material such as PSG, BSG, BPSG, USG, or the like, and may be deposited by any suitable method, such as CVD and PECVD. In accordance with some embodiments, before the formation of the second ILD 109, the gate stack (including a gate dielectric layer 92 and a corresponding overlying gate electrode 94) is recessed, so that a recess is formed directly over the gate stack and between opposing portions of gate spacers 86, as illustrated in FIGS. 26A and 26B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts in (FIGS. 27A and 27B) penetrate through the gate mask 96 to contact the top surface of the recessed gate electrode 94.

Figure 27A:
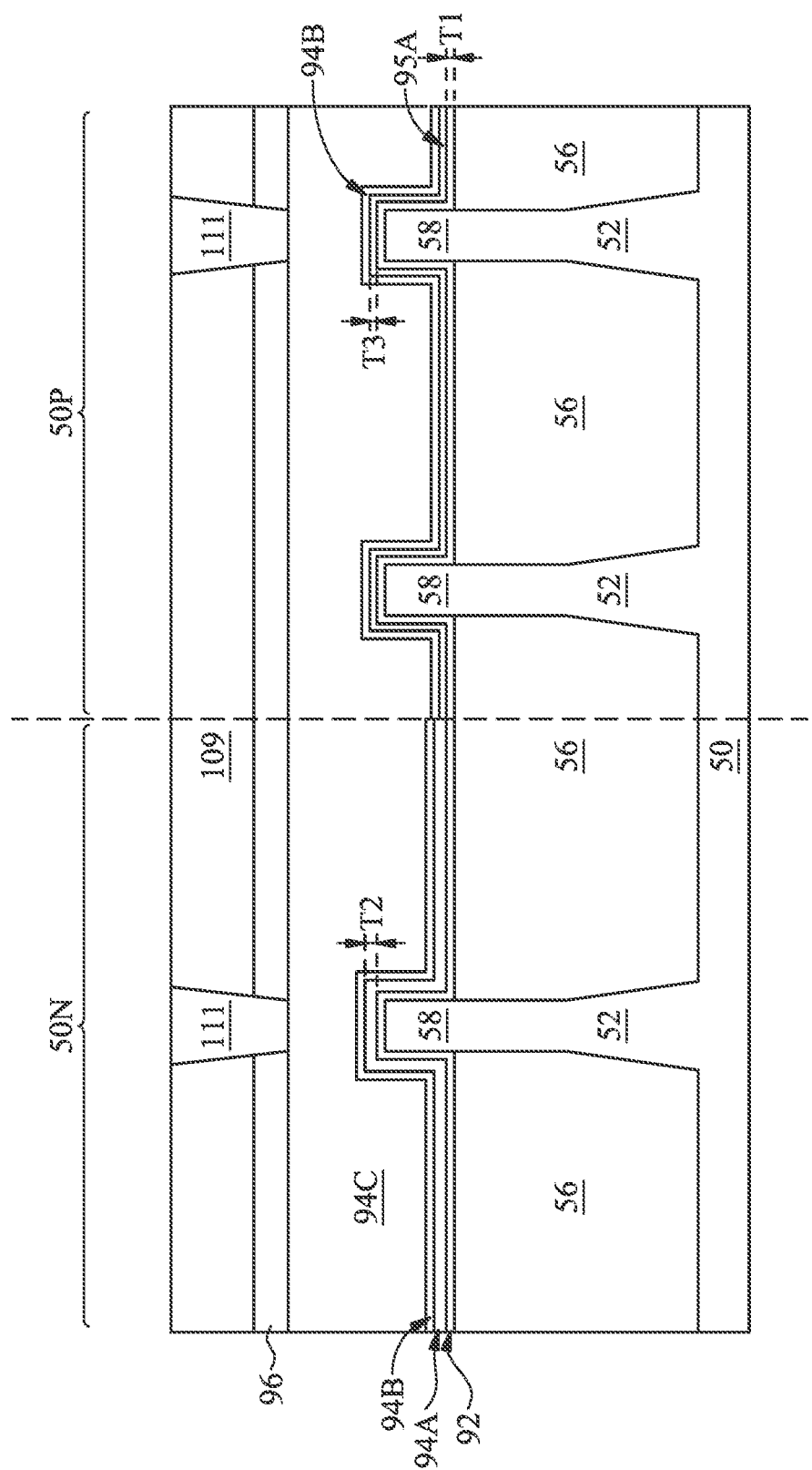
Figure 27B:
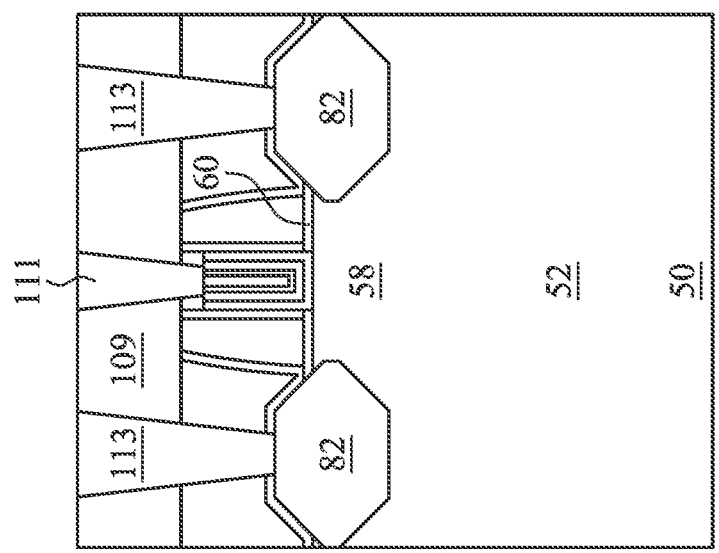
Figure 28:
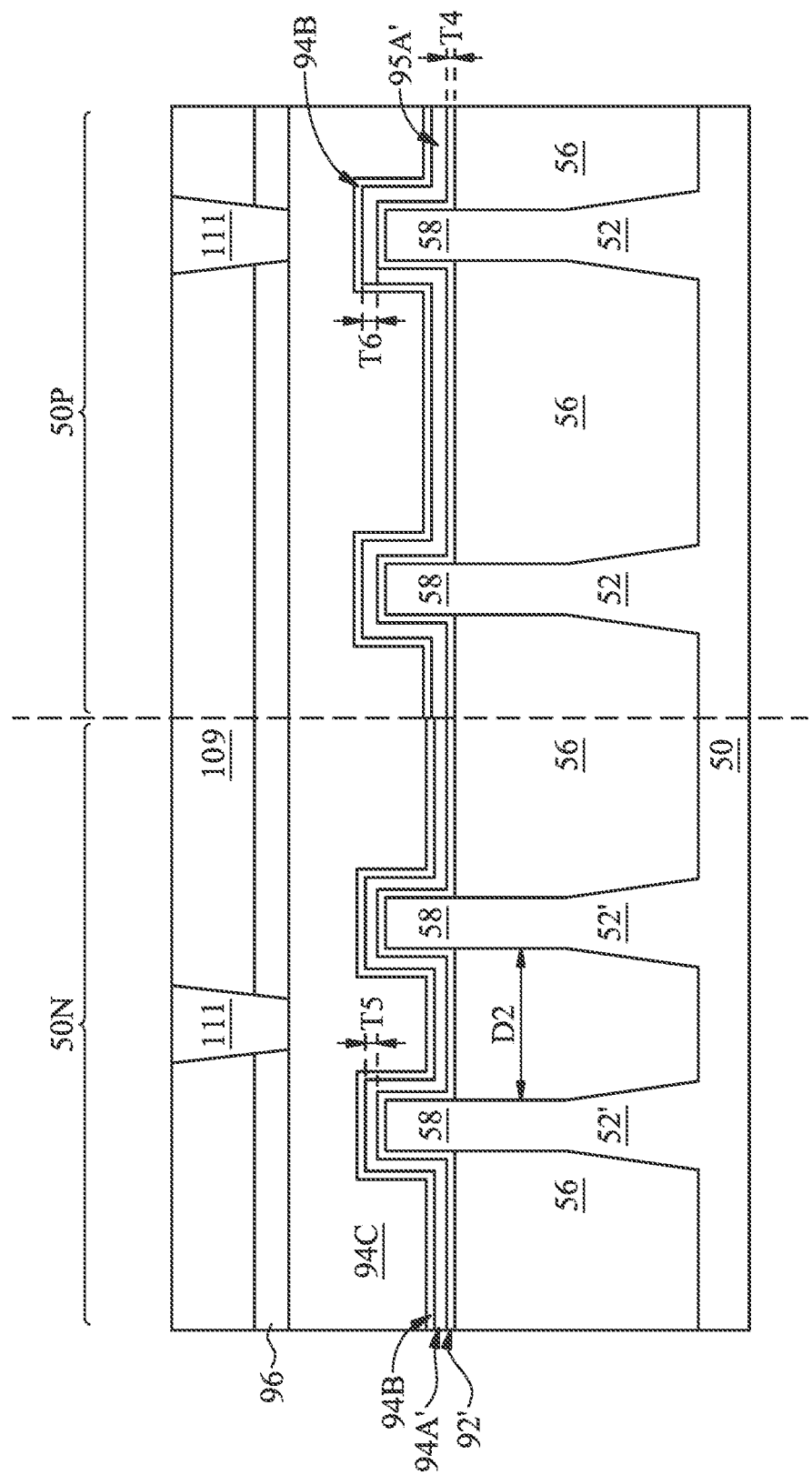

In FIGS. 27A and 27B, gate contacts in and source/drain contacts 113 are formed through the second ILD 109 and the first ILD 88 in accordance with some embodiments. Openings for the source/drain contacts 113 are formed through the first and second ILDs 88 and 109, and openings for the gate contact in are formed through the second ILD 109 and the gate mask 96. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 109. The remaining liner and conductive material form the source/drain contacts 113 and gate contacts w in the openings. An anneal process may be performed to form a silicide at the interface between the epitaxial source/drain regions 82 and the source/drain contacts 113. The source/drain contacts 113 are physically and electrically coupled to the epitaxial source/drain regions 82, and the gate contacts in are physically and electrically coupled to the gate electrodes 94. The source/drain contacts 113 and gate contacts in may be formed in different processes, or may be formed in the same process. Although shown as being formed in the same cross-sections, it should be appreciated that each of the source/drain contacts 113 and gate contacts in may be formed in different cross-sections, which may avoid shorting of the contacts.

FIG. 28 illustrates an intermediate stage of production of a FinFET device in high current (HC) SRAM area 1020. Fins 52' in region 50N are separated by a distance D2 in a range of about 10 nm to about 30 nm. In some embodiments, two fins 52' may be present, as illustrated in FIG. 28. In other embodiments, three or more fins 52' may be present. One or more gate dielectric layers 92' are over channel regions 58 of the fins 52 and the fins 52' in accordance with some embodiments. Formation of the gate dielectric layers 92' are described above in reference to FIG. 20A. A second work function metal (WFM) layer 94A' is over the fins 52' in the region 50N and a fourth WFM layer 95A' is over the fins 52 in the region 50P. The formation of the second WFM layer 94A' is described above in reference to FIG. 21A, and the formation of the fourth WFM layer 95A' is described above in reference to FIG. 23A.

In some embodiments, a semiconductor chip comprises a first SRAM array and a second SRAM array. The first SRAM array comprises a plurality of HD SRAM cells, such as SRAM cells 10, arranged with pluralities of columns and rows. The PG/PD devices of the HD cells are formed with single fin N-type FinFETs. The PU devices of the HD cell are formed with a single fin P-type FinFET. Each N-type FinFET comprises a first gate electrode covering a first gate dielectric with a thickness T1 and a fin type channel region. The first gate electrodes of the single fin N-type FinFETs have a first work function metal (WFM). The HD cells have a first X-pitch (word-line direction) X1 and a first Y-pitch (bit-line direction) Y1.

The second SRAM array includes a plurality of HC SRAM cells, such as SRAM cells 20, arranged in pluralities of columns and rows. The PG/PD devices of the HC cells are N-type FinFETs formed with multiple fins, such as e.g. 2 fins. The PU devices of the HC cells are formed with single fin P-type FinFETs. Each N-type FinFET transistor comprises a second gate electrode covering a second gate dielectric with a thickness T2 and a fin type channel region. The second gate electrodes of the multiple fin N-type FinFETs have a second work function metal (WFM). The HC cell has a second X-pitch (word-line direction) X2 and a second Y-pitch (bit-line direction) Y2. The thickness T1 is greater than the thickness T2, and the cell pitch ratio of X2/X1 is within a range of 1.1 to 1.5. The PD devices of the HD SRAM cells of the first SRAM array may have higher $V_t$ that the PD devices of the HC SRAM cells of the second SRAM array. The first WFM of the HD SRAM cells of the first SRAM array may have a thicker TiN layer and/or a thicker tungsten-nitride-carbon (WNC) layer than the second WFM of the HC SRAM cells of the second SRAM array.

Figure 29:
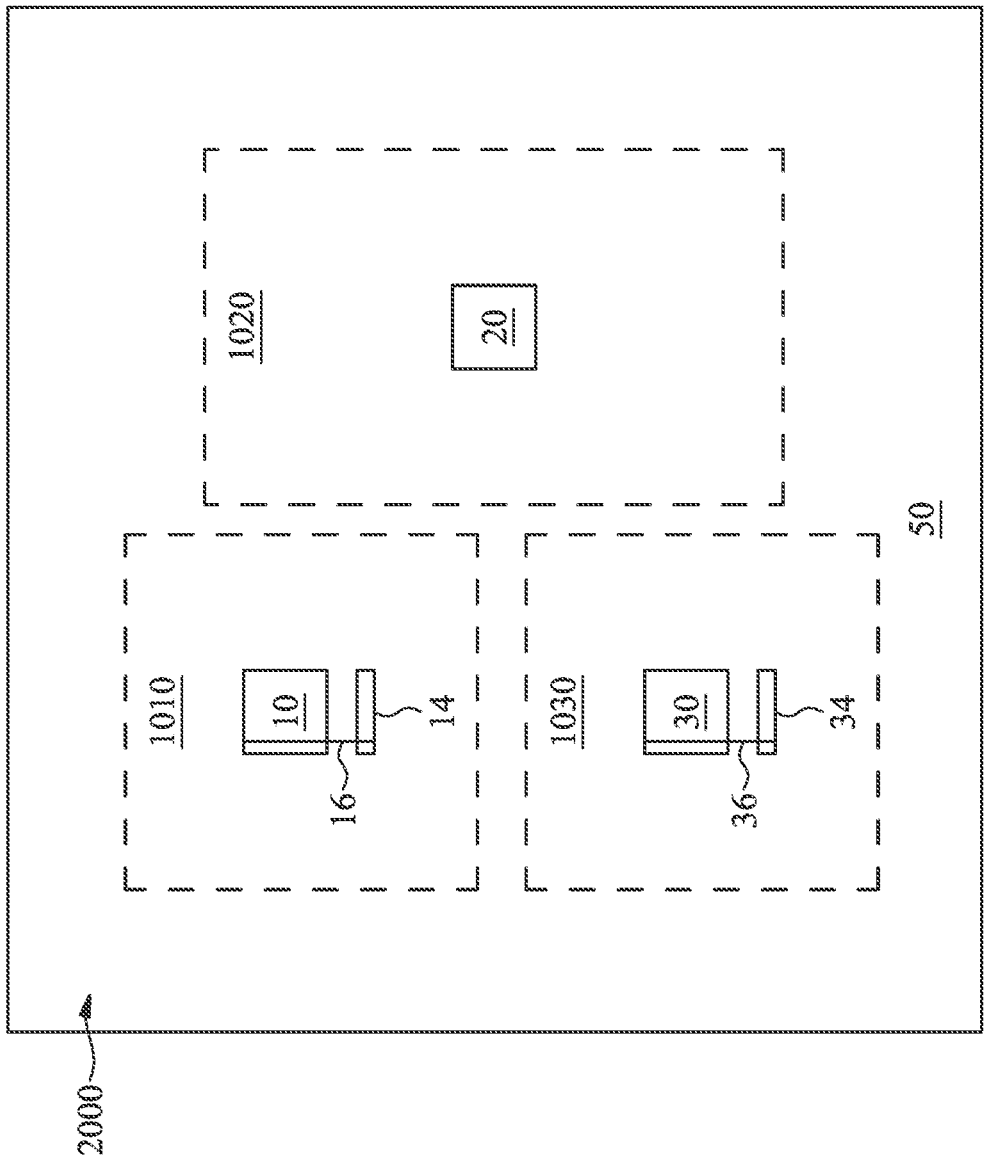
FIG. 29 illustrates a semiconductor wafer comprising a plurality of SRAM cell arrays in accordance with some embodiments.
Figure 30:
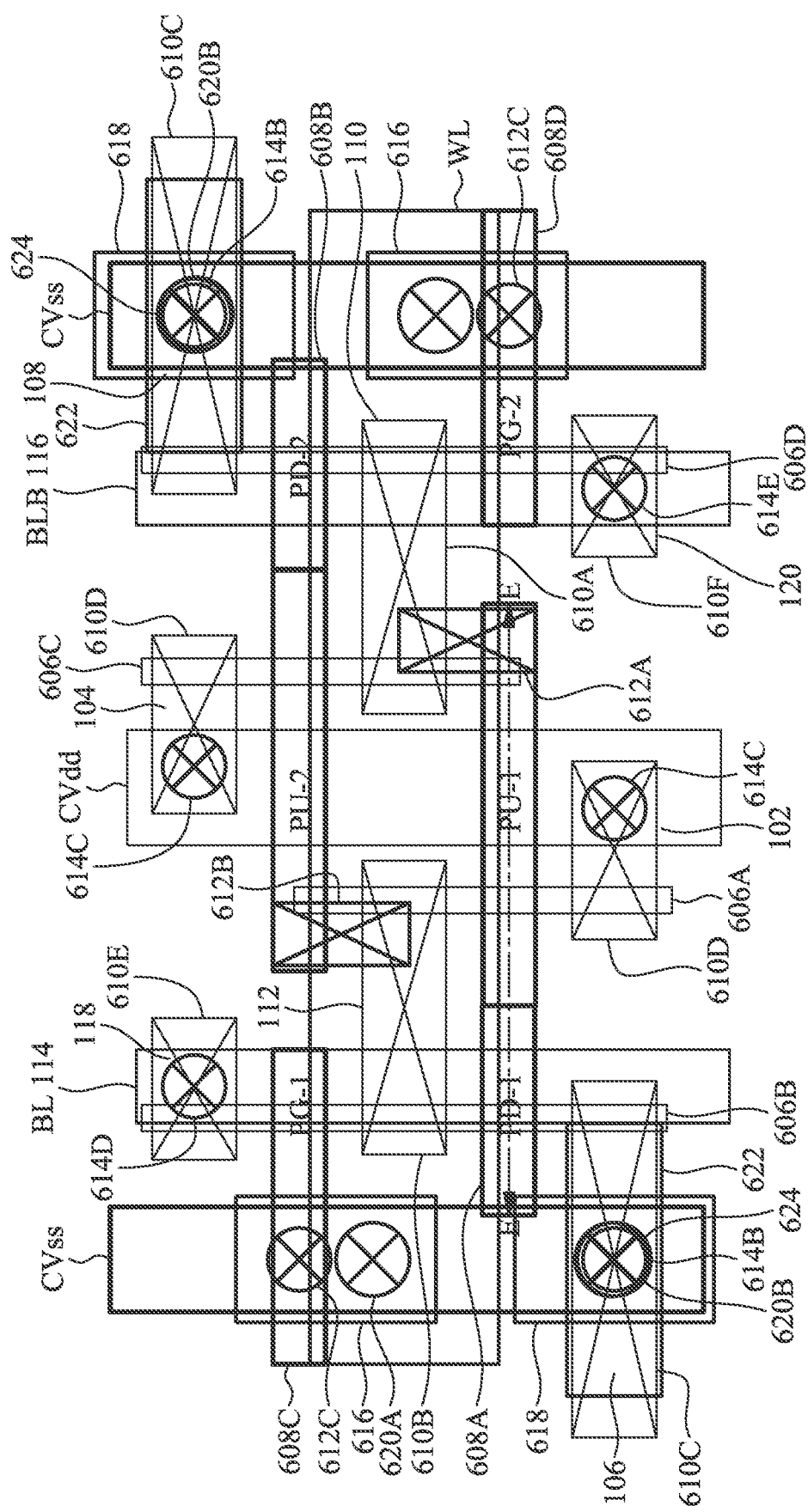
FIG. 30 illustrates a block diagram of a SRAM cell layout in accordance with some embodiments.
Figure 31:
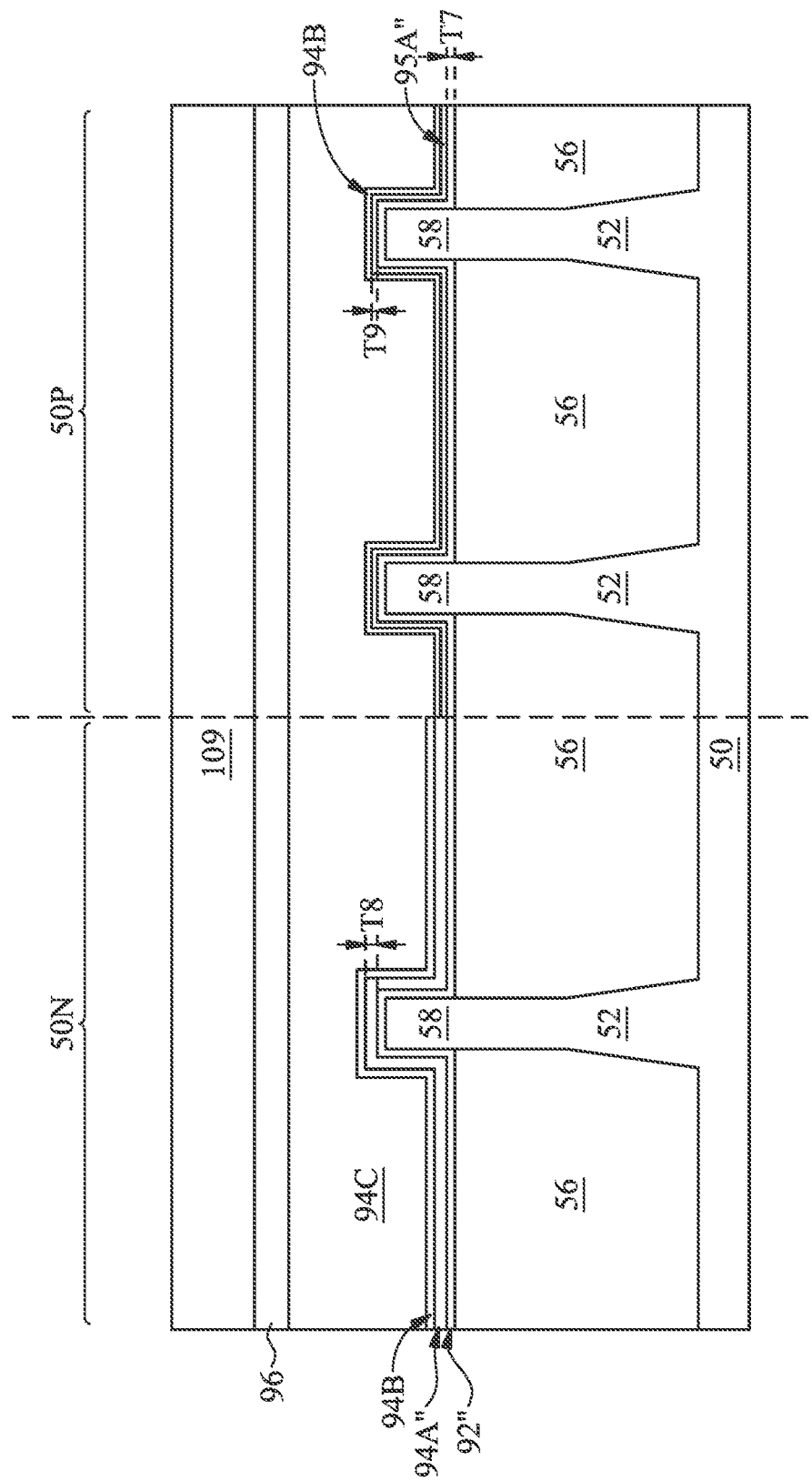
FIG. 31 illustrates a cross-sectional view of an intermediate stage in the manufacturing of FinFETs, in accordance with some embodiments.

FIGS. 29, 30, and 31 illustrate an embodiment with HD SRAM cells 30 substantially similar to the HD SRAM cells 10 of the first SRAM array but with a thickness T7 of a third gate dielectric 92" being thicker than the thickness T1 of the first gate dielectric 92 of the HD SRAM cells 10.

FIG. 29 illustrates a semiconductor chip 2000 comprising a substrate 50, a high density (HD) SRAM area 1010, a high current (HC) SRAM area 1020, and a second HD SRAM area 1030. The HD SRAM area 1010 comprises an array of HD SRAM cells 10, the HC SRAM area 1020 comprises an array of HC SRAM cells 20, and the second HD SRAM area 1030 comprises an array of HD SRAM cells 30. In some embodiments, the HD SRAM area 1010 comprises multiple arrays comprising multiple HD SRAM cells 10, the HC SRAM area 1020 comprises multiple arrays comprising multiple HC SRAM cells 20, and the second HD SRAM area 1030 comprises multiple arrays comprising multiple HD SRAM cells 30. The sizes and positions of HD SRAM area 1010, HC SRAM area 1020, second HD SRAM area 1030, HD SRAM cell 10, HC SRAM cell 20, and HD SRAM cell 30 are not necessarily to scale and are intended to show the presence of HD SRAM area 1010, HC SRAM area 1020, and second HD SRAM area 1030 on the semiconductor chip 2000.

In some embodiments, the HD SRAM cells 10 and 30 are coupled by conductive lines 16 and 36 to write-assist circuits 14 and 34, respectively, to enhance cell write cycle capability. In some embodiments, HD SRAM arrays of HD SRAM cells 10 and 30 are coupled by conductive lines 16 and 36, respectively, to write-assist circuits 14 and 34, respectively, to enhance cell write cycle capability. Each write-assist circuit 14 and 34 may be configured to set a voltage level of the corresponding bit line of the HD SRAM array to be less than a ground reference level. In some embodiments, the conductive lines 16 and 36 are bit lines of the respective HD SRAM arrays, each write-assist circuit 14 and 34 is a supply voltage line of each respective HD SRAM array, and each write assist circuit 14 and 34 is configured to set a voltage level of the corresponding supply voltage line of the respective HD SRAM array to be less than a supply voltage level. The HC SRAM cells 20 are not coupled to write-assist circuits, which are not present in the HC SRAM area 1020.

FIG. 30 illustrates a block diagram of a layout of features of a HD memory cell (e.g., SRAM cell 30) comprising single fin FinFETs according to some embodiments. FIG. 31 shows a cross-sectional view of an intermediate stage in the manufacturing of FinFETs, illustrated along reference cross-section E-E illustrated in FIG. 30. In some embodiments, the semiconductor chip 1000 further comprises a third SRAM array, including a plurality of HD SRAM cells 30 arranged in pluralities of columns and rows. The HD SRAM cells 30 may be formed by substantially similar processes as used to form the HD SRAM cells 10, differing in gate dielectric thickness and work function metal (WFM) thickness and composition. The HD SRAM cells 30 may have X-pitches and Y-pitches substantially the same as the HD SRAM cells 10 of the first SRAM array. The HD SRAM cells 30 may have substantially the same cell layouts as the HD SRAM cells 10. The gate electrodes 94' of the single fin N-type FinFETs of the HD SRAM cells 30 have a fifth work function metal (WFM) 94A" and a sixth WFM95A". The fifth WFM94A" may have a thickness T8 and the sixth WFM95A" may have a thickness T9. In some embodiments, the first WFM94A of the HD SRAM cells 10 of the first SRAM array have a thicker TiN layer and/or a thicker tungsten-nitride-carbon (WNC) layer than the third WFM 94A" of the HD SRAM cells 30 of the third SRAM array. In some embodiments, the semiconductor chip further comprises I/O devices formed from FinFETs with third gate dielectrics 92" having thickness T7. In some embodiments, the thickness T7 of the third gate dielectrics 92" is smaller than the thickness T1 of the first gate dielectrics 92 by at least 1 Å. In some embodiments, the third gate dielectric 92" may be formed by not removing the dummy gate dielectric 60 during the etching step described above in reference to FIGS. 18A and 18B.

Embodiments of the SRAM cells disclosed above may achieve advantages. Lower speed critical circuits may be embedded with HD cells for both power (both active and standby) and area (cell size) reduction. High speed circuits may be embedded with HC cells to achieve good performance in speed. High density/low power (HD cell with thicker gate dielectric) and high speed (high-speed cell (HC) with thinner gate dielectric) applications may be met with the new transistor structures described above. To achieve minimal cell standby leakage current (Isoff), the single fin SRAM cell may have higher $V_t$ (for Isoff reduction) as well as thicker gate dielectric (for lower gate leakage). To achieve maximal speed, the high speed cell may have lower $V_t$ (for $I_{on}$) as well as thinner gate dielectric (for $I_{on}$).

In accordance with an embodiment, a semiconductor device includes a first Static Random Access Memory (SRAM) array including a first SRAM cell and a second SRAM array including a second SRAM cell. The first SRAM cell includes a first pull-down (PD) device including a single fin N-type FinFET, the single fin N-type FinFET including a first gate dielectric, such that the first gate dielectric has a first thickness, and a first pull-up (PU) device including a first single fin P-type FinFET. The second SRAM cell includes a second PD device including a multiple fin N-type FinFET, the multiple fin N-type FinFET including a second gate dielectric, such that the second gate dielectric has a second thickness, and such that the first thickness is greater than the second thickness, and a second PU device including a second single fin P-type FinFET. In an embodiment, the first SRAM cell has a first X-pitch in an X direction, such that the second SRAM cell has a second X-pitch in the X direction, and such that the ratio of the second X-pitch to the first X-pitch is in a range of 1.1 to 1.5. In an embodiment, the first SRAM cell has a first Y-pitch in a Y direction, such that the second SRAM cell has a second Y-pitch in the Y direction, and such that the first Y-pitch is equal to the second Y-pitch. In an embodiment, the difference between the first thickness and the second thickness is in a range of 1 Å to 6 Å. In an embodiment, the first PD device has a first work function metal (WFM) layer, such that the second PD has a second WFM layer, and such that the first WFM layer is thicker than the second WFM layer. In an embodiment, the first WFM layer has a thicker layer of TiN or a thicker layer of tungsten-nitride-carbon (WN—C) than the second WFM layer. In an embodiment, the first PD device has a first threshold voltage ($V_t$), the second PD device has a second $V_t$, and the first $V_t$ is higher than the second $V_t$.

In accordance with another embodiment, a semiconductor device includes a first high density (HD) Static Random Access Memory (SRAM) array including a first HD SRAM cell and a high current (HC) SRAM array including a HC SRAM cell. The first HD SRAM cell includes a first pull-down (PD) device including a first single fin N-type FinFET, the first single fin N-type FinFET including a first work function metal (WFM) layer, and a first pull-up (PU) device including a first single fin P-type FinFET. The first WFM layer has a first thickness. The HC SRAM cell includes a second PD device including a multiple fin N-type FinFET, wherein the multiple fin N-type FinFET includes a second work function metal (WFM) layer, and wherein the first thickness is greater than the second thickness, and a second PU device including a second single fin P-type FinFET. The second WFM layer has a second thickness. In an embodiment, the first PU device has a third WFM layer, the second PU device has a fourth WFM layer, and the third WFM layer is thinner than the fourth WFM layer. In an embodiment, the first single fin N-type FinFET includes a first gate dielectric, such that the first gate dielectric has a first thickness, and the multiple fin N-type FinFET includes a second gate dielectric, such that the second gate dielectric has a second thickness, such that the first thickness is greater than the second thickness. In an embodiment, the semiconductor device further includes a second HD SRAM array including a second HD SRAM cell, such that the second HD SRAM cell includes: a third pull-down (PD) device including a second single fin N-type FinFET, the second single fin N-type FinFET including a third gate dielectric, such that the third gate dielectric has a third thickness. In an embodiment, the third thickness is the same as the second thickness. In an embodiment, the third thickness is thinner than the first thickness by at least 1 Å. In an embodiment, the second HD SRAM cell has the same cell pitches as the first HD SRAM cell. In an embodiment, the second HD SRAM cell has the same cell layout as the first HD SRAM cell.

In accordance with yet another embodiment, a method of forming Static Random Access Memory (SRAM) arrays includes: patterning a first fin, a second fin, and a third fin extending from a substrate; depositing a first gate dielectric to a first thickness over the first fin; depositing a second gate dielectric to a second thickness over the second fin and the third fin, the second thickness being less than the first thickness; forming a first pull-down (PD) device from the first fin, the first PD device is in a first SRAM array, and the first PD device is a single fin finFET; forming a second PD device from the second fin and the third fin, the second PD device is in a second SRAM array different from the first SRAM array; forming a first plurality of conductive lines and vias over the first PD device; and forming a second plurality of conductive lines and vias over the second PD device. In an embodiment, forming the first PD device includes forming a first work function metal (WFM) layer over the first fin, forming the second PD device includes forming a second WFM layer over the second fin and the third fin, and the first WFM layer is thicker than the second WFM layer. In an embodiment, the first WFM layer includes a layer of TiAl disposed on a layer of TiN or tungsten-nitride-carbon (WN—C). In an embodiment, the second WFM layer includes a layer of TiAl disposed on a layer of TiN or tungsten-nitride-carbon (WN—C). In an embodiment, the first SRAM array is a high density SRAM array, and the second SRAM array is a high current SRAM array.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
a first Static Random Access Memory (SRAM) array comprising a first SRAM cell, wherein the first SRAM cell comprises:
a first pull-down (PD) device comprising a single fin N-type FinFET, the single fin N-type FinFET comprising a first gate dielectric and a first work function metal (WFM) layer, wherein the first gate dielectric has a first thickness, wherein the first WFM layer comprises a first TiN layer on the first gate dielectric and a first TiAl layer on the first TiN layer; and
a first pull-up (PU) device comprising a first single fin P-type FinFET; and
a second SRAM array comprising a second SRAM cell, wherein the second SRAM cell comprises:
a second PD device comprising a multiple fin N-type FinFET, the multiple fin N-type FinFET comprising a second gate dielectric and a second WFM layer, wherein the second gate dielectric has a second thickness, wherein the first thickness is greater than the second thickness, wherein the second WFM layer comprises a second TiN layer on the second gate dielectric and a second TiAl layer on the second TiN layer, the second TiN layer being thicker than the first TiN layer; and
a second PU device comprising a second single fin P-type FinFET.

2. The device of claim 1, wherein the first SRAM cell has a first X-pitch in an X direction, wherein the second SRAM cell has a second X-pitch in the X direction, and wherein the ratio of the second X-pitch to the first X-pitch is in a range of 1.1 to 1.5.

3. The device of claim 1, wherein the first SRAM cell has a first Y-pitch in a Y direction, wherein the second SRAM cell has a second Y-pitch in the Y direction, and wherein the first Y-pitch is equal to the second Y-pitch.

4. The device of claim 1, wherein the difference between the first thickness and the second thickness is in a range of 1 Å to 6 Å.

5. The device of claim 1, wherein the first PD device has a first threshold voltage ($V_t$), wherein the second PD device has a second $V_t$, and wherein the first $V_t$ is higher than the second $V_t$.

6. A semiconductor device comprising:
a first high density (HD) Static Random Access Memory (SRAM) array comprising a first HD SRAM cell, wherein the first HD SRAM cell comprises:
a first pull-down (PD) device comprising a first single fin N-type FinFET, the first single fin N-type FinFET comprising a first work function metal (WFM) layer and a first gate dielectric, wherein the first WFM layer has a first thickness, and wherein the first gate dielectric has a second thickness; and
a first pull-up (PU) device comprising a first single fin P-type FinFET; and
a high current (HC) SRAM array comprising a HC SRAM cell, wherein the HC SRAM cell comprises:
a second PD device comprising a multiple fin N-type FinFET, wherein the multiple fin N-type FinFET comprises a second work function metal (WFM) layer and a second gate dielectric, the second WFM layer being a single layer of TiAl, wherein the second WFM layer has a third thickness, wherein the second gate dielectric has a fourth thickness, wherein the first thickness is greater than the c,ccond third thickness, and wherein the second thickness is greater than the fourth thickness; and
a second PU device comprising a second single fin P-type FinFET.

7. The device of claim 6, wherein the first PU device has a third WFM layer, wherein the second PU device has a fourth WFM layer, and wherein the third WFM layer is thinner than the fourth WFM layer.

8. The device of claim 6, further comprising a second HD SRAM array comprising a second HD SRAM cell, wherein the second HD SRAM cell comprises:
   a third pull-down (PD) device comprising a second single fin N-type FinFET, the second single fin N-type FinFET comprising a third gate dielectric, wherein the third gate dielectric has a fifth thickness.

9. The device of claim 8, wherein the fifth thickness is the same as the fourth thickness.

10. The device of claim 8, wherein the fifth thickness is thinner than the second thickness by at least 1 Å.

11. The device of claim 8, wherein the second HD SRAM cell has the same cell pitches as the first HD SRAM cell.

12. The device of claim 8, wherein the second HD SRAM cell has the same cell layout as the first HD SRAM cell.

13. A semiconductor device comprising:
   a first Static Random Access Memory (SRAM) array comprising a first SRAM cell, wherein the first SRAM cell comprises:
      a first pull-down (PD) device comprising a first single fin FinFET, the single fin FinFET comprising a first gate dielectric and a first work function metal (WFM) layer, the first gate dielectric having a first thickness, the first WFM layer comprising a first tungsten-nitride-carbon (WN-C) layer on the first gate dielectric and a first TiAl layer on the first WN-C layer; and
      a first pull-up (PU) device comprising a second single fin FinFET; and
   a second SRAM array comprising a second SRAM cell, wherein the second SRAM cell comprises:
      a second PD device comprising a multiple fin FinFET, the multiple fin FinFET comprising a second gate dielectric and a second WFM layer, the second gate dielectric having a second thickness, the second WFM layer comprising a second WN-C layer on the second gate dielectric and a second TiAl layer on the second WN-C layer, the second WN-C layer being thinner than the first WN-C layer, the first thickness being greater than the second thickness; and
      a second PU device comprising a third single fin FinFET.

14. The semiconductor device of claim 13, wherein the first PU device comprises a third WFM layer, the third WFM layer having a fifth thickness, wherein the second PU device comprises a fourth WFM layer, the fourth WFM layer having a sixth thickness, and wherein the fifth thickness is less than the sixth thickness.

15. The semiconductor device of claim 13, wherein the first gate dielectric has a thickness in a range of 0.6 nm to 3 nm.

16. The semiconductor device of claim 13, wherein the second gate dielectric has a thickness in a range of 0.5 nm to 2.6 nm.

17. The device of claim 1, wherein a ratio of a thickness of the first WFM layer to a thickness of the second WFM layer is in a range of 1:1.1 to 1:4.

18. The device of claim 5, wherein the first SRAM cell and the second SRAM cell have the same number of transistors.

19. The device of claim 8, wherein the third PD device has a fifth WFM layer, the fifth WFM layer having a sixth thickness, the sixth thickness being greater than the first thickness.

20. The device of claim 13, wherein a ratio of a thickness of the first gate dielectric to a thickness of the second gate dielectric is in a range of 1.05:1 to 1.2:1.

\* \* \* \* \*

UNITED STATES PATENT AND TRADEMARK OFFICE
CERTIFICATE OF CORRECTION

PATENT NO. : 11,508,735 B2
APPLICATION NO. : 16/806102
DATED : November 22, 2022
INVENTOR(S) : Jhon Jhy Liaw It is certified that error appears in the above-identified patent and that said Letters Patent is hereby corrected as shown below:

In the Claims

Claim 6, Column 28, Line 61; delete "c,ccond".

Signed and Sealed this
Twenty-seventh Day of December, 2022

Katherine Kelly Vidal
*Director of the United States Patent and Trademark Office*